(12) United States Patent
Minamikawa

(10) Patent No.: US 8,969,842 B2
(45) Date of Patent: Mar. 3, 2015

(54) PHOTOINTERRUPTER, METHOD OF MANUFACTURING THE SAME, AND MOUNTING STRUCTURE OF THE SAME

(75) Inventor: Yoshinori Minamikawa, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 239 days.

(21) Appl. No.: 13/568,643

(22) Filed: Aug. 7, 2012

(65) Prior Publication Data
US 2013/0037702 A1 Feb. 14, 2013

(30) Foreign Application Priority Data

Aug. 8, 2011 (JP) ................................ 2011-172734
Feb. 28, 2012 (JP) ................................ 2012-41289
Jul. 17, 2012 (JP) ................................ 2012-158659

(51) Int. Cl.
*G02B 27/00* (2006.01)
*H01L 25/16* (2006.01)

(52) U.S. Cl.
CPC ..... *H01L 25/167* (2013.01); *H01L 2224/48091* (2013.01); *H01L 2224/48227* (2013.01); *H01L 2924/3025* (2013.01)
USPC ........................................ 250/551; 250/221

(58) Field of Classification Search
USPC ................................................ 250/221, 551
See application file for complete search history.

(56) References Cited

U.S. PATENT DOCUMENTS

| | | | | |
|---|---|---|---|---|
| 5,696,626 | A * | 12/1997 | Hosier et al. | 358/482 |
| 6,104,023 | A * | 8/2000 | Maeda | 250/231.13 |
| 6,399,943 | B1 * | 6/2002 | Sano | 250/239 |
| 7,375,346 | B2 * | 5/2008 | Shibata | 250/442.11 |
| 2007/0018123 | A1 * | 1/2007 | Sano | 250/551 |
| 2008/0142744 | A1 * | 6/2008 | Ishihara | 250/551 |
| 2011/0139966 | A1 * | 6/2011 | Kikuchi | 250/214.1 |

FOREIGN PATENT DOCUMENTS

JP 2006-303183 11/2006

* cited by examiner

*Primary Examiner* — Tony Ko
(74) *Attorney, Agent, or Firm* — Hamre, Schumann, Mueller & Larson, P.C.

(57) ABSTRACT

A photointerrupter includes a base, a light emitting element, a light receiving element, a light-transmissive detector resin member covering the light receiving element, a light-transmissive emitter resin member covering the light emitting element, and a light shield layer covering the detector resin member and the emitter resin member. The emitter resin member is spaced apart from the detector resin member with an intervening clearance between them. The detector resin member includes a light incidence surface exposed from the light shield layer, and the emitter resin member includes a light output surface exposed from the light shield layer. The light incidence surface and the light output surface are arranged to face the clearance between the two resin members.

47 Claims, 49 Drawing Sheets

FIG. 42
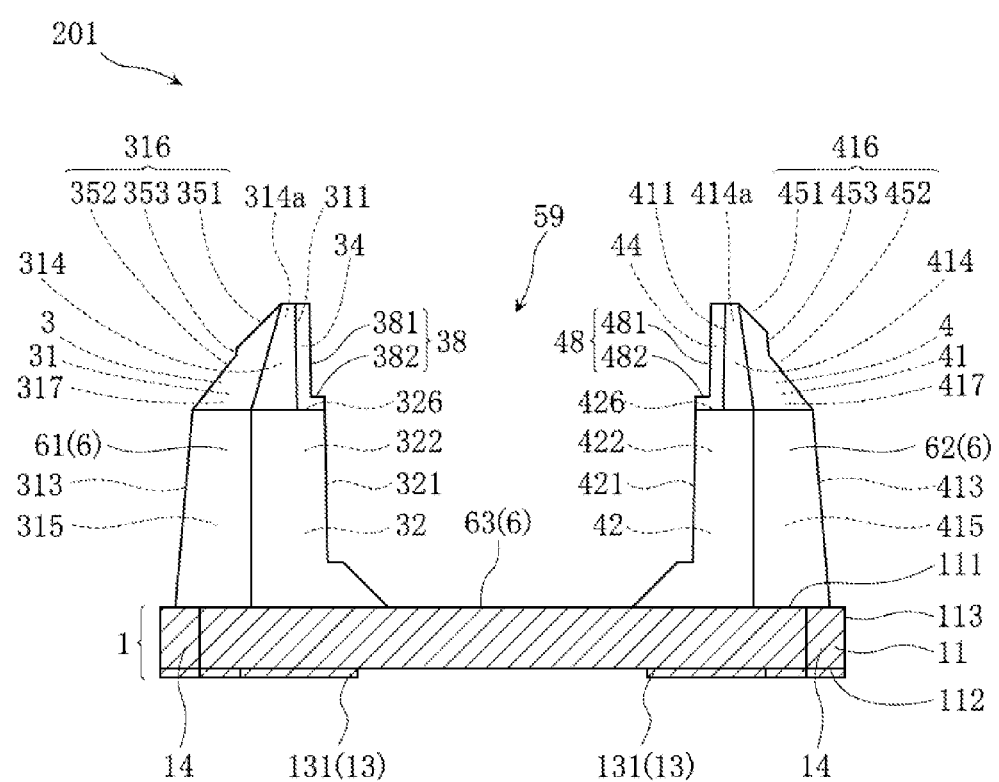
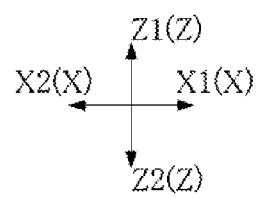

FIG. 44
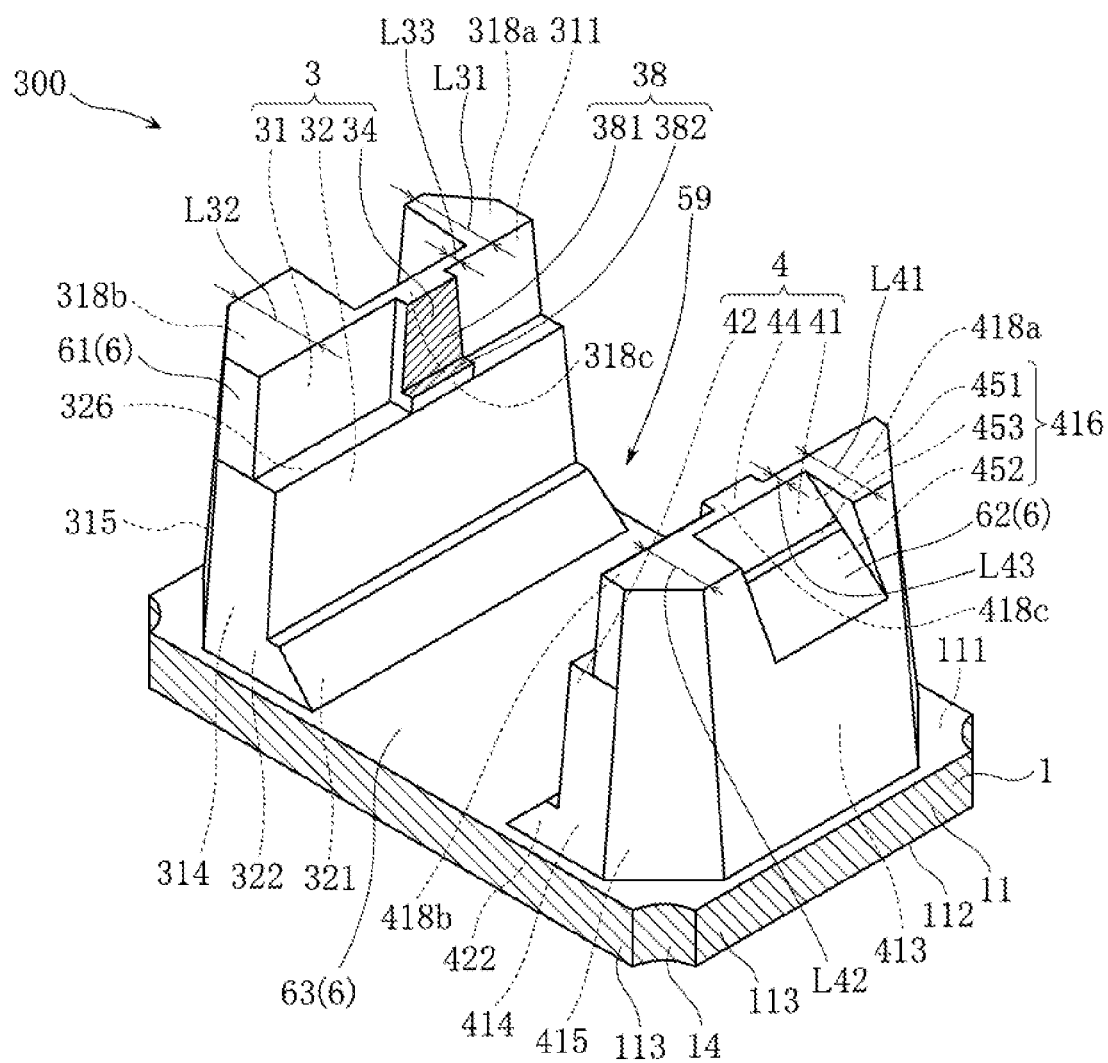
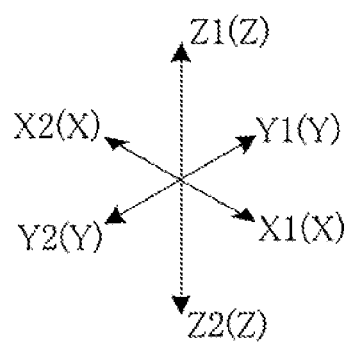

FIG. 45
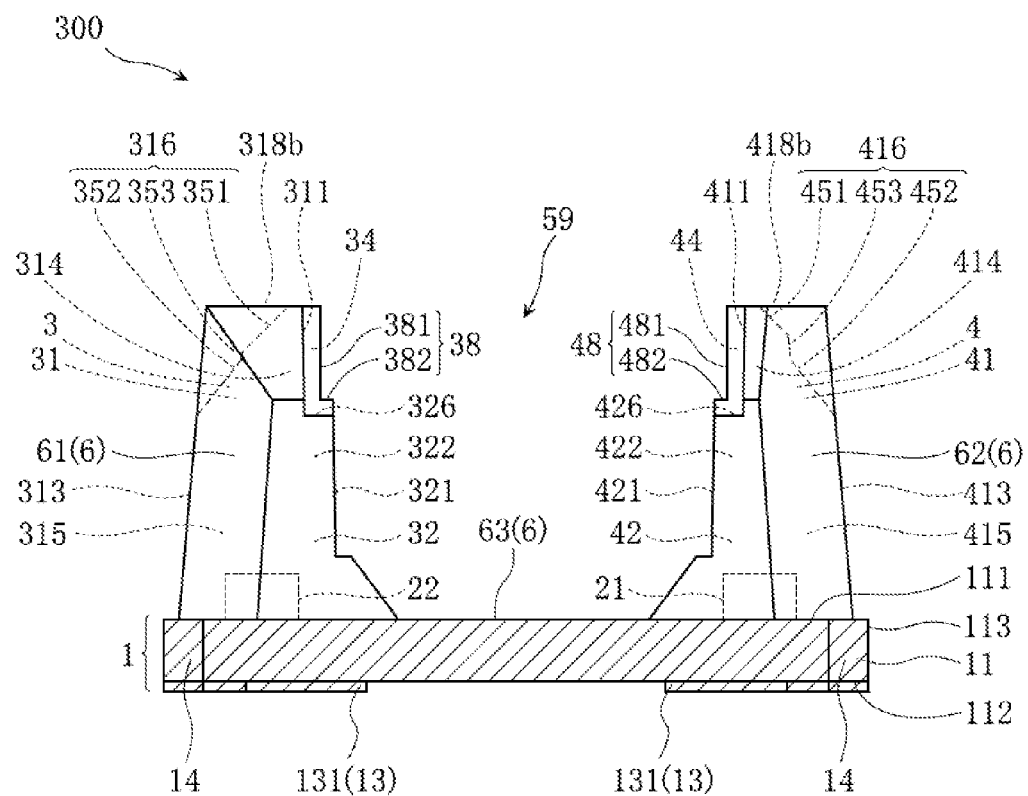
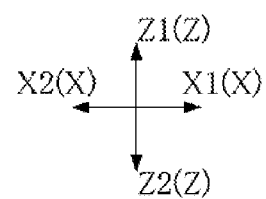

FIG. 48
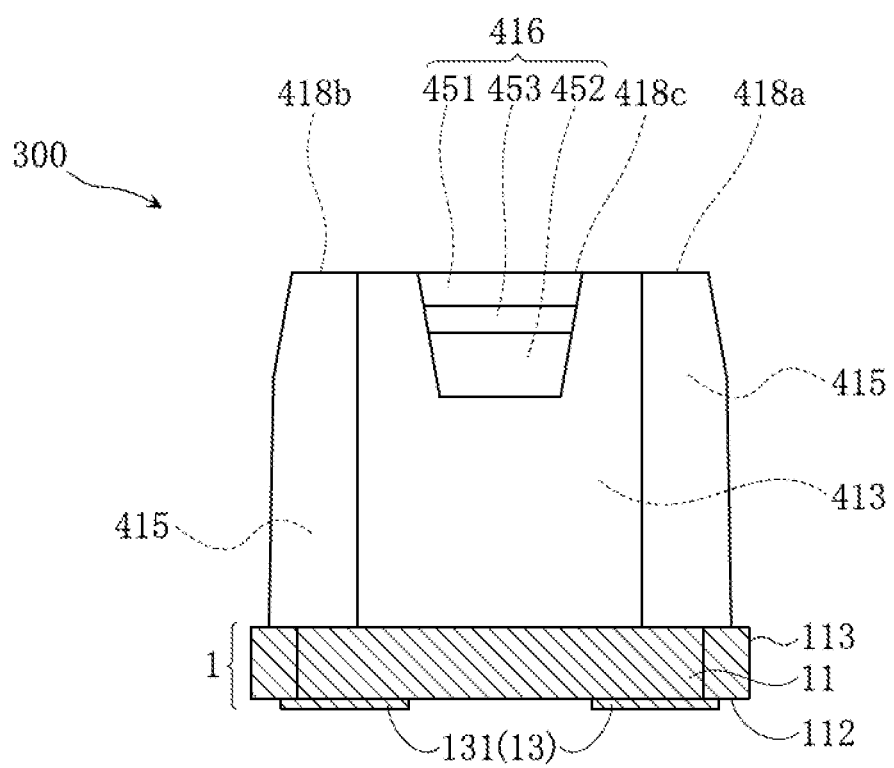
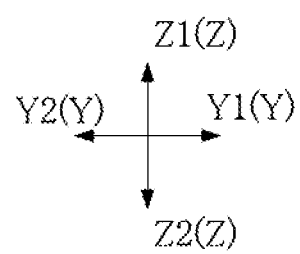

PHOTOINTERRUPTER, METHOD OF MANUFACTURING THE SAME, AND MOUNTING STRUCTURE OF THE SAME

BACKGROUND OF THE INVENTION

1. Field of the Invention

The present invention relates to a photointerrupter, a method of manufacturing a photointerrupter, and a mounting structure of a photointerrupter.

2. Description of the Related Art

There are various types of photointerrupters that are known. JP-A-2006-303183, for example, discloses a transmissive photointerrupter. This conventional photointerrupter includes an insulating substrate, a light emitting element, a light receiving element, two transparent encapsulation members, and a nontransparent cap. The light emitting element and the light receiving element are disposed on the insulating substrate. One of the transparent encapsulation members covers the light emitting element, and the other covers the light receiving element. The nontransparent cap covers the transparent encapsulation members.

In the above photointerrupter, the nontransparent cap is formed through a resin molding process. Unfavorably, the resin molding process renders the thickness of the cap rather large, which hinders the downsizing of the photointerrupter.

SUMMARY OF THE INVENTION

The present invention has been proposed under the foregoing situation. It is therefore an object of the present invention to provide a photointerrupter that can be reduced in size.

According to a first aspect of the present invention, there is provided a photointerrupter including: a base; a light emitting element provided on the base; a light receiving element provided on the base; a light-transmissive detector resin member covering the light receiving element; a light-transmissive emitter resin member covering the light emitting element; and a light shield layer covering the detector resin member and the emitter resin member. The emitter resin member is spaced apart from the detector resin member in a first direction with a clearance between the emitter resin member and the detector resin member. The detector resin member includes a light incidence surface exposed from the light shield layer, the emitter resin member includes a light output surface exposed from the light shield layer, and each of the light incidence surface and the light output surface faces the clearance.

Preferably, the light shield layer has a thickness of 0.01-100 μm.

Preferably, the light shield layer includes a base cover portion that covers the base and faces the clearance, and each of the light output surface and the light incidence surface is spaced apart from the base cover portion in a thickness direction of the base.

Preferably, the detector resin member includes a detector base body covering the light receiving element, and the detector base body is held in contact with the base.

Preferably, the detector resin member includes a detector bulging portion protruding from the detector base body toward the emitter resin member, and the detector bulging portion is held in contact with the base.

Preferably, the detector bulging portion is greater in size than the light receiving element in a second direction perpendicular to both the first direction and a thickness direction of the base.

Preferably, the detector bulging portion includes a detector bulging portion front face that faces the emitter resin member.

Preferably, the detector bulging portion front face is so inclined with respect to a thickness direction of the base as to become farther from the emitter resin member as proceeding away from the base.

Preferably, the detector resin member includes a detector protruding portion protruding from the detector base body toward the emitter resin member, the detector protruding portion provides the light incidence surface, the detector bulging portion includes a detector connecting face connected to both the detector bulging portion front face and the detector base body, and the detector protruding portion protrudes from the detector connecting face.

Preferably, the detector resin member includes a detector protruding portion protruding from the detector base body toward the emitter resin member, and the detector protruding portion provides the light incidence surface.

Preferably, the detector base body includes a detector base body front face that faces the emitter resin member, and at least a part of the detector base body front face is offset from the light incidence surface in a direction proceeding away from the base.

Preferably, the light incidence surface includes a first incident portion and a second incident portion, where the first incident portion faces the emitter resin member, the second incident portion is closer to the emitter resin member than the first incident portion is, and the first incident portion and the second incident portion are arranged to face in mutually different directions.

Preferably, the second incident portion faces in a direction proceeding from the base toward the detector resin member as viewed in a thickness direction of the base.

Preferably, the second incident portion is inclined with respect to a thickness direction of the base so as to become further away from the emitter resin member as proceeding way from the base.

Preferably, the emitter resin member includes an emitter base body covering the light emitting element, and the emitter base body is held in contact with the base.

Preferably, the emitter resin member includes an emitter bulging portion protruding from the emitter base body toward the detector resin member, and the emitter bulging portion is held in contact with the base.

Preferably, the emitter resin member includes an emitter protruding portion protruding from the emitter base body toward the detector resin member, and the emitter protruding portion provides the light output surface.

Preferably, the light output surface includes a first output portion and a second output portion, where the first output portion faces the emitter resin member, the second output portion is closer to the detector resin member than the first output portion is, and the first output portion and the second output portion are arranged to face in mutually different directions.

Preferably, the light shield layer is black or gray.

Preferably, the light shield layer includes a first layer and a second layer formed on the first layer, and the first layer is in contact with at least one of the detector resin member and the emitter resin member, where the first layer is made of a metal, and the second layer is made of an oxide of the same metal.

Preferably, the photointerrupter of the first aspect further includes a liqht-transmissive undercoat layer interposed between the light shield layer and at least one of the detector resin member and the emitter resin member.

Preferably, the emitter resin member includes an emitter base body held in contact with the base, and the emitter base body has a first emitter base body outer face.

Preferably, the light output surface is disposed between the first emitter base body outer face and the light incident surface, and the undercoat layer covers the first emitter base body outer face.

Preferably, the undercoat layer covers an entirety of the emitter resin member except for the light output surface and a region contacting the base.

Preferably, the first emitter base body outer face includes a first emitter sloped portion and a second emitter sloped portion each inclined with respect to a thickness direction of the base. The first emitter sloped portion is farther from the base than the second emitter sloped portion is, and in plan view of the base, the first emitter sloped portion is disposed between the second emitter sloped portion and the light output surface. The angle formed between the first emitter sloped portion and the thickness direction of the base is greater than the angle formed between the second emitter sloped portion and the thickness of the base.

Preferably, the first emitter base body outer face includes an emitter intermediate portion connected to the first emitter sloped portion and the second emitter sloped portion. The emitter intermediate portion is disposed between the first emitter sloped portion and the second emitter sloped portion. The angle formed between the emitter intermediate portion and the thickness direction of the base is smaller than the angle formed between the second emitter sloped portion and the thickness direction of the base.

Preferably, the emitter base body includes a second emitter base body outer face, the second emitter base body outer face is spaced away from the light emitting element in a second direction perpendicular to both the first direction and the thickness direction of the base, and the second emitter base body outer face is inclined with respect to the thickness direction of the base.

Preferably, the emitter base body includes a first emitter top face, a second emitter top face and an emitter intermediate face. Each of the first emitter top face and the second emitter top face is arranged to face away from the base. The emitter intermediate face connects the first emitter top face and the second emitter top face to each other. The first emitter top face and the second emitter top face are spaced apart from each other in a second direction perpendicular to both the first direction and the thickness direction of the base. The emitter intermediate face has a minimum size in the first direction that is smaller than each of a size of the first emitter top face in the first direction and a size of the second emitter top face in the first direction.

Preferably, the first emitter base body outer face is inclined with respect to the thickness direction of the base so as to become closer to the detector resin member as proceeding away from the base, and the first emitter base body outer face is disposed between the first emitter top face and the second emitter top face as viewed in the thickness direction of the base.

Preferably, the detector base body includes a first detector top face, a second detector top face and a detector intermediate face. Each of the first detector top face and the second detector top face is arranged to face away from the base. The detector intermediate face connects the first detector top face and the second detector top face to each other. The first detector top face and the second detector top face are spaced apart from each other in the second direction perpendicular to both the first direction and the thickness direction of the base. The detector intermediate face has a minimum size in the first direction that is smaller than each of a size of the first detector top face in the first direction and a size of the second detector top face in the first direction.

Preferably, the detector resin member includes a detector base body having a first detector base body outer face. The first detector base body outer face is inclined with respect to the thickness direction of the base so as to become closer to the emitter resin member as proceeding away from the base. The first detector base body outer face is disposed between the first detector top face and the second detector top face as viewed in the thickness direction of the base.

Preferably, the first detector top face, the second detector top face, the first emitter top face and the second emitter top face are contained in the same plane.

Preferably, the detector resin member includes a detector base body held in contact with the base, and the a detector base body includes a first detector base body outer face.

Preferably, the light incident surface is disposed between the first detector base body outer face and the light output surface, and the undercoat layer covers the first detector base body outer face.

Preferably, the undercoat layer covers an entirety of the detector resin member except for the light incident surface and a region contacting the base.

Preferably, the first detector base body outer face includes a first detector sloped portion and a second detector sloped portion each inclined with respect to the thickness direction of the base. The first detector sloped portion is farther from the base than the second detector sloped portion is, and in plan view of the base, the first detector sloped portion is disposed between the second detector sloped portion and the light incident surface. The angle formed between the first detector sloped portion and the thickness direction of the base is greater than the angle formed between the second detector sloped portion and the thickness of the base.

Preferably, the first detector base body outer face includes a detector intermediate portion connected to the first detector sloped portion and the second detector sloped portion. The detector intermediate portion is disposed between the first detector sloped portion and the second detector sloped portion. The angle formed between the detector intermediate portion and the thickness direction of the base is smaller than the angle formed between the second detector sloped portion and the thickness direction of the base.

Preferably, the detector base body includes a second detector base body outer face. The second detector base body outer face is spaced apart from the light receiving element in a second direction perpendicular both the first direction and the thickness direction of the base. The second detector base body outer face is inclined with respect to the thickness direction of the base.

Preferably, the base includes a substrate provided with a main surface and a back surface, a main surface electrode formed on the main surface, and a back surface electrode formed on the back surface.

Preferably, the main surface electrode includes a detector die pad on which the light receiving element is mounted, and the light incident surface is so located as to overlap the detector die pad as viewed in the thickness direction of the base.

Preferably, the base includes a connection electrode connected to the main surface electrode and the back surface electrode.

Preferably, the connection electrode extends through the substrate.

Preferably, the substrate has a rectangular shape with a corner, the substrate is formed with a corner groove at the corner, and the connection electrode is disposed in the corner groove.

According to a second aspect of the present invention, there is provided a photointerrupter mounting structure that includes: a photointerrupter according to the first aspect of the present invention; a mounting board; and a solder layer disposed between the mounting board and the photointerrupter.

According to a third aspect of the present invention, there is provided a method of manufacturing a photointerrupter. The method includes: arranging a light emitting element and a light receiving element on a base; forming a light-transmissive emitter resin member covering the light emitting element and a light-transmissive detector resin member covering the light receiving element, where the detector resin member is spaced apart from the emitter resin member by a clearance; and forming a light shield layer covering the emitter resin member and the detector resin member by surface processing. The emitter resin member is formed with a light output surface exposed from the light shield layer and facing the clearance, and the detector resin member is formed with a light incident surface exposed from the light shield layer and facing the clearance.

Preferably, the surface processing includes one of painting, printing, vapor deposition, ion plating, sputtering and plating.

Preferably, the light shield layer further covers a region of the base located between the emitter resin member and the detector resin member.

Preferably, the detector resin member includes a detector base body covering the light receiving element and a detector protruding portion protruding from the detector base body. The light incident surface is formed by removing both a part of the light shield layer covering the detector resin member and a part of the detector protruding portion.

Other features and advantages of the present invention will become more apparent from detailed description given below with reference to the accompanying drawings.

BRIEF DESCRIPTION OF THE DRAWINGS

FIG. 42 is a front view showing the photointerrupter according to the first variation of the second embodiment;

FIG. 44 is a perspective view showing a photointerrupter according to a third embodiment of the present invention;

FIG. 45 is a front view showing the photointerrupter according to the third embodiment;

FIG. 48 is a right side view of the photointerrupter shown in FIG. 45; and

DETAILED DESCRIPTION OF THE PREFERRED EMBODIMENTS

First Embodiment

Referring to FIGS. 1-25, a first embodiment of the present invention will be described below.

Figure 1:
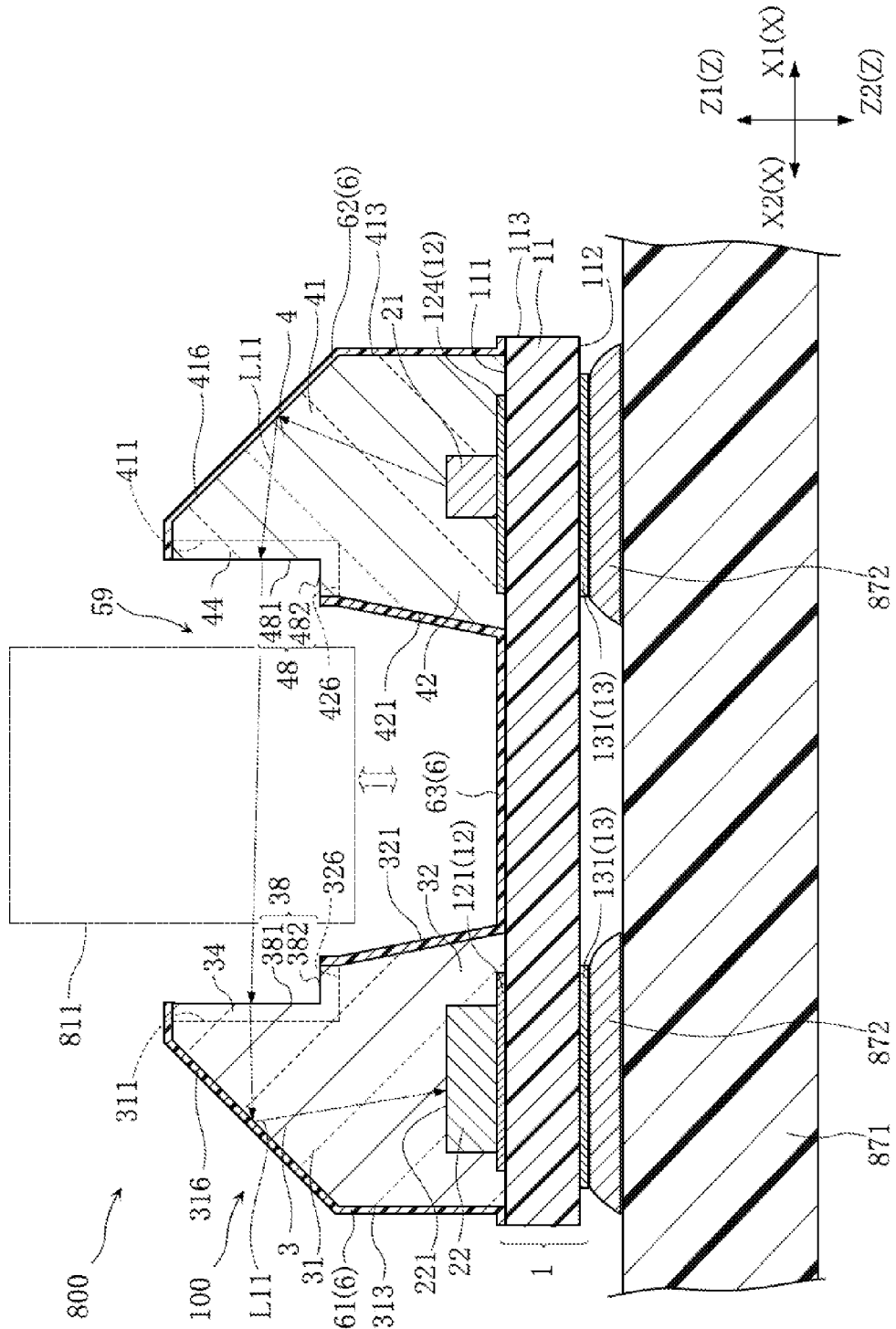
FIG. 1 is a sectional view showing a mounting structure of a photointerrupter according to a first embodiment of the present invention.

FIG. 1 is a sectional view showing a mounting structure of a photointerrupter according to the first embodiment.

The mounting structure 800 of the photointerrupter shown in FIG. 1 includes a photointerrupter 100, a mounting board 871, and a solder layer 872.

The mounting board 871 is, for example, a printed circuit board. The mounting board 871 may include an insulating substrate and a pattern electrode (not shown) formed on the insulating substrate. The photointerrupter 100 is supported on the mounting board 871. The solder layer 872 is interposed between the photointerrupter 100 and the mounting board 871. The photointerrupter 100 and the mounting board 871 are bonded to each other via the solder layer 872.

Figure 2:
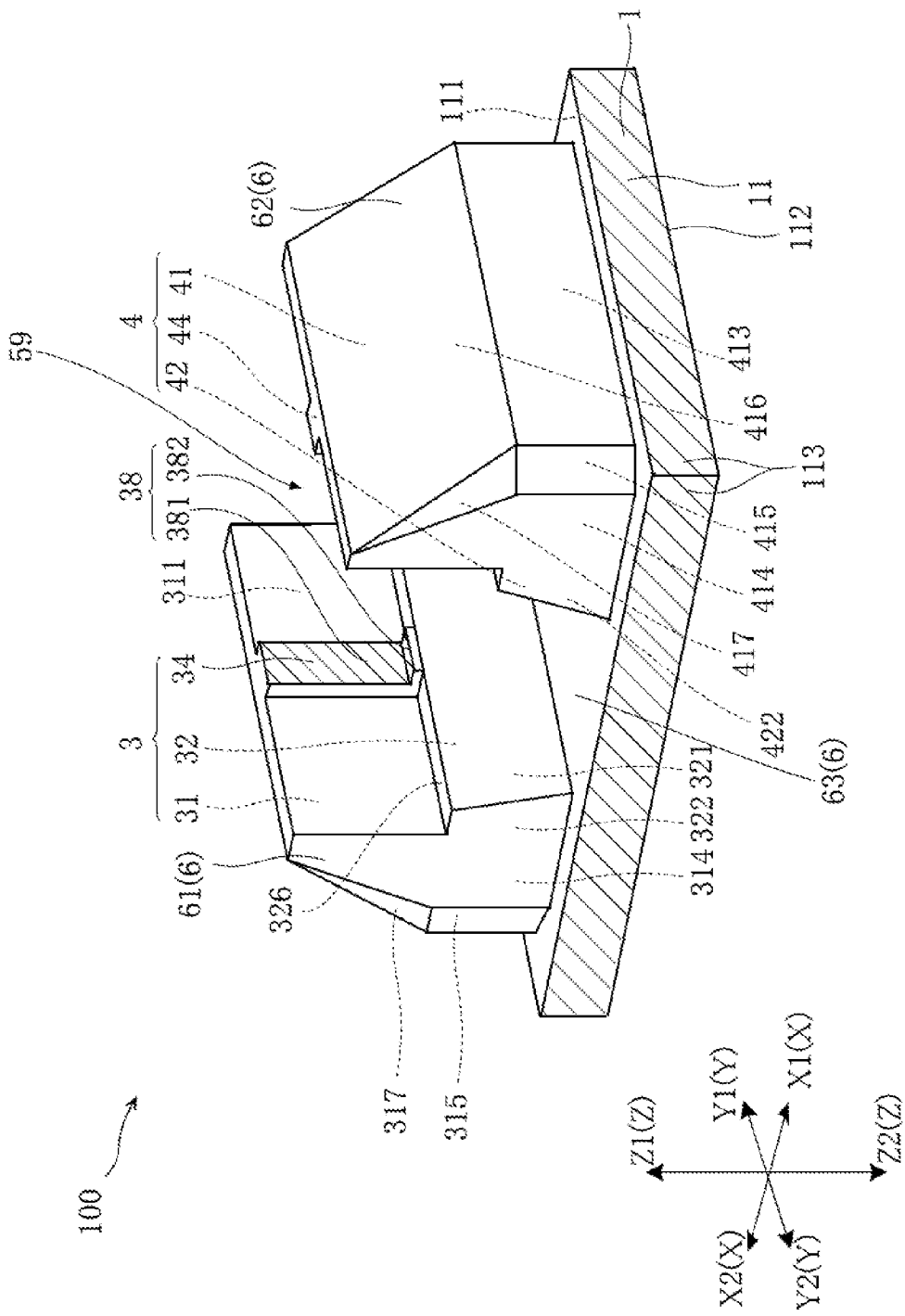
FIG. 2 is a perspective view showing the photointerrupter according to the first embodiment.
Figure 3:
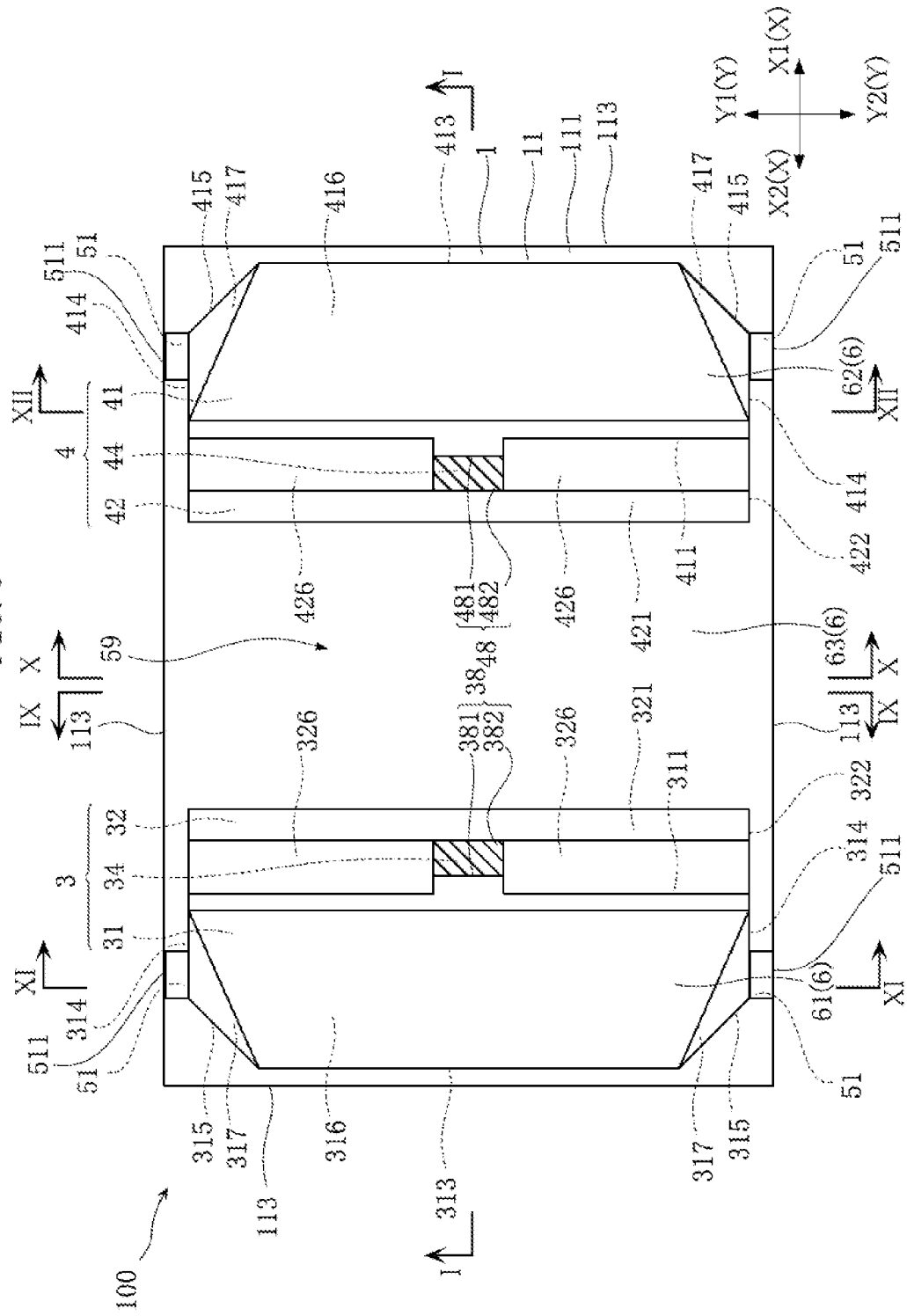
FIG. 3 is a plan view showing the photointerrupter according to the first embodiment.
Figure 4:
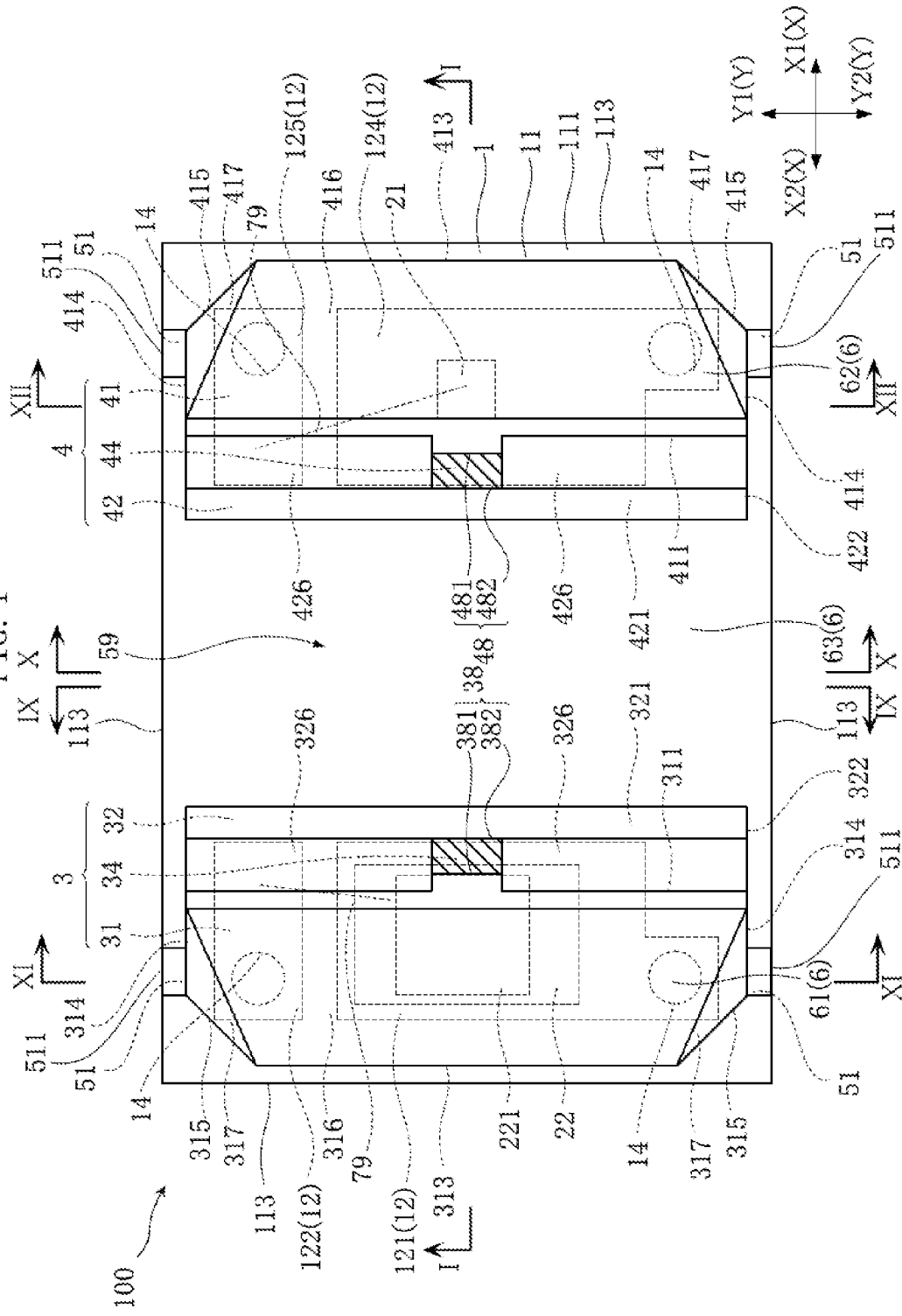
FIG. 4 is a plan view showing the photointerrupter of FIG. 3, with the interior partially visible.
Figure 5:
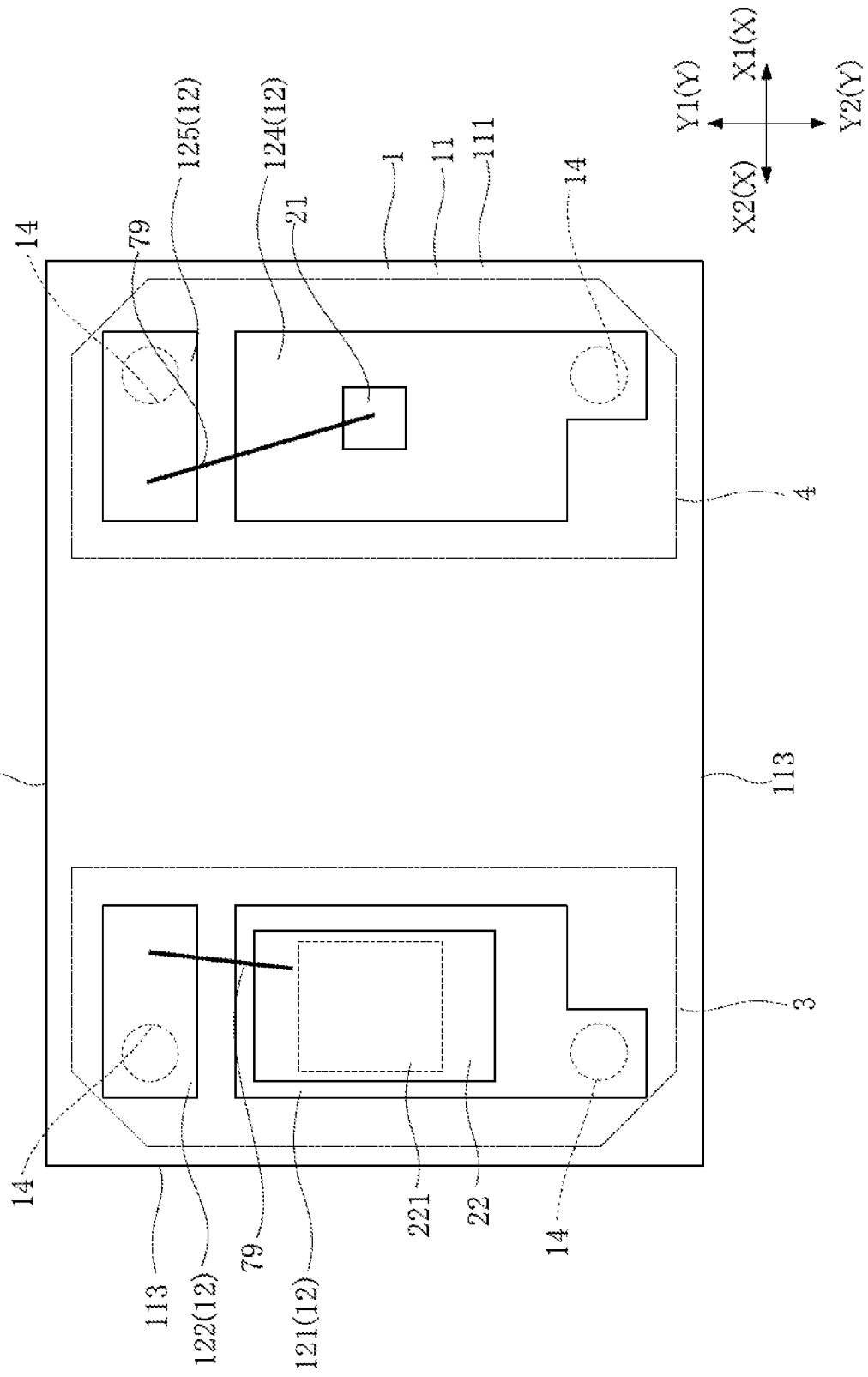
FIG. 5 is a simplified plan view of the photointerrupter shown in FIG. 4.
Figure 6:
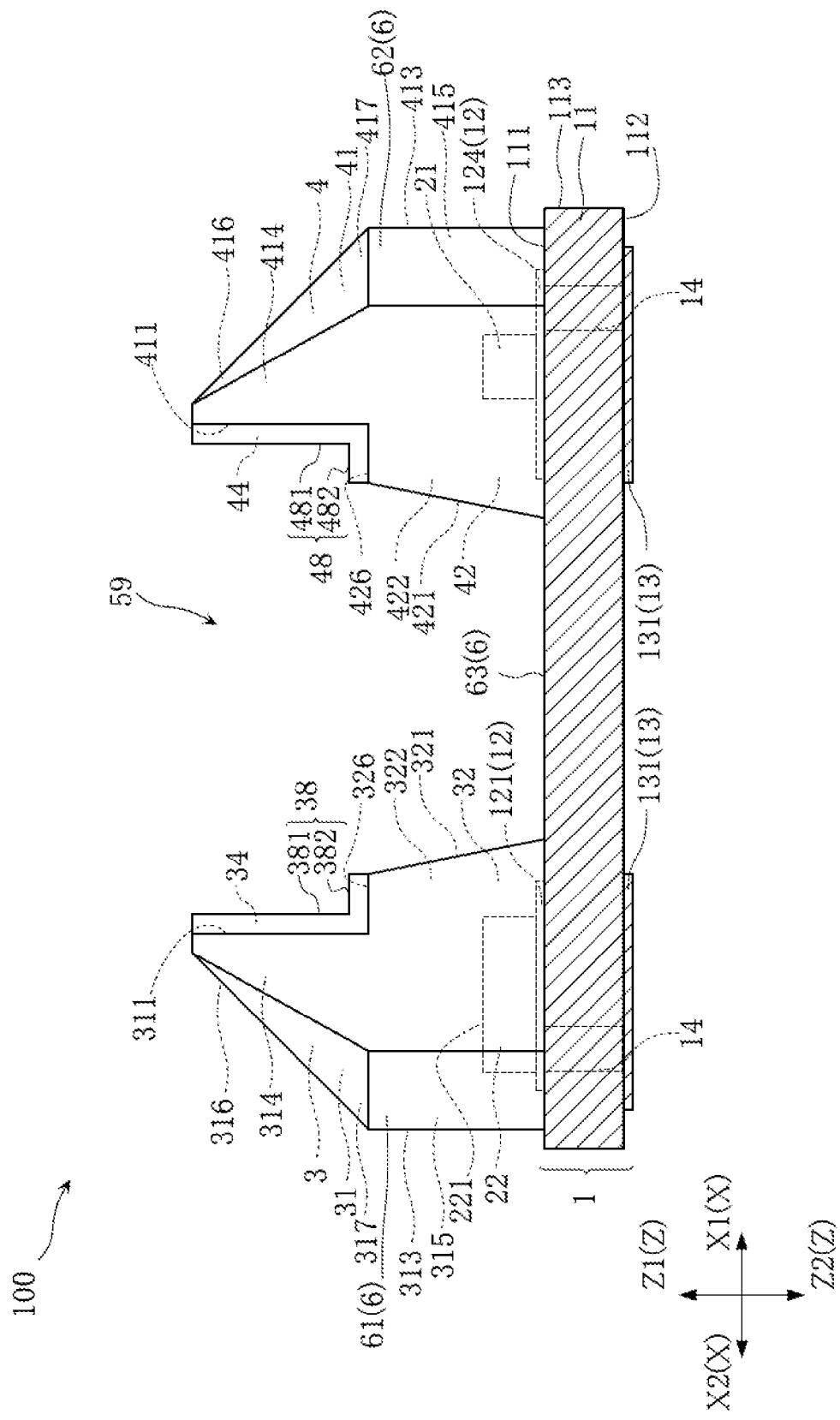
FIG. 6 is a front view showing the photointerrupter according to the first embodiment.
Figure 7:
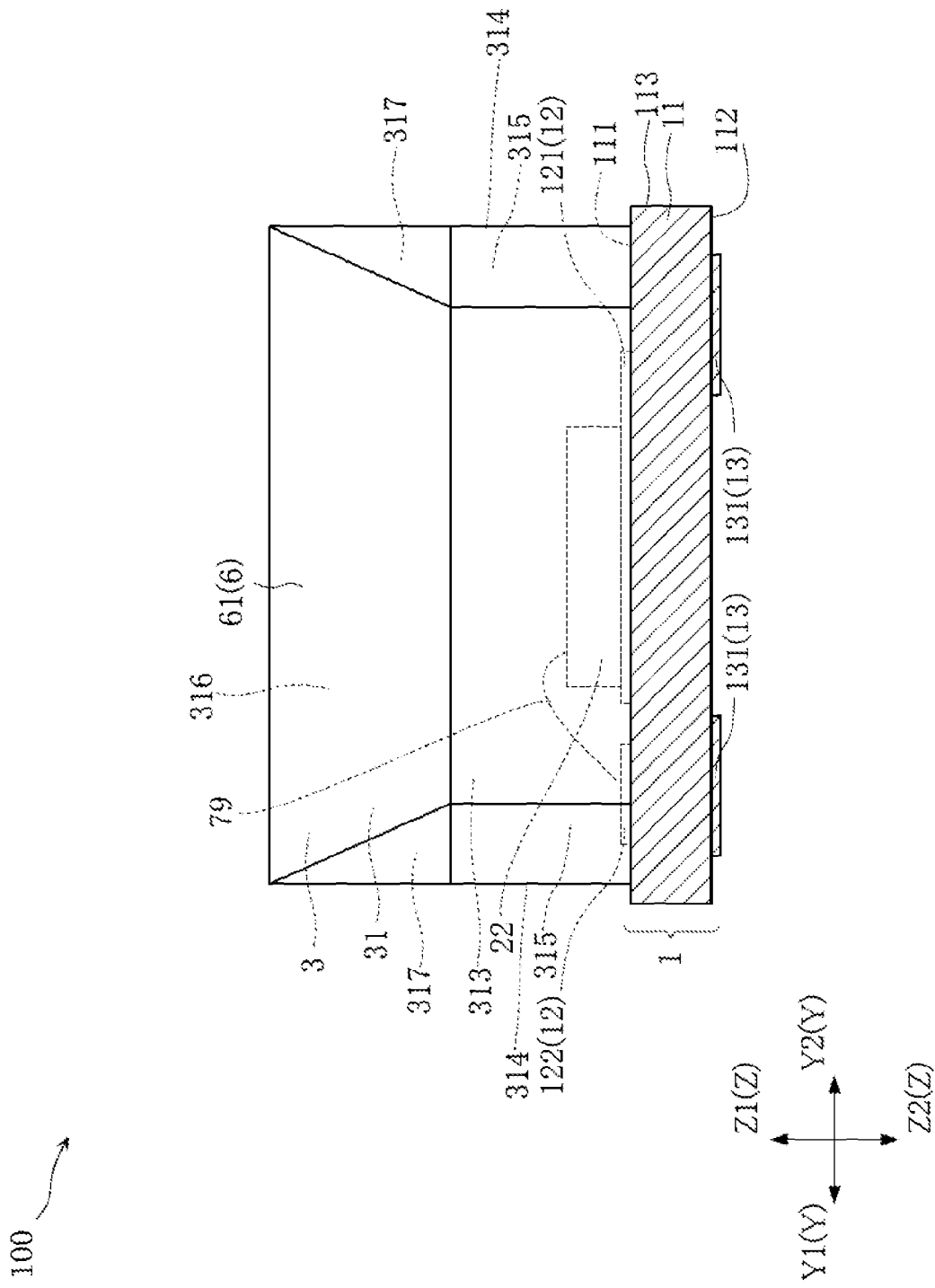
FIG. 7 is a left side view of the photointerrupter shown in FIG. 6.
Figure 8:
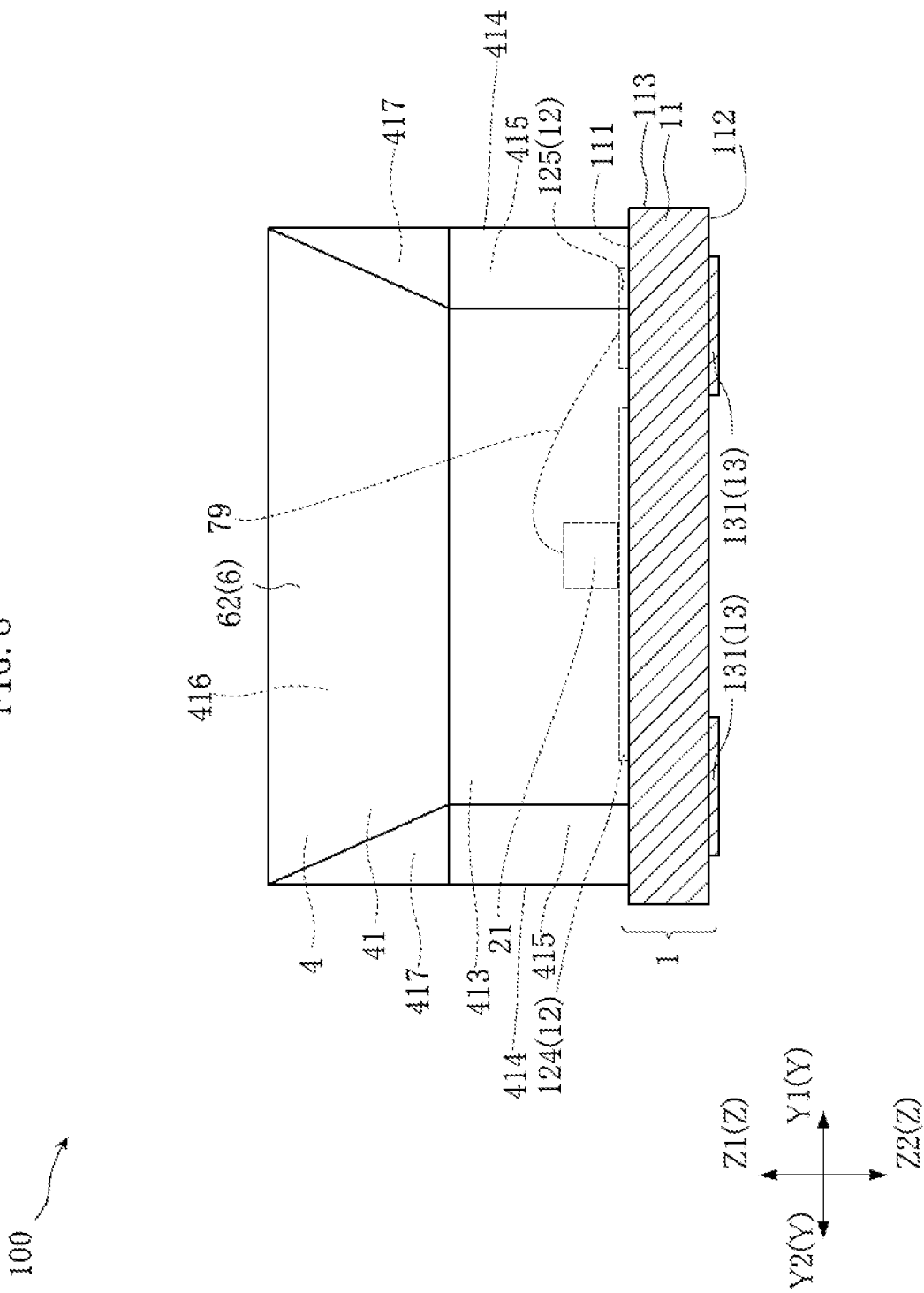
FIG. 8 is a right side view of the photointerrupter shown in FIG. 6.
Figure 9:
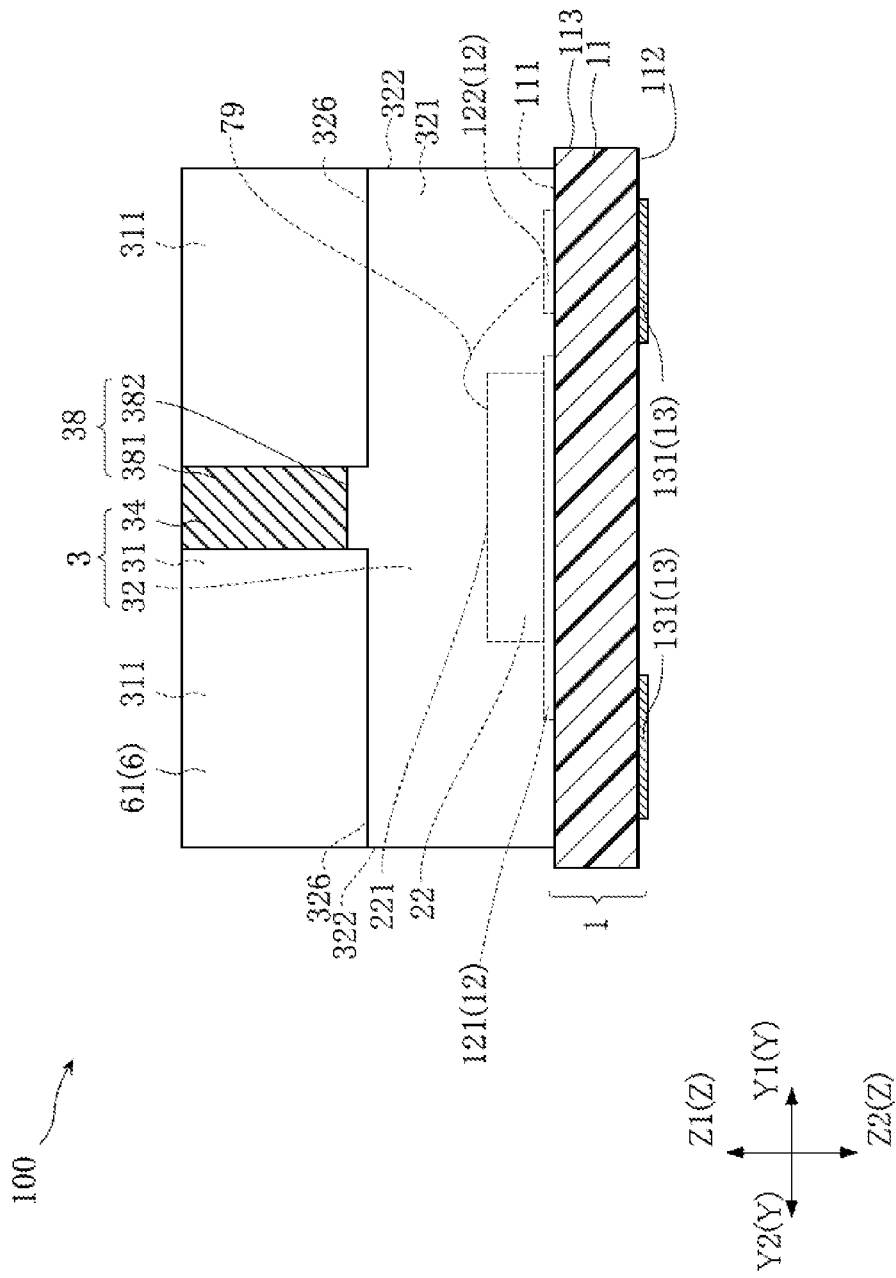
FIG. 9 is a sectional view taken along lines IX-IX in FIGS. 3 and 4.
Figure 10:
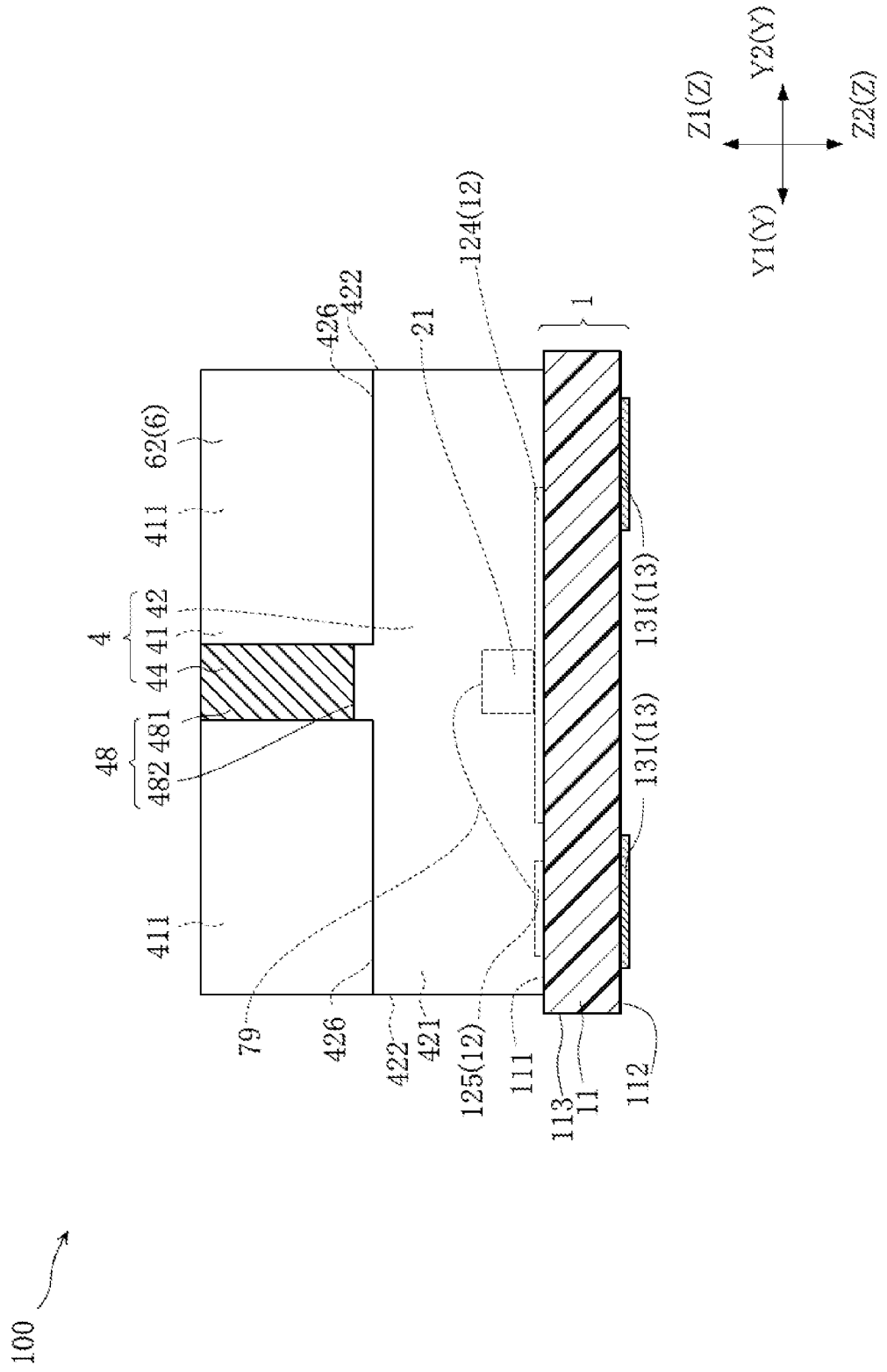
FIG. 10 is a sectional view taken along lines X-X in FIGS. 3 and 4.
Figure 11:
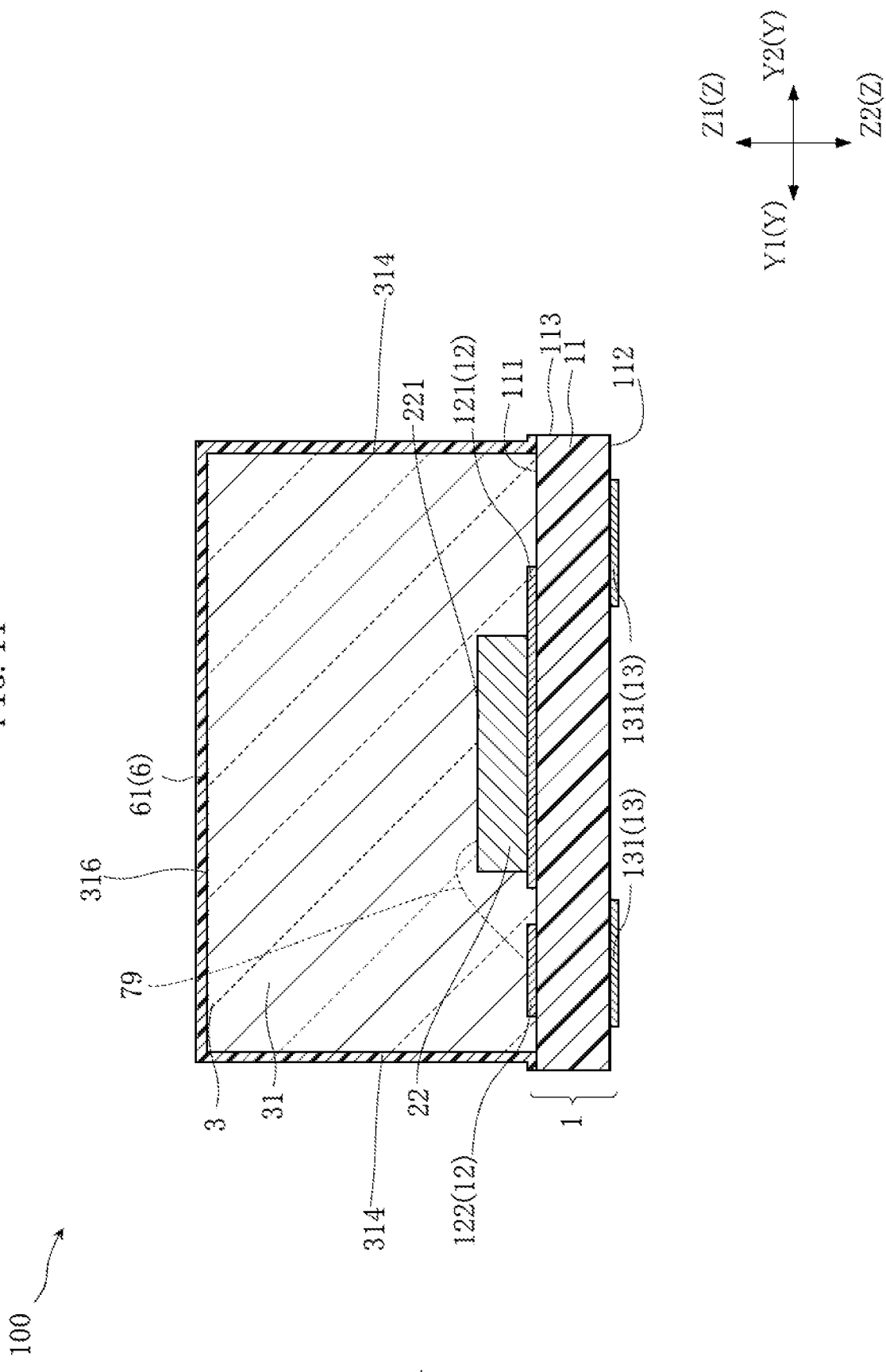
FIG. 11 is a sectional view taken along lines XI-XI in FIGS. 3 and 4.
Figure 12:
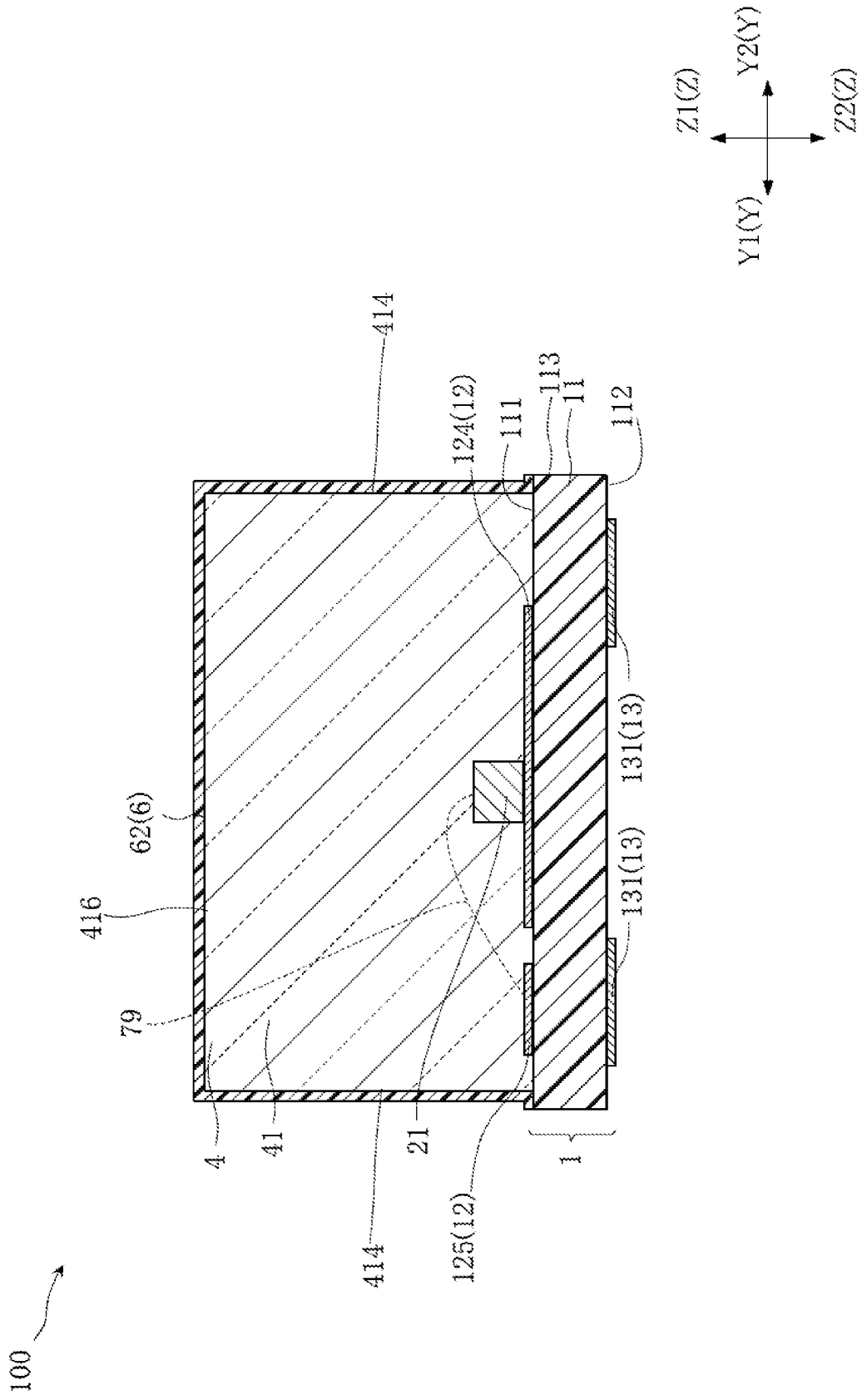
FIG. 12 is a sectional view taken along lines XII-XII in FIGS. 3 and 4.
Figure 13:
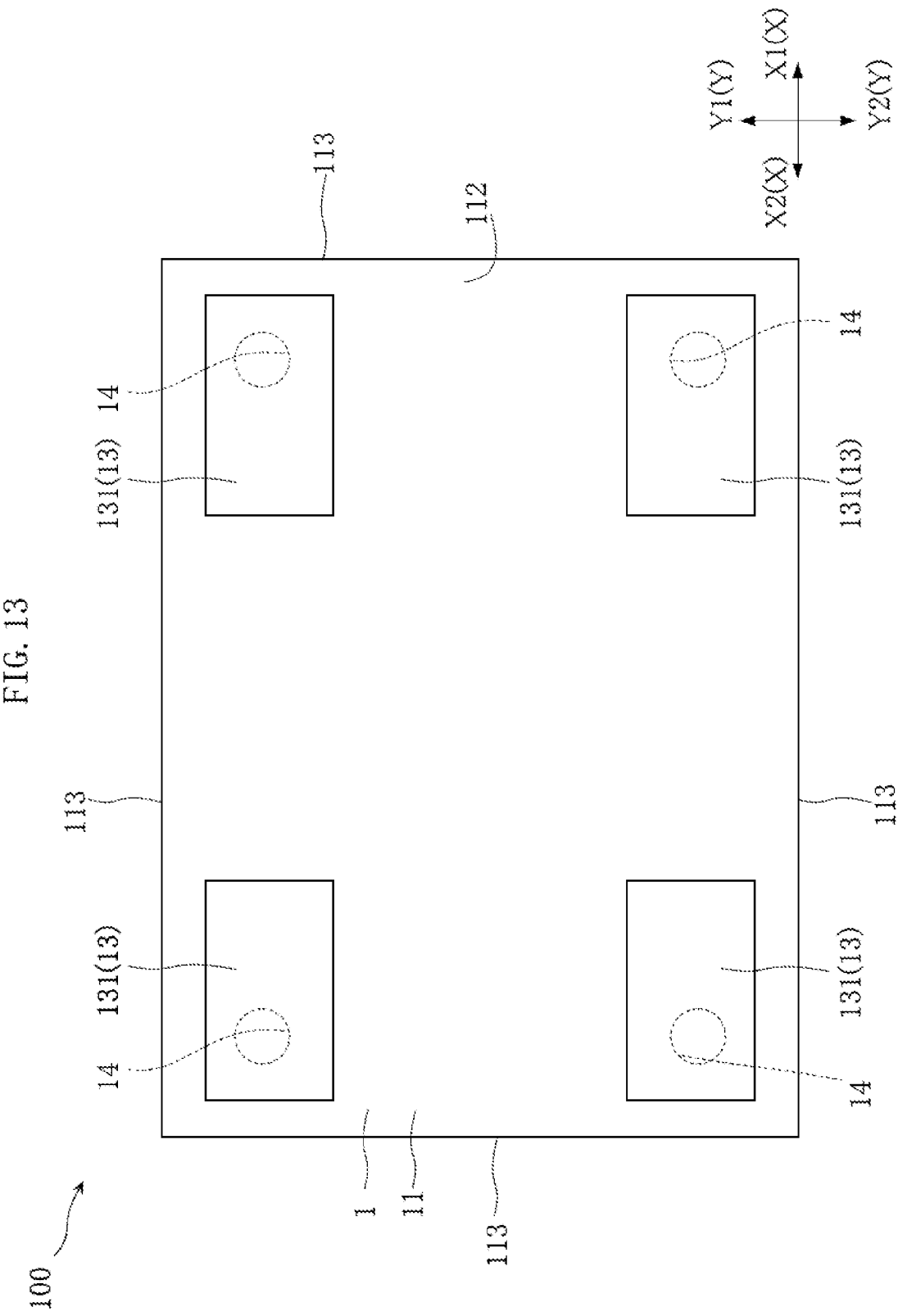
FIG. 13 is a bottom view of the photointerrupter shown in FIG. 6.

FIG. 2 is a perspective view showing the photointerrupter according to the embodiment. FIG. 3 is a plan view showing the photointerrupter. FIG. 4 is a plan view showing the photointerrupter of FIG. 3, with the interior partially visible. FIG. 5 is a plan view of the photointerrupter shown in FIG. 4, from which a detector resin member, an emitter resin member, a light shield layer, and a transmissive resin member are excluded. FIG. 6 is a front view showing the photointerrupter. FIG. 7 is a left side view of the photointerrupter shown in FIG. 6. FIG. 8 is a right side view of the photointerrupter shown in FIG. 6. FIG. 9 is a sectional view taken along lines IX-IX in FIGS. 3 and 4. FIG. 10 is a sectional view taken along lines X-X in FIGS. 3 and 4. FIG. 11 is a sectional view taken along lines XI-XI in FIGS. 3 and 4. FIG. 12 is a sectional view taken along lines XII-XII in FIGS. 3 and 4. FIG. 13 is a bottom view of the photointerrupter shown in FIG. 6. Note that FIG. 1 is a sectional view taken along lines I-I in FIGS. 3 and 4.

The illustrated photointerrupter 100 include a base 1, a light emitting element (emitter) 21, a light receiving element (detector) 22, a detector resin member 3, an emitter resin member 4, transmissive resin members 51 (see FIGS. 3 and 4), a light shield layer 6, and a plurality of wires 79 (two in the embodiment). In FIGS. 2-4 and 6-8, hatched portions indicate exposed regions that are uncovered with the light shield layer 6. In FIG. 9, the hatching provided on a detector protruding portion 34 (to be described later) indicates that the relevant portion is uncovered with the light shield layer 6, and the hatching provided on the base 1 indicates that the relevant portion is a sectional view. In FIG. 10 likewise, the hatching provided on an emitter protruding portion 44 (to be described later) indicates that the relevant portion is uncovered with the light shield layer 6, and the hatching provided on the base 1 indicates that the relevant portion is a sectional view. Hatched portions in FIGS. 11 and 12 indicate that the relevant portions are sectional views.

The photointerrupter 100 is a transmissive photointerrupter. That is, the photointerrupter 100 detects whether a shielding object 811 (see FIG. 1) is located between the detector resin member 3 and the emitter resin member 4.

As shown in FIG. 1 and FIGS. 3 to 5, the base 1 includes a substrate 11, main surface electrodes 12, back surface electrodes 13, and connection electrodes 14.

The substrate 11 is formed of an insulating material. Examples of the insulating material include resins and ceramics. Examples of the applicable resins include a glass-epoxy resin, a bismaleimide-triazine resin, and a polyphenylene ether (PPE) resin. Examples of the applicable ceramics include alumina and aluminum nitride. The substrate 11 includes a main surface 111, a back surface 112, and four side faces 113. The main surface 111 and the back surface 112 are oriented in opposite directions. The main surface 111 is oriented in a Z1-direction which is a component of a thicknesswise direction S of the base 1. The back surface 112 is oriented in a Z2-direction which is opposite to the Z1-direction. The side faces 113 are each oriented in a direction orthogonal to the Z-direction, namely an X-direction or a Y-direction in the embodiment. Each of the four side faces 113 is oriented in a direction different from the other side faces. The side faces 113 are each connected to the main surface 111 and the back surface 112. Two of the side faces 113 adjacent to each other are connected to each other. The main surface 111, the back surface 112, and the four side faces 113 are all flat. The X-direction, the Y-direction, and the Z-direction are orthogonal to each other.

The main surface electrodes 12 are provided on the main surface 111. As shown in FIG. 5, the main surface electrodes 12 include a detector die pad 121, a detector wire bonding pad 122, an emitter die pad 124, and an emitter wire bonding pad 125.

The detector die pad 121 and the detector wire bonding pad 122 are located on the X2-direction side of the main surface 111. The detector die pad 121 has a larger area than the detector wire bonding pad 122 in a plan view. The detector die pad 121 and the detector wire bonding pad 122 are spaced from each other in the Y-direction.

The emitter die pad 124 and the emitter wire bonding pad 125 are located on the X1-direction side of the main surface 111. The emitter die pad 124 has a larger area than the emitter wire bonding pad 125 in a plan view. The emitter die pad 124 and the emitter wire bonding pad 125 are spaced from each other in the Y-direction.

The base 1 may include a resist layer (not shown) formed on the main surface electrodes 12.

As shown in FIG. 13, the back surface electrodes 13 are provided on the back surface 112. The back surface electrodes 13 (four in the embodiment) each include a mounting pad 131. In the embodiment, each mounting pad 131 has a rectangular shape. As shown in FIG. 1, when the photointerrupter 100 is mounted on the mounting board 871, the solder layer 872 is interposed between the mounting pads 131 and the mounting board 871. The solder layer 872 is in direct contact with both the mounting pads 131 and the mounting board 871.

Each of the connection electrodes 14 shown in FIGS. 4 to 6 and FIG. 13 is connected to both the main surface electrode 12 and the back surface electrode 13. The connection electrodes 14 serve for electrical connection between the main surface electrode 12 and the corresponding back surface electrode 13. More specifically, each connection electrode 14 provides electrical connection between one of the four pads (detector die pad 121, detector wire bonding pad 122, emitter die pad 124, and emitter wire bonding pad 125) of the main surface electrodes 12 and the corresponding one of the four mounting pads 131. In the embodiment, the connection electrodes 14 are formed so as to penetrate through the substrate 11, between the main surface 111 and the back surface 112. As shown in FIGS. 5 and 13, the connection electrodes 14 are located so as to overlap both the main surface electrode 12 and the back surface electrode 13, when viewed through an X-Y plane.

The light emitting element 21 shown in FIG. 1, FIGS. 4 to 6, FIG. 8, FIG. 10, and FIG. 12 is an LED chip. The light emitting element 21 emits, for example, infrared light. The light emitting element 21 is located on the base 1. To be more detailed, the light emitting element 21 is located on the emitter die pad 124 as shown in FIG. 5. The light emitting element 21 is electrically connected to the emitter die pad 124 via a conductive bonding layer (not shown). The light emitting element 21 and the emitter wire bonding pad 125 are connected by wire bonding through one of the two wires 79, so as to secure electrical connection between the light emitting element 21 and the emitter wire bonding pad 125.

The light receiving element 22 shown in FIG. 1, FIGS. 4 to 7, FIG. 9, and FIG. 11 converts received light into an electric signal in accordance with the amount of the light. In the embodiment, the light receiving element 22 converts the received infrared light into an electric signal in accordance with the amount of the infrared light. The light receiving element 22 is, for example, a phototransistor or a photodiode. The light receiving element 22 is located on the base 1. To be more detailed, the light receiving element 22 is located on the detector die pad 121 as shown in FIG. 5. The light receiving element 22 is electrically connected to the detector die pad 121 via a conductive bonding layer (not shown). Normally, the light receiving element 22 has a larger area along an X-Y plane than the light emitting element 21. As shown in FIG. 5, the light receiving element 22 includes a light receiving surface 221. In the embodiment, the light receiving surface 221 has a rectangular shape. The light receiving surface 221 may be of a rectangular shape with one of the corners cut away. The light receiving element 22 and the detector wire bonding pad 122 are connected by wire bonding through the other of the two wires 79, so as to secure electrical connection between the light receiving element 22 and the detector wire bonding pad 122.

As shown in FIG. 1, the detector resin member 3 covers the light receiving element 22. The detector resin member 3 is formed so as to directly contact the base 1. More specifically, the detector resin member 3 is located on the main surface 111 of the substrate 11. The detector resin member 3 is transparent and light-transmissive. In the embodiment, the detector resin member 3 transmits light of a wavelength range from visible light to infrared light. The detector resin member 3 is formed of, for example, an epoxy-based resin or an acrylic-based resin. The detector resin member 3 includes a light incident surface 38.

As shown in FIG. 1, the emitter resin member 4 covers the light emitting element 21. The emitter resin member 4 is formed so as to directly contact the base 1. More specifically, the emitter resin member 4 is located on the main surface 111 of the substrate 11. The emitter resin member 4 is transparent and light-transmissive. In the embodiment, the emitter resin member 4 transmits light of a wavelength range from visible light to infrared light. The emitter resin member 4 is formed of, for example, an epoxy-based resin. The emitter resin member 4 includes a light output surface 48.

Referring once again to FIG. 1, the detector resin member 3 and the emitter resin member 4 are spaced from each other, with a clearance or empty space 59 therebetween. In other words, the clearance 59 is provided between the detector resin member 3 and the emitter resin member 4. The direction in which the detector resin member 3 and the emitter resin member 4 are spaced aligns with a direction included in the plane along which the base 1 extends (in the embodiment, X-direction). Now, the detector resin member 3 and the emitter resin member 4 will be described in details below.

First, the detector resin member 3 will be described. The detector resin member 3 includes a detector base body 31 (see FIGS. 1 to 4, FIGS. 6 and 7, FIG. 9, and FIG. 11), a detector bulging portion 32 (see FIGS. 1 to 4, FIG. 6, and FIG. 9), and a detector protruding portion 34 (see FIGS. 1 to 4, FIG. 6, and FIG. 9).

The detector base body 31 is formed so as to contact the base 1, and covers the light receiving element 22. The detector base body 31 is located so as to partially overlap the light receiving element 22 when viewed through the X-Y plane. As is apparent from FIGS. 2 and 3, the detector base body 31 includes a detector base body front face 311, detector base body outer faces 313, 314, 315, 316, and 317. The detector base body front face 311 and the detector base body outer faces 313, 314, 315, 316, and 317 are all flat.

The detector base body front face 311 is oriented toward the emitter resin member 4 (X1-direction side). The detector base body outer face 313 is oriented opposite (X2-direction side) to the side where the direction emitter resin member 4 is located. Each of the detector base body outer faces 314 is oriented to one or the other side of the Y-direction. Each of the detector base body outer faces 315 constitutes an intermediate region between the detector base body outer face 313 and the detector base body outer face 314. The detector base body outer faces 313, 314, and 315 are all formed so as to contact the base 1. The detector base body outer faces 313, 314, and 315 are erected generally upright on the base 1. In other words, the detector base body outer faces 313, 314, and 315 are barely inclined with respect to the Z-direction, though slightly inclined with respect thereto. Such slight inclination of the detector base body outer faces 313, 314, and 315 with respect to the Z-direction facilitates a die for forming a detector resin member 3' (to be described later) to be removed therefrom.

The detector base body outer face 316 continuously extends from the detector base body outer face 313. The detector base body outer face 316 is inclined with respect to the detector base body outer face 313, such that a portion thereof farther from the base 1 comes closer to the emitter resin member 4. Such inclination of the detector base body outer face 316 with respect to the detector base body outer face 313 effectively directs the light that has entered the detector resin member 3 through the light incident surface 38 toward the light receiving element 22 upon being reflected by the detector base body outer face 316. As is apparent from FIG. 4, the detector base body outer face 316 overlaps the light receiving element 22 when viewed through an X-Y plane. Each of the detector base body outer faces 317 is adjacent to all of the detector base body outer faces 314, 315, and 316.

The detector bulging portion 32 is formed so as to protrude from the detector base body 31 toward the emitter resin member 4 (X1-direction side). The detector bulging portion 32 is formed so as to contact the base 1. In the embodiment, the detector bulging portion 32 is larger than the light receiving element 22 in the Y-direction. Further, as shown in FIG. 9, the detector bulging portion 32 overlaps the entirety or the light receiving element 22 in an X-direction view (view 1 through a Y-Z plane).

As explicitly shown in FIGS. 3, 6, and 9, the detector bulging portion 32 includes a detector bulging portion front face 321, two detector bulging portion side faces 322, and a detector connecting face 326. The detector bulging portion front face 321, the two detector bulging portion side faces 322, and the detector connecting face 326 are all flat.

As shown in FIG. 6, the detector bulging portion front face 321 is oriented toward the emitter resin member 4 (X1-direction side). The detector bulging portion front face 321 is formed so as to contact the base 1. The detector bulging portion front face 321 is inclined with respect to the thicknesswise direction Z of the base 1, such that a portion thereof farther from the base 1 is spaced farther from the emitter resin member 4 (X2-direction side). It is preferable that the inclination angle of the detector bulging portion front face 321 with respect to the thicknesswise direction Z be larger than that of the detector base body outer face 313. It is preferable that the inclination angle of the detector bulging portion front face 321 with respect to the thicknesswise direction Z be not smaller than 0° and not larger than 30°.

As shown in FIGS. 3 and 9, each detector bulging portion side face 322 is oriented in one of the Y1-direction and Y2-direction. In the embodiment, the detector bulging portion side faces 322 are flush with the corresponding detector base body outer face 314. However, it is not mandatory that the detector bulging portion side face 322 be flush with the detector base body outer face 314. The detector bulging portion side face 322 may be located closer to the center of the base 1 than is the detector base body outer face 314, when viewed through an X-Y plane.

The detector connecting face 326 shown in FIGS. 3, 6, and 9 is oriented in the Z1-direction. The detector connecting face 326 constitutes an intermediate region between the detector bulging portion front face 321 and the detector base body 31. More specifically, the detector connecting face 326 is adjacent to the detector bulging portion front face 321, the detector bulging portion side face 322, and the detector base body front face 311.

The detector protruding portion 34 shown in FIGS. 1, 3, 6, and 9 is formed so as to protrude from the detector base body 31 toward the emitter resin member 4 (X1-direction side). In the embodiment, the detector protruding portion 34 is spaced from the base 1. In the embodiment, further, the detector protruding portion 34 is formed so as to protrude from the detector connecting face 326.

As shown in FIGS. 1, 6, and 9, the detector protruding portion 34 constitutes the aforementioned light incident surface 38. In the embodiment, the light incident surface 38 includes a first incident portion 381 and a second incident portion 382. It is preferable that the first incident portion 381 and the second incident portion 382 each have a flat surface. Alternatively, the first incident portion 381 and the second incident portion 382 may have a slightly convex or concave surface. The first incident portion 381 is oriented toward the emitter resin member 4 (X1-direction side). The second incident portion 382 is oriented in a direction different from the direction of the first incident portion 381. In the embodiment, the second incident portion 382 is oriented in a direction from the base 1 to the detector resin member 3 (Z1-direction), along the thicknesswise direction Z of the base 1.

The emitter resin member 4 will now be described. In the embodiment, the emitter resin member 4 and the detector resin member 3 are symmetrically configured with respect to a Y-Z plane. However, the emitter resin member 4 and the detector resin member 3 may be asymmetric with respect to the Y-Z plane.

The emitter resin member 4 includes an emitter base body 41 (see FIGS. 1 to 4, FIG. 6, FIG. 8, FIG. 10, and FIG. 12), an emitter bulging portion 42 (see FIGS. 1 to 4, FIG. 6, and FIG. 10), and an emitter protruding portion 44 (see FIGS. 1 to 4, FIG. 6, and FIG. 10).

The emitter base body 41 is located in contact with the base 1 so as to cover the light emitting element 21. The emitter base body 41 is disposed so as to partially cover the light emitting element 21 when viewed through an X-Y plane. As is apparent from FIGS. 2 and 3, the emitter base body 41 includes an emitter base body front face 411, and emitter base body outer faces 413, 414, 415, 416, and 417. The emitter base body front face 411 and the emitter base body outer faces 413, 414, 415, 416, and 417 are all flat.

The emitter base body front face 411 is oriented toward the detector resin member 3 (X2-direction side). The emitter base body front face 411 is disposed so as to oppose the detector base body front face 311, across the clearance 59 and the light shield layer 6 (to be described later). The emitter base body outer face 413 is oriented opposite (X1-direction side) to the side where the detector resin member 3 is located. Each of the emitter base body outer faces 414 is oriented in one or the other direction of the Y-direction. The emitter base body outer faces 415 each constitute an intermediate region between the emitter base body outer face 413 and the emitter base body outer face 414. The emitter base body outer faces 413, 414, and 415 are all formed so as to contact the base 1. The emitter base body outer faces 413, 414, and 415 are erected generally upright on the base 1. In other words, the emitter base body outer faces 413, 414, and 415 are barely inclined with respect to the Z-direction, though slightly inclined with respect thereto. Such slight inclination of the emitter base body outer faces 413, 414, 415 with respect to the Z-direction facilitates a die for forming an emitter resin member 4' (to be described later) to be removed therefrom.

The emitter base body outer face 416 continuously extends from the emitter base body outer face 413. The emitter base body outer face 416 is sloped with respect to the emitter base body outer face 413 such that a portion thereof farther from the base 1 comes closer to the detector resin member 3. Such inclination of the emitter base body outer face 416 with respect to the emitter base body outer face 413 effectively directs the light emitted from the light emitting element 21 toward the light output surface 48 upon being reflected by the emitter base body outer face 416. As is apparent from FIG. 4, the emitter base body outer face 416 overlaps the light emitting element 21 when viewed through an X-Y plane. Each of the emitter base body outer faces 417 is adjacent to all of the emitter base body outer faces 414, 415, and 416.

The emitter bulging portion 42 is formed so as to protrude from the emitter base body 41 toward the detector resin member 3 (X2-direction side). The emitter bulging portion 42 is formed so as to contact the base 1. In the embodiment, the emitter bulging portion 42 is located so as to overlap the entirety of the light emitting element 21 in an X-direction view (view through a Y-Z plane).

As explicitly shown in FIGS. 3, 6, and 10, the emitter bulging portion 42 includes an emitter bulging portion front face 421, two emitter bulging portion side faces 422, and an emitter connecting face 426. The emitter bulging portion front face 421, the two emitter bulging portion side faces 422, and the emitter connecting face 426 are all flat.

As shown in FIG. 6, the emitter bulging portion front face 421 is oriented toward the detector resin member 3 (X2-direction side). The emitter bulging portion front face 421 is disposed so as to oppose the detector bulging portion front face 321, across the clearance 59 and the light shield layer 6. The emitter bulging portion front face 421 is formed so as to contact the base 1. The emitter bulging portion front face 421 is inclined with respect to the thicknesswise direction Z of the base 1, such that a portion thereof farther from the base 1 is spaced farther from the detector resin member 3 (X1-direction side). It is preferable that the inclination angle of the emitter bulging portion front face 421 with respect to the thicknesswise direction Z be larger than that of the emitter base body outer face 413. It is preferable that the inclination angle of the emitter bulging portion front face 421 with respect to the thicknesswise direction Z be not smaller than 0° and not larger than 30°.

As shown in FIGS. 3 and 10, each emitter bulging portion side face 422 is oriented in one of the Y1-direction and Y2-direction. In the embodiment, the emitter bulging portion side faces 422 are flush with the corresponding emitter base body outer face 414. However, it is not mandatory that the emitter bulging portion side face 422 be flush with the emitter base body outer face 414. The emitter bulging portion side face 422 may be located closer to the center of the base 1 than is the emitter base body outer face 414, when viewed through an X-Y plane.

The emitter connecting face 426 shown in FIGS. 3, 6, and 10 is oriented in the Z1-direction. The emitter connecting face 426 constitutes an intermediate region between the emitter bulging portion front face 421 and the emitter base body 41. More specifically, the emitter connecting face 426 is adjacent to the emitter bulging portion front face 421, the emitter bulging portion side face 422, and the emitter base body front face 411.

The emitter protruding portion 44 shown in FIGS. 1, 3, 6, and 10 is formed so as to protrude from the emitter base body 41 toward the detector resin member 3 (X2-direction side). In the embodiment, the emitter protruding portion 44 is spaced from the base 1. In the embodiment, further, the emitter protruding portion 44 is formed so as to protrude from the emitter connecting face 426.

As shown in FIG. 1, the emitter protruding portion 44 constitutes the aforementioned light output surface 48. The light output surface 48 is disposed so as to oppose the light incident surface 38 across the clearance 59. Although it is preferable that the light output surface 48 and the light incident surface 38 oppose each other, the light output surface 48 and the light incident surface 38 may be deviated from each other in the X-direction view. In the embodiment, the light output surface 48 includes a first output portion 481 and a second output portion 482. It is preferable that the first output portion 481 and the second output portion 482 each have a flat surface. Alternatively, the first output portion 481 and the second output portion 482 may have a slightly convex or concave surface. The first output portion 481 is oriented toward the detector resin member 3 (X2-direction side). The second output portion 482 is oriented in a direction different from the direction of the first output portion 481. In the embodiment, the second output portion 482 is oriented in a direction from the base 1 to the emitter resin member 4 (Z1-direction), along the thicknesswise direction Z of the base 1.

Figure 14:
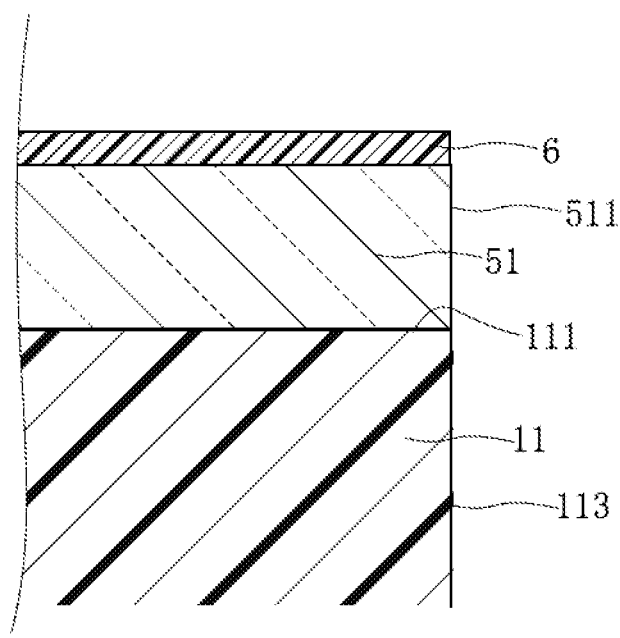
FIG. 14 is an enlarged fragmentary sectional view of the photointerrupter according to the first embodiment.

Each of the transmissive resin members 51 shown in FIGS. 3 and 4 is connected to one of the detector resin member 3 and the emitter resin member 4. As shown in FIG. 14, the transmissive resin members 51 each include an end face 511 which is flush with the side face 113.

As explicitly shown in FIG. 1, the light shield layer 6 covers the detector resin member 3 and the emitter resin member 4. In the embodiment, further, the light shield layer 6 covers the base 1 and the transmissive resin members 51 (see FIG. 14). As shown in FIGS. 1, 11, and 12, the light shield layer 6 extends as far as the edge of the main surface 111 of the substrate 11 (boundary between the main surface 111 and the side face 113). The light shield layer 6 transmits neither visible light nor infrared light. The light shield layer 6 thus configured is finished in black or gray color, for example. Examples of the material of the light shield layer 6 include a black resist, an epoxy resin, a metal oxide such as $Fe_2O_3$ or $Cr_2O_3$, a metal such as Ag, Au, Pd, or Ni, and an alloy of Al and Ti. Alternatively, the light shield layer 6 may be formed of C or $SiO_2$. From the light shield layer 6, both the light output surface 48 and the light incident surface 33 are exposed. In the embodiment, the light shield layer 6 has a thickness of 0.01 to 100 μm. Further, the light shield layer 6 has a thickness of 0.01 to 100 μm over its entirety, in the embodiment.

As shown in FIGS. 1-4 and FIGS. 6-12, the light shield layer 6 includes a detector cover portion 61, an emitter cover portion 62 and a base cover portion 63.

The detector cover portion 61 covers the detector resin member 3. To be more detailed, the detector cover portion 61 covers the detector base body 31, the detector bulging portion 32, and (a part of) the detector protruding portion 34. From the detector cover portion 61, the light incident surface 38 is exposed. In further details, the detector cover portion 61 covers the detector base body front face 311, the detector base body outer faces 313 to 317, the detector bulging portion front face 321, the detector bulging portion side faces 322, and the detector connecting face 326. In the embodiment, the detector cover portion 61 has a thickness of 0.01 to 100 μm over its entirety.

The emitter cover portion 62 covers the emitter resin member 4. To be more detailed, the emitter cover portion 62 covers the emitter base body 41, the emitter bulging portion 42, and (a part of) the emitter protruding portion 44. From the emitter cover portion 62, the light output surface 48 is exposed. In further details, the emitter cover portion 62 covers the emitter base body front face 411, the emitter base body outer faces 413 to 417, the emitter bulging portion front face 421, the emitter bulging portion side faces 422, and the emitter connecting face 426. In the embodiment, the emitter cover portion 62 has a thickness of 0.01 to 100 μm over its entirety.

A portion of the emitter cover portion 62 covering the emitter bulging portion front face 421 opposes a portion of the detector cover portion 61 covering the detector bulging portion front face 321. As stated above, the emitter bulging portion front face 421 is disposed so as to oppose the detector bulging portion front face 321 across the clearance 59 and the light shield layer 6. Accordingly, the portion of the emitter cover portion 62 covering the emitter bulging portion front face 421 is disposed so as to oppose the portion of the detector cover portion 61 covering the detector bulging portion front face 321, across the clearance 59.

The base cover portion 63 includes a portion covering the base 1 and facing the clearance 59. As shown in FIG. 1, both the light output surface 48 and the light incident surface 38 are spaced from the base cover portion 63 in the thicknesswise direction Z of the base 1. It is preferable that the light output surface 48 and the base cover portion 63 are somewhat spaced from each other, because such a configuration assures that the shielding object 811 is effectively introduced between the light output surface 48 and the light incident surface 38. Likewise, it is preferable that the light incident surface 38 and the base cover portion 63 are somewhat spaced from each other, because such a configuration assures that the shielding object 811 is effectively introduced between the light output surface 48 and the light incident surface 38. In the embodiment, the base cover portion 63 has a thickness of 0.01 to 100 μm over its entirety. The base cover portion 63 includes a surface oriented in the direction in which the main surface 111 of the substrate 11 is oriented. The light emitting element 21 has top portion oriented in the direction in which the main surface 111 of the substrate 11 is oriented. The aforementioned surface of the base cover portion 63 is located closer to the main surface 111 of the substrate 11 than is the top portion of the light emitting element 21.

An operation of the photointerrupter 100 will now be described below.

As shown in FIG. 1, when the photointerrupter 100 is activated the light emitting element 21 emits infrared light L11. The infrared light L11 emitted from the light emitting element 21 travels toward the light output surface 48, after being reflected by the emitter base body outer faces 413 to 417 inside the emitter resin member 4. Thus the infrared light L11 is outputted to the clearance 59 from the light output surface 48. When the shielding object 811 is not located between the light output surface 48 and the light incident surface 38, the infrared light L11 emitted from the light emitting element 21 passes through the clearance 59 and reaches the light incident surface 38. The infrared light L11 thus introduced into the detector resin member 3 through the light incident surface 38 is received by the light receiving element 22 after being reflected by the detector base body outer faces 313 to 317 inside the detector resin member 3. The light receiving element 22 generates photovoltaic power so as to output a signal, in proportion to the amount of the received light. In the case where the output value exceeds a predetermined threshold, a detection circuit (not shown) provided outside the photointerrupter 100 decides that the shielding object 811 is not located between the light output surface 48 and the light incident surface 38. On the contrary, when the shielding object 811 is located between the light output surface 48 and the light incident surface 38, the infrared light L11 output ted from the light output surface 48 is inhibited by the shielding object 811 from advancing toward the light incident surface 38. In this case, therefore, the infrared light L11 is unable to reach the light incident surface 38. Accordingly, the light receiving element 22 does not receive the infrared light L11 originating from the light emitting element 21 and hence the output value of the light receiving element 22 does not exceed the threshold. In this case, the detection circuit decides that the shielding object 811 is located between the light output surface 48 and the light incident surface 38. The photointerrupter 100 is thus operated, so as to acquire information indicating whether the shielding object 811 is located between the light output surface 48 and the light incident surface 38.

A method of manufacturing the photointerrupter 100 will be described below. In the following description, the constituents same as or similar to those noted above will be given the same numeral, and the description thereof will not be repeated.

Figure 15:
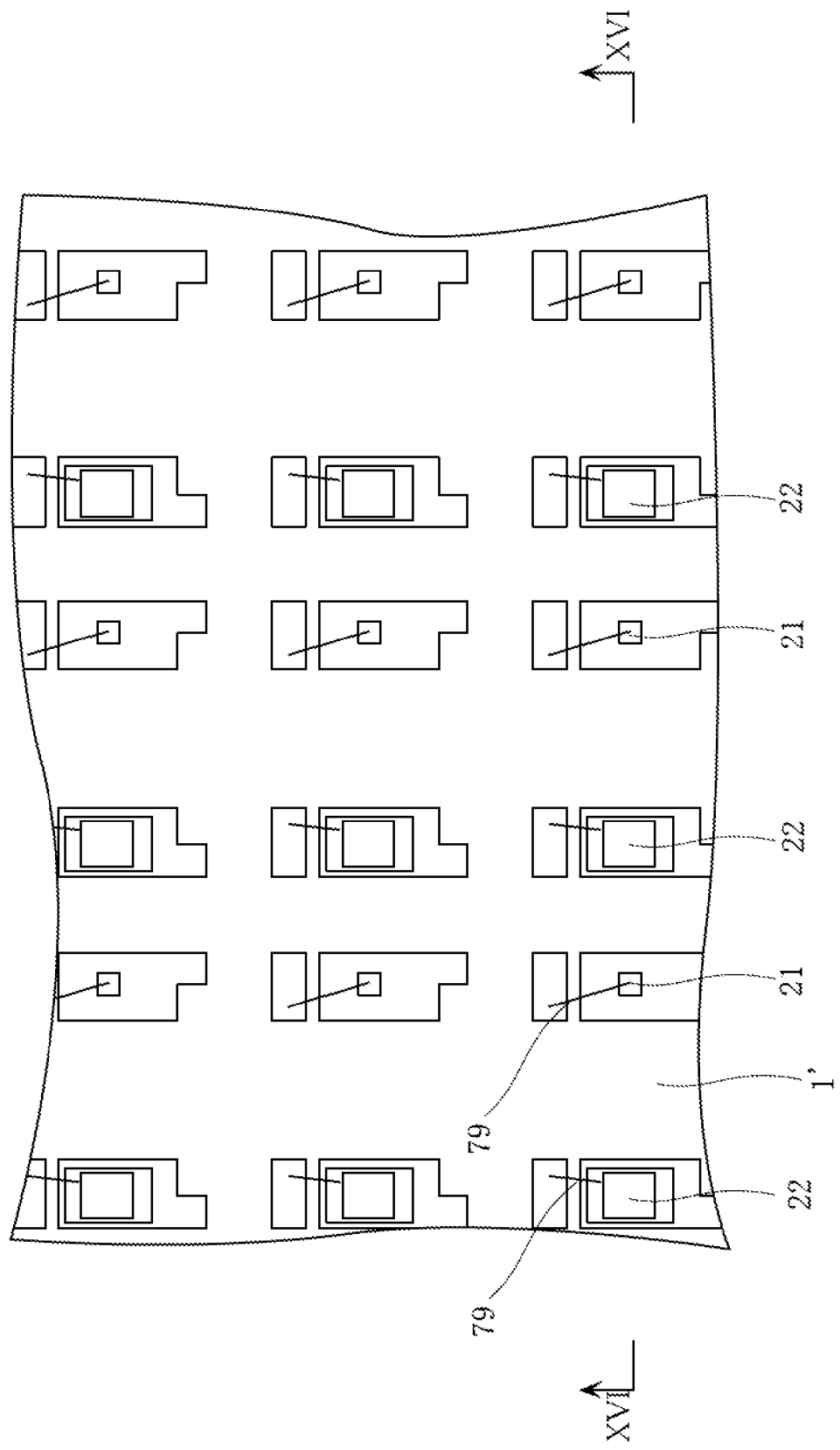
FIG. 15 is a plan view for explaining a manufacturing process of the photointerrupter according to the first embodiment.
Figure 16:
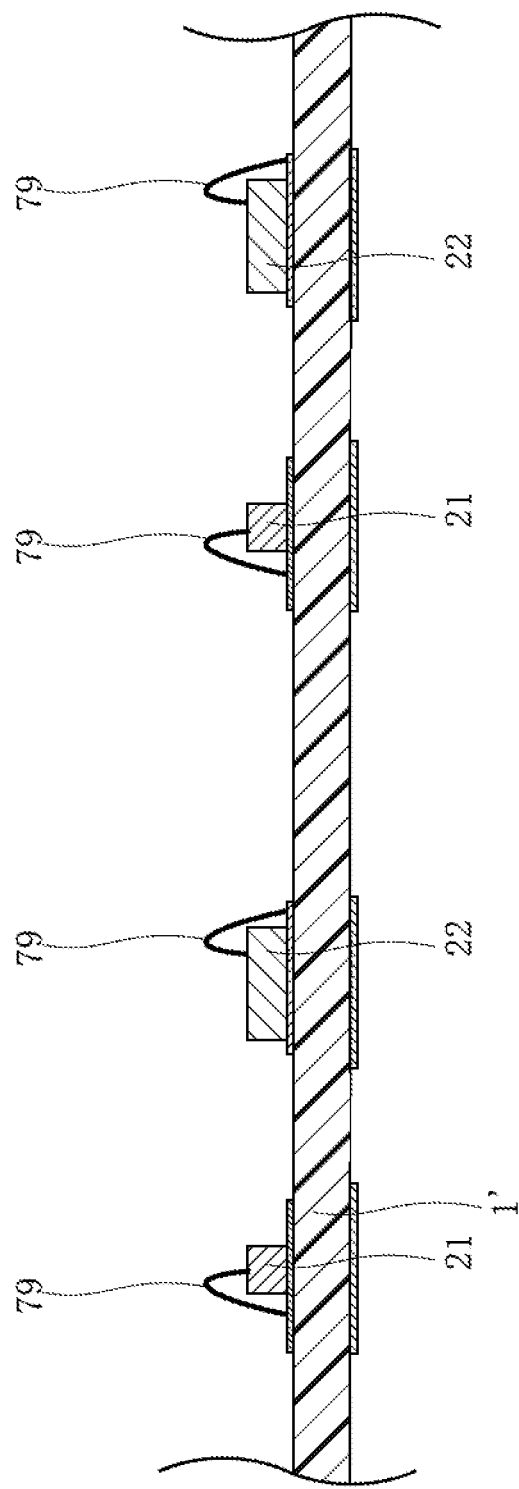
FIG. 16 is a sectional view taken along a line XVI-XVI in FIG. 15.

To start with, a base 1' is prepared as shown in FIGS. 15 and 16. The base 1' includes a substrate, main surface electrodes, a plurality of connection electrodes, and back surface electrodes. The base 1' is to be formed into the foregoing base 1. Then a plurality of light emitting elements 21 and a plurality of light receiving elements 22 are arranged on the base 1' as shown in FIG. 15. After that, wire bonding is performed so as to connect each of the light emitting elements 21 and a corresponding main surface electrode on the base 1', with the wire 79 as shown in FIG. 16. Likewise, wire bonding is performed so as to connect each of the light receiving elements 22 and a corresponding main surface electrode on the base 1', with the wire 79.

Figure 17:
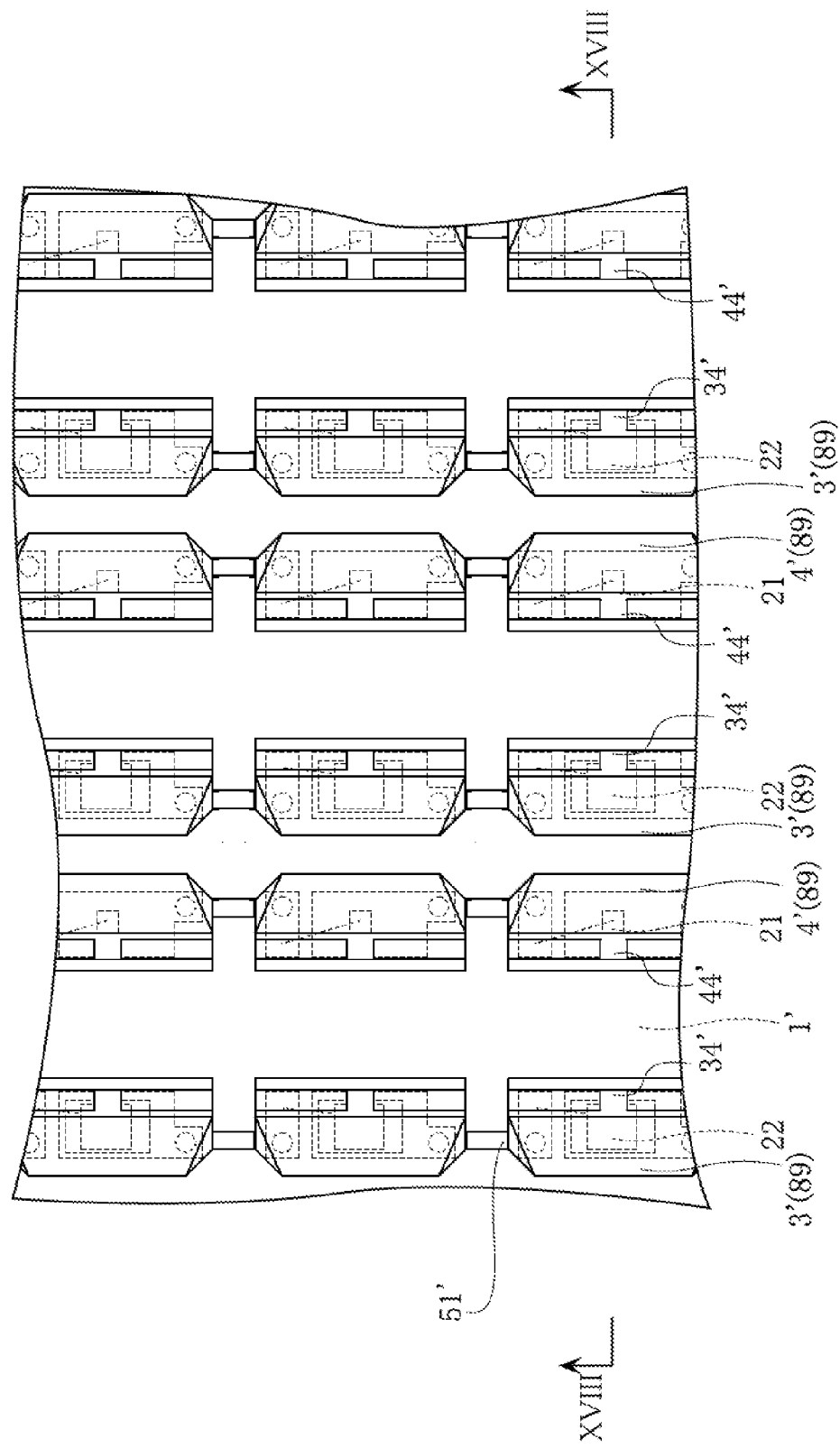
FIG. 17 is a plan view for explaining the manufacturing process subsequent to FIG. 15.
Figure 18:
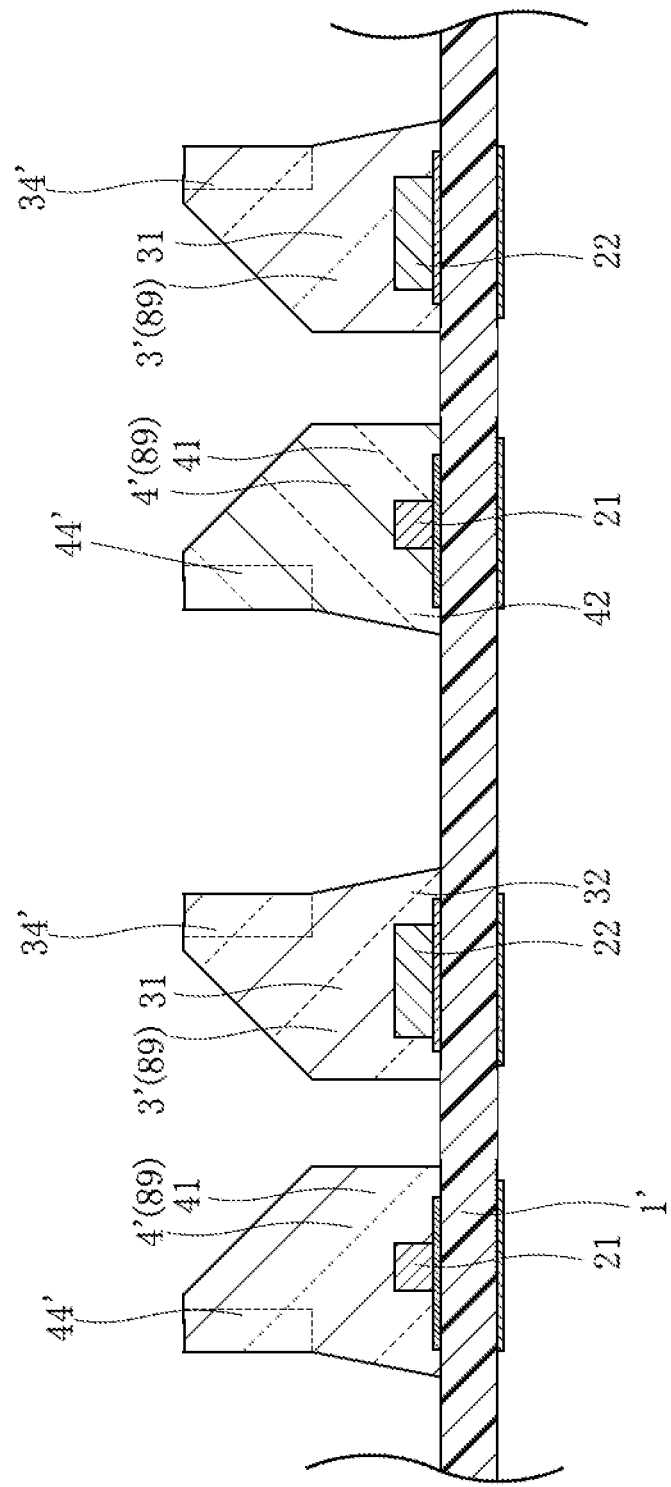
FIG. 18 is a sectional view taken along a line XVIII-XVIII in FIG. 17.

As shown in FIGS. 17 and 18, a transmissive resin member 89 is then formed. The transmissive resin member 89 may be formed through a molding process by using a die. More specifically, in the process of forming the transmissive resin member 89, a detector resin member 3' and an emitter resin member 4' are formed. The detector resin member 3' covers the light receiving element 22. In the process of forming the detector resin member 3', the detector base body 31 and a detector protruding portion 34' elevated therefrom are formed. Likewise, in the process of forming the emitter resin member 4', the emitter base body 41 and an emitter protruding portion 44' elevated therefrom are formed. It is preferable to form the detector resin member 3' and the emitter resin member 4' at a time.

A flow path is provided between the die (not shown) for molding the transmissive resin member 89 and the base 1', for introducing the resin material therethrough. Upon introducing the resin material through the flow path, the resin material is loaded in the die for molding the detector resin member 3' and the emitter resin member 4'. When the resin material loaded in the flow path is cured, the transmissive resin member 51' (see FIG. 17) is formed.

Figure 19:
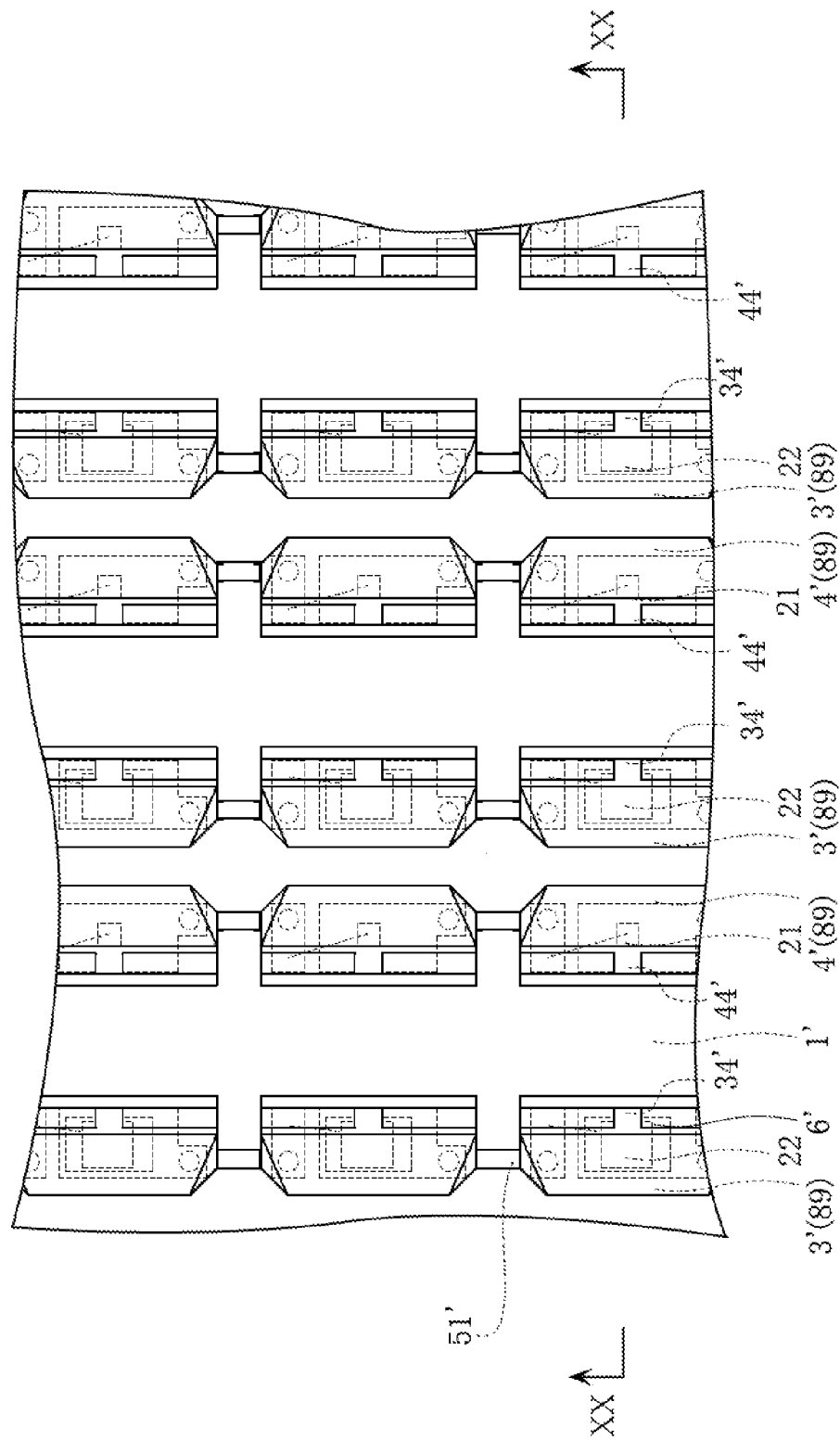
FIG. 19 is a plan view for explaining the manufacturing process subsequent to FIG. 17.
Figure 20:
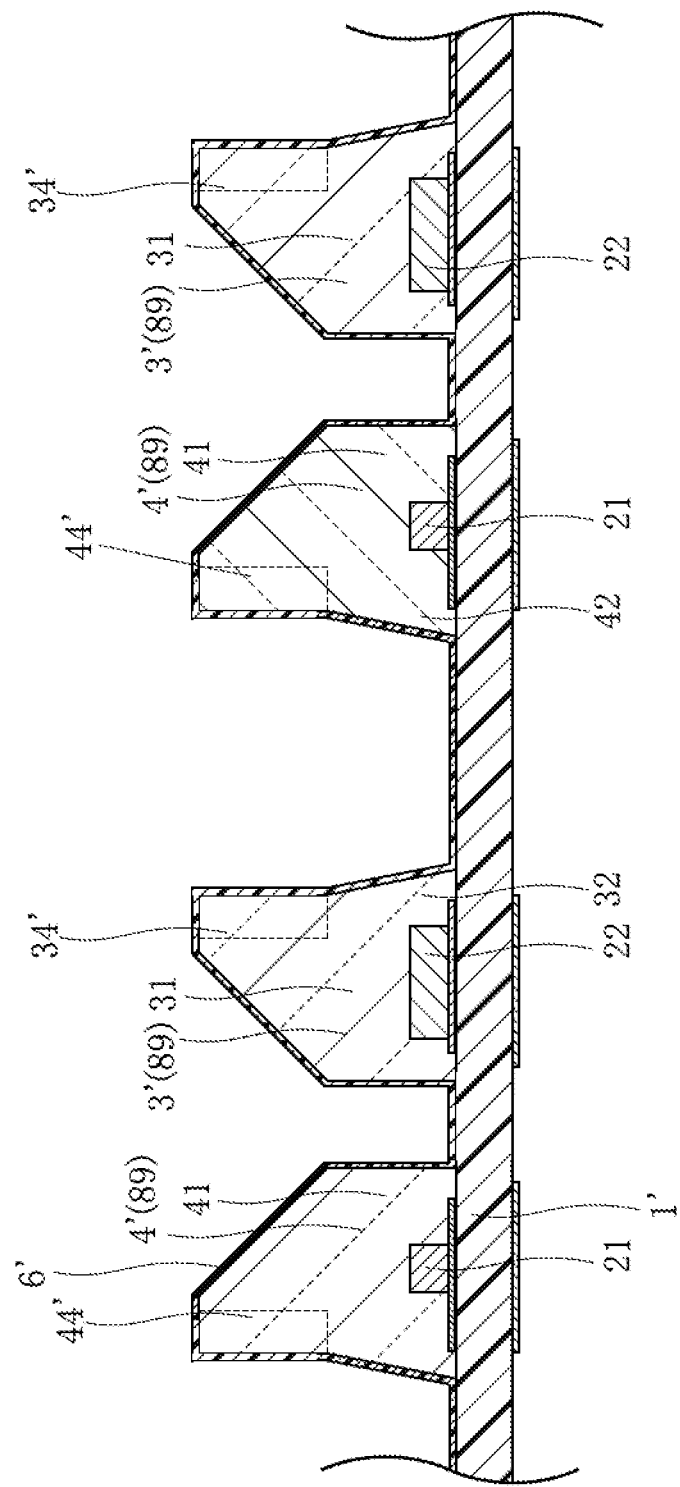
FIG. 20 is a sectional view taken along a line XX-XX in FIG. 19.

Thereafter, as shown in FIGS. 19 and 20, a light shield layer 6' is formed. To form the light shield layer 6', a surface processing technique may be employed. Examples of the applicable surface processing technique include painting, printing, vapor deposition, ion plating, sputtering, and plating. A paint for forming the light shield layer 6' may be applied to the transmissive resin member 89 and then a spin coating process may be performed. Thus, the light shield layer 6' covers the base 1' and the transmissive resin member 89 (i.e., detector resin member 3' and emitter resin member 4'). Further, the light shield layer 6' is formed over a region of the base 1' lying between the detector resin member 3' and the emitter resin member 4'. The light shield layer 6' formed in the region of the base 1' lying between the detector resin member 3' and the emitter resin member 4' is to constitute the base cover portion 63 at a later stage.

Figure 21:
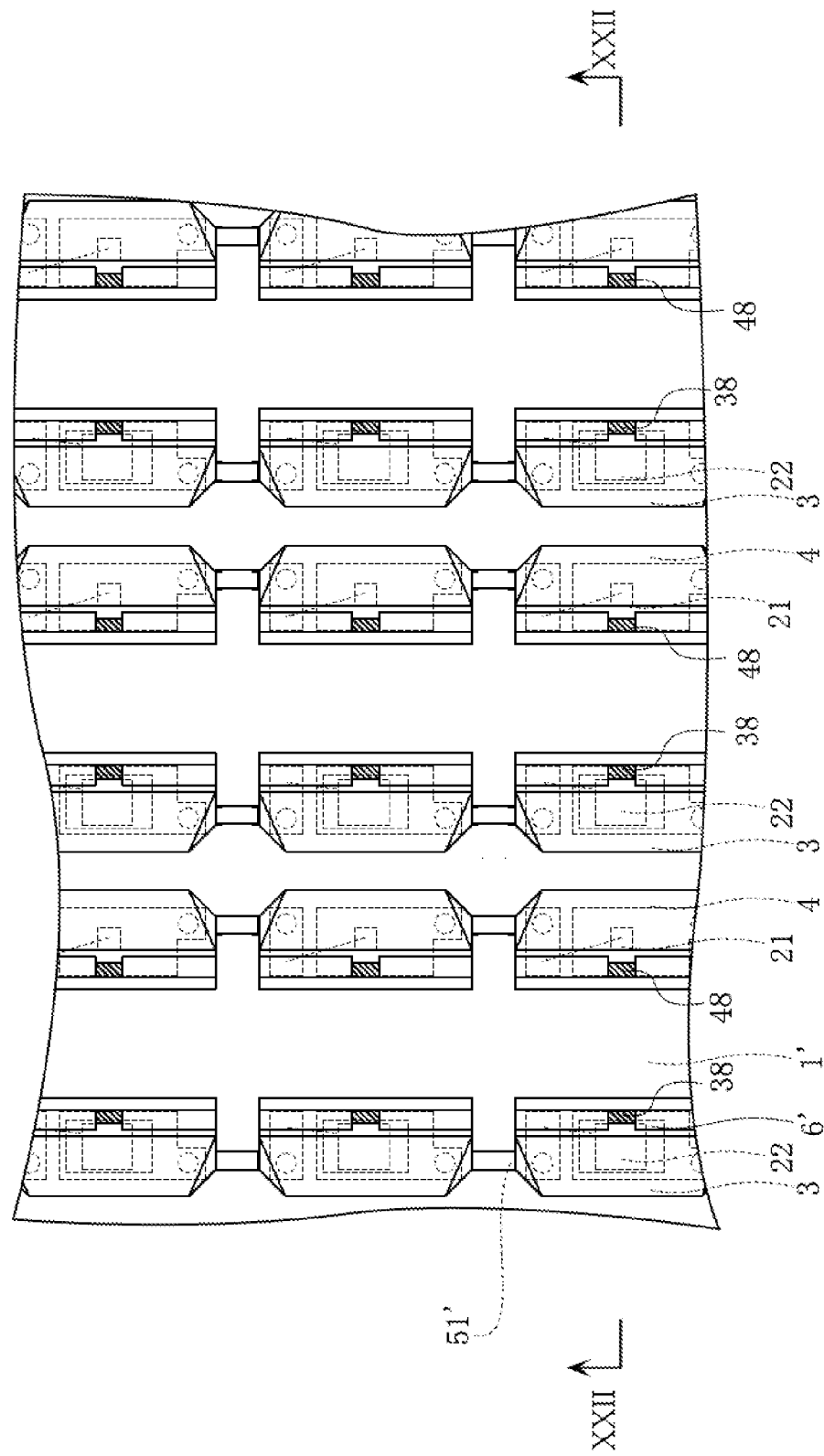
FIG. 21 is a plan view for explaining the manufacturing process subsequent to FIG. 19.
Figure 22:
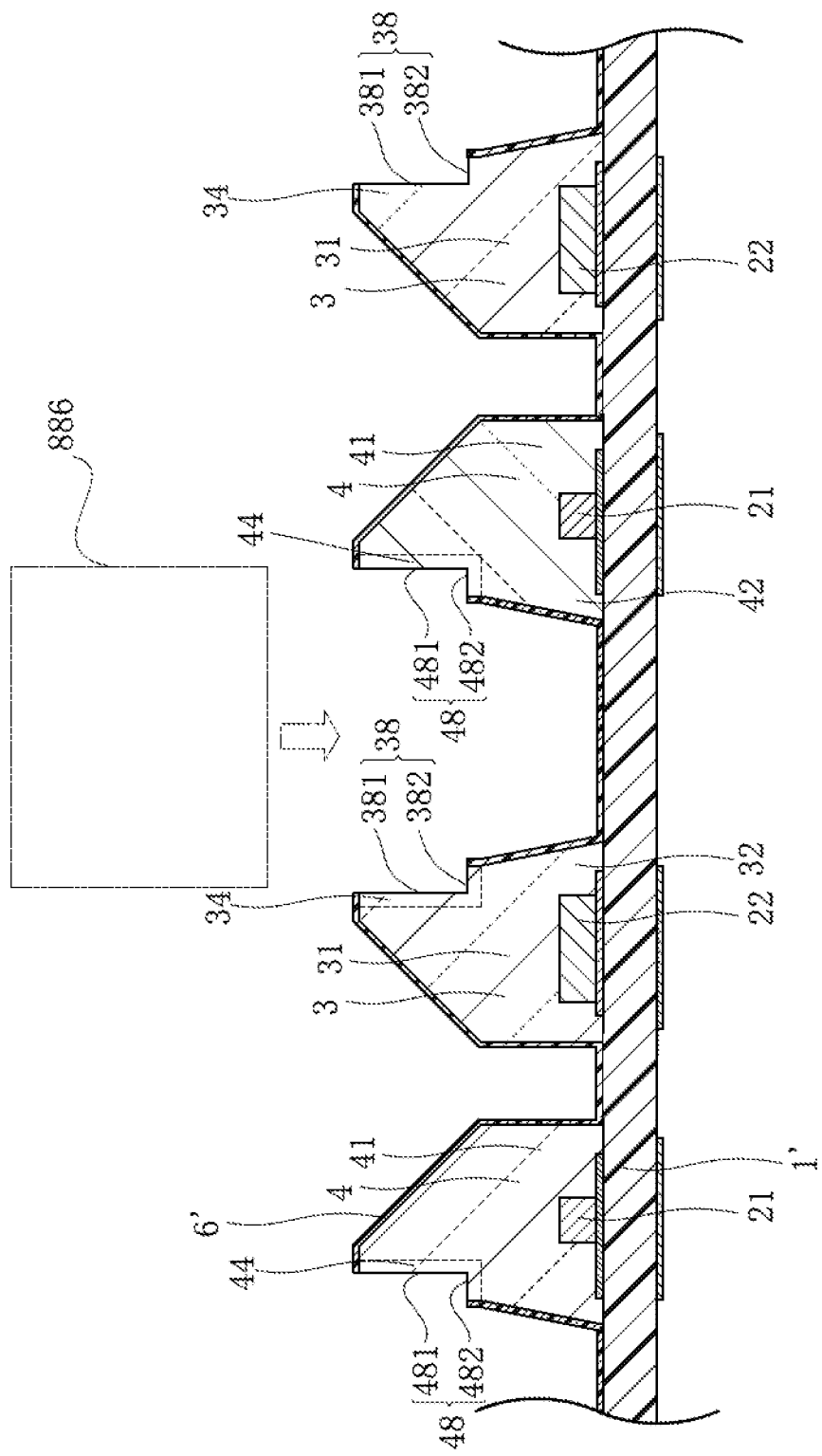
FIG. 22 is a sectional view taken along a line XXII-XXII in FIG. 21.

Then the light incident surface 38 and the light output surface 48 are formed, as shown in FIGS. 21 and 22. To form the light incident surface 38 and the light output surface 48, for example a part of the transmissive resin member 89 and a part of the light shield layer 6' may be collectively removed. More specifically, a part of the light shield layer 6' and a part of the detector protruding portion 34' are collectively removed. Because of such removal, a part of the detector resin member 3 is exposed from the light shield layer 6'. The portion of the detector resin member 3 exposed from the light shield layer corresponds to the light incident surface 38. Likewise, a part of the light shield layer 6' and a part of the emitter protruding portion 44' are collectively removed. Because of such removal, a part of the emitter resin member 4 is exposed from the light shield layer 6'. The portion of the emitter resin member 4 exposed from the light shield layer 6' corresponds to the light output surface 48.

To collectively remove a part of the transmissive resin member 89 and a part of the light shield layer 6', for example a dicing blade 886 may be employed. Referring here to FIG. 22, a part of the detector protruding portion 34' and a part of the light shield layer 6' may be collectively removed by gradually scraping off the detector protruding portion 34' from the uppermost portion thereof to a lower portion thereof. Likewise, a part of the protruding portion 44' and a part of the light shield layer 6' may be collectively removed by gradually scraping off the emitter protruding portion 44' shown in FIG. 22, from the uppermost portion thereof to a lower portion thereof. Alternatively, a laser bears may be employed to collectively remove a part of the transmissive resin member 89 and a part of the light shield layer 6'.

Figure 23:
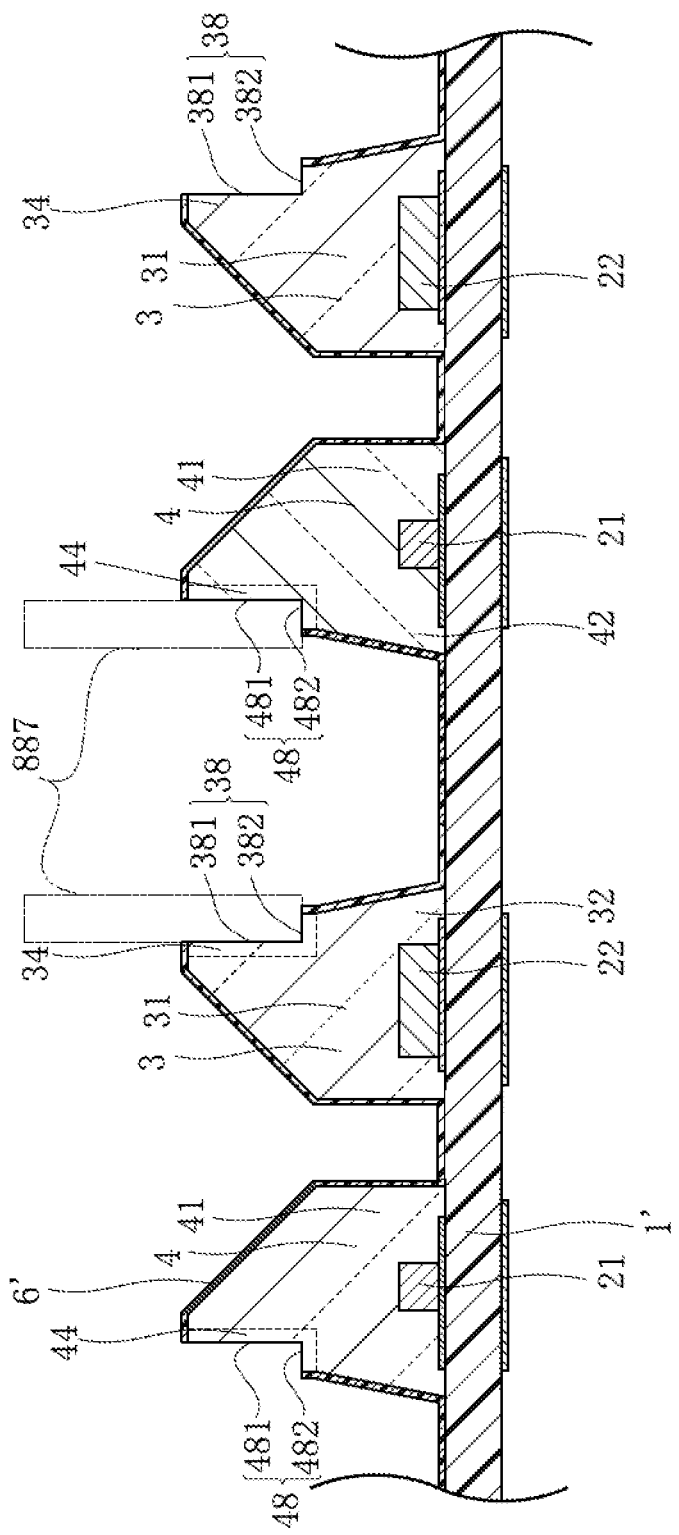
FIG. 23 is a sectional view for explaining a formation process of a light output surface and a light incident surface.

Instead of the method shown in FIG. 22, the following process may be employed for forming the light shield layer 6', as well as the light incident surface 38 and the light output surface 48. As shown in FIG. 23, a jig 887 is brought into contact with portions of the transmissive resin member 89 to be formed into the light output surface 48 and into the light incident surface 38, in the forming process of the light shield layer 6'. In this case, the light shield layer 6' is not formed on the portions of the transmissive resin member 89 with which the jig 887 is disposed in contact. Thus, the light shield layer 6', the light incident surface 38, and the light output surface 48 can be formed at a time.

Instead of the method shown in FIGS. 22 and 23, the formation of the light shield layer 6', the light incident surface 38, and the light output surface 43 may be performed through a printing process utilizing a photomask.

Figure 24:
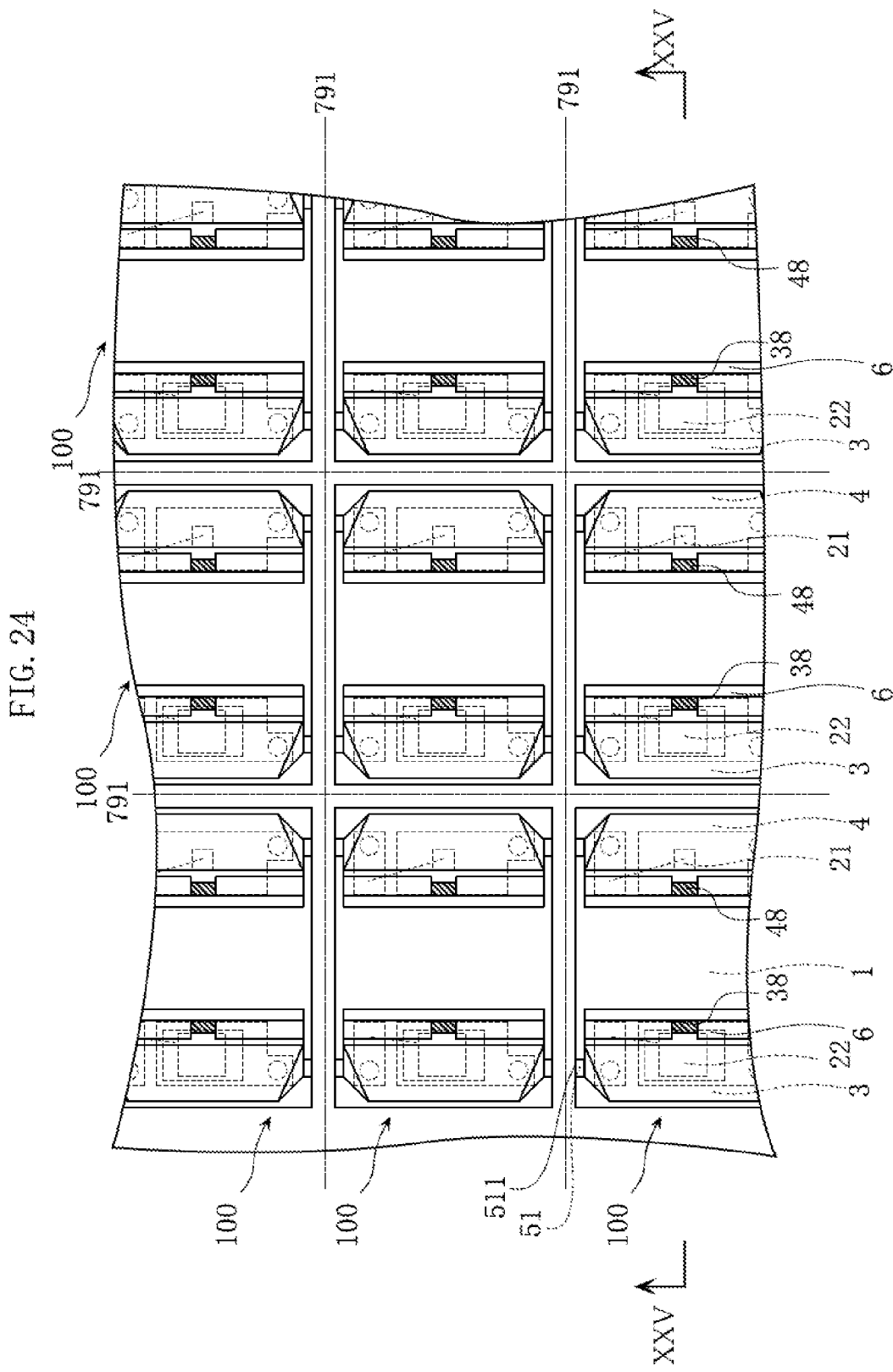
FIG. 24 is a plan view for explaining the manufacturing process subsequent to FIG. 21.
Figure 25:
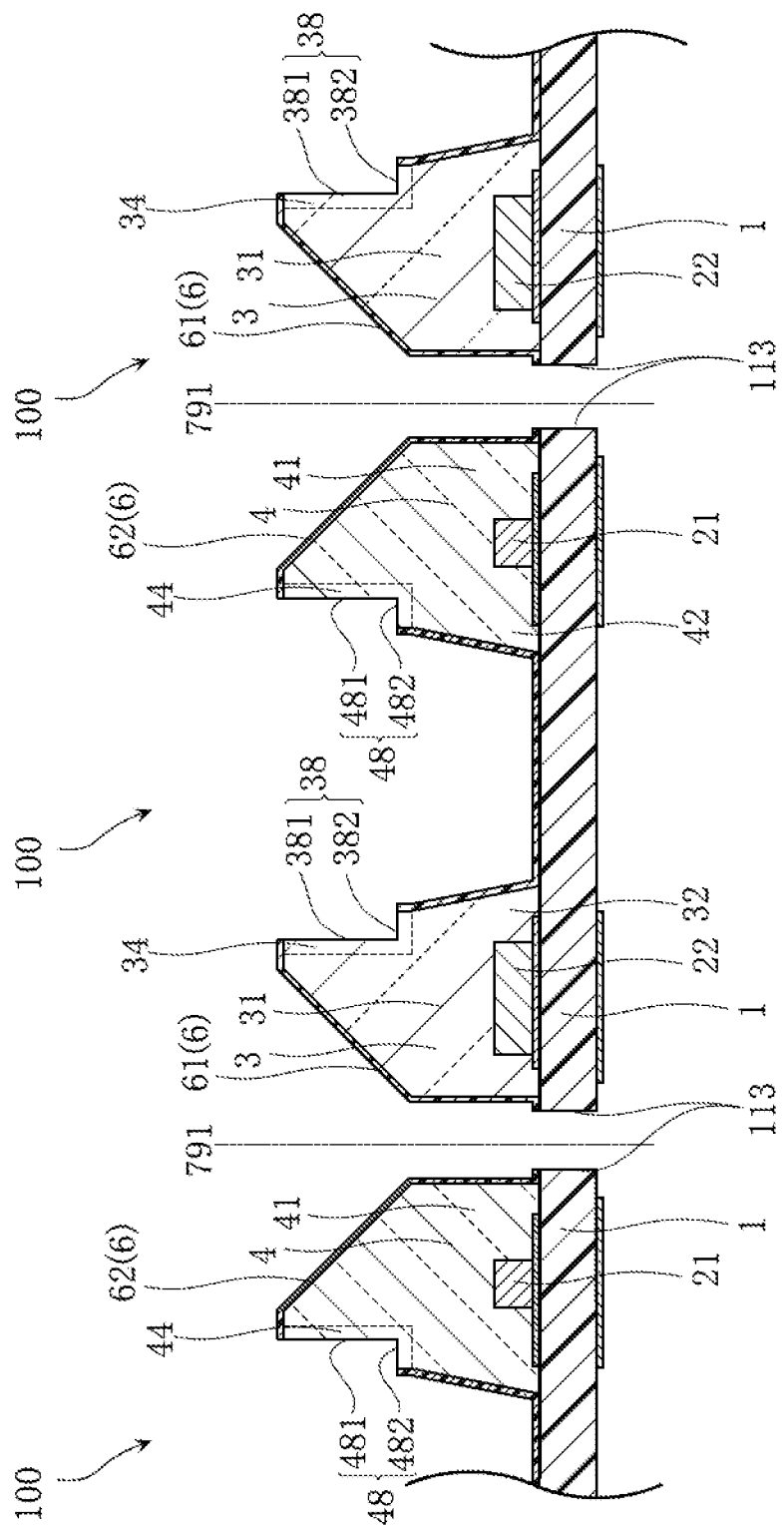
FIG. 25 is a sectional view taken along a line XXV-XXV in FIG. 24.

Referring now to FIGS. 24 and 25, the base 1', the transmissive resin member 51', and the light shield layer 6' are then collectively cut with a dicing blade (not shown) along cutting lines 791. At this stage, a plurality of photointerrupters 100 shown in FIG. 1 can be obtained. Upon cutting the base 1' along the cutting lines 791, the side faces 113 are formed around the substrate 11. In addition, upon cutting the transmissive resin member 51' along the cutting lines 791, the end face 511 is formed.

The advantages of the above embodiment will be described below.

In the embodiment, the surface processing technique is employed to form the light shield layer 6'. With this technique, the light shield layer 6 covering the detector resin member 3 and the emitter resin member 4 can be obtained on the photointerrupter 100. Since the light shield layer 6 is formed by surface processing, the light shield layer 6 can be formed in a significantly reduced thickness compared with the nontransparent cap formed by resin molding according to the foregoing related art. It is because of employing the surface processing technique to form the light shield layer 6' that the light shield layer 6 can be formed in a thickness of 0.01 to 100 μm. Forming the light shield layer 6 in a reduced thickness allows the volume occupied with the light shield layer 6 to be reduced. Reducing thus the volume occupied with the light shield layer 6 allows the photointerrupter 100 to be manufactured in a smaller size.

The conventional method, by which a transparent resin (primary molding resin) is formed on a substrate by molding and then a light shielding resin (secondary molding resin) is formed on the transparent resin by molding, sufficient adhesion between the substrate and the secondary molding resin cannot be attained, and hence the secondary molding resin is prone to come off from the substrate or the primary molding resin. In the embodiment, in contrast, the light shield layer 6' is formed on the transparent resin (detector resin member 3' and emitter resin member 4') by surface processing. Such a process suppresses the light shield layer 6, which corresponds to the secondary molding resin, from coming off from the transparent resin, thereby improving the production yield. In the conventional configuration, for example the substrate is formed of a glass-epoxy resin, the primary molding resin is formed of an epoxy resin, and the secondary molding resin is formed of polyphenylene sulfide (PPS) or a liquid crystal polymer (LCP).

In the embodiment, the light shield layer 6 includes the base cover portion 63 that covers the base 1 and facing the clearance 59. Both the light output surface 48 and the light incident surface 38 are spaced from the base cover portion 63 in the thicknesswise direction Z of the base 1. Since the light shield layer 6 is sufficiently thin as stated above, naturally the base cover portion 63 is thin. Therefore, the configuration according to the embodiment allows a distance in the Z-direction between the light incident surface 38 and the base 1 to be reduced, while securing a sufficient distance in the Z-direction between the light incident surface 38 and the base cover portion 63. In other words, the size of the photointerrupter 100 in the Z-direction can be reduced, while securing a sufficient insertion margin for the shielding object 811. Likewise, the configuration according to the embodiment allows a distance in the Z-direction between the light output surface 48 and the base 1 to be reduced, while securing a sufficient distance in the Z-direction between the light output surface 48 and the base cover portion 63. In other words, the size of the photointerrupter 100 in the Z-direction can be reduced, while securing a sufficient insertion margin for the shielding object 811.

Securing a sufficient insertion margin for the shielding object 811 further assures that the infrared light L11 emitted from the light output surface 48 is prevented by the shielding object 811 from reaching the light incident surface 38. Therefore, the light receiving element 22 can be exempted from unduly receiving the infrared light L11 through the light incident surface 38, when the shielding object 811 is located between the light output surface 48 and the light incident surface 38. Such a configuration upgrades the detection accuracy of the photointerrupter 100.

In the embodiment, the detector resin member 3 includes the detector bulging portion 32 formed so as to protrude from the detector base body 31 toward the emitter resin member 4. The detector bulging portion 32 is formed so as to contact the base 1. With such a configuration, the light receiving element 22 can be covered with the detector base body 31 or the detector bulging portion 32. Accordingly, the light receiving element 22 can be located at a position closer to the emitter resin member 4. Therefore, the space in which the light receiving element 22 is to be located can be reduced on the X2-direction side on the base 1. In this case, the end portion of the base 1 on the X2-direction side can be brought closer to the emitter resin member 4. Such a configuration allows the size of the base 1 in the X-direction to be reduced, thereby contributing to reducing the size of the photointerrupter 100.

In the embodiment, the detector bulging portion front face 321 is inclined with respect to the thicknesswise direction Z of the base 1, such that a portion thereof farther from the base 1 is spaced farther from the emitter resin member 4. Accordingly, although the base portion of the detector bulging portion 32 bulges toward the emitter bulging portion 42 so as to reduce the distance therebetween, because of adopting the configuration in which the light receiving element 22 is covered with the detector base body 31 or the detector bulging portion 32, a sufficient distance can be secured on the Z1-direction side between the detector bulging portion front face 321 and the emitter resin member 4. Securing a sufficient distance between the detector bulging portion front face 321 and the emitter resin member 4 is advantageous because such a configuration allows the photointerrupter 100 to detect the presence of the shielding object 811 having a relatively large size in the X-direction.

In the embodiment, a part of the light shield layer 6' and a part of the detector protruding portion 34' are removed in the process of forming the light incident surface 38. Such a process is easier to perform because the object of removal is not limited to the light shield layer 6'. Likewise, a part of the light shield layer 6' and a part of the emitter protruding portion 44' are removed in the process of forming the light output surface 48. Such a process is easier to perform because the object of removal is not limited to the light shield layer 6'.

First Variation

Figure 26:
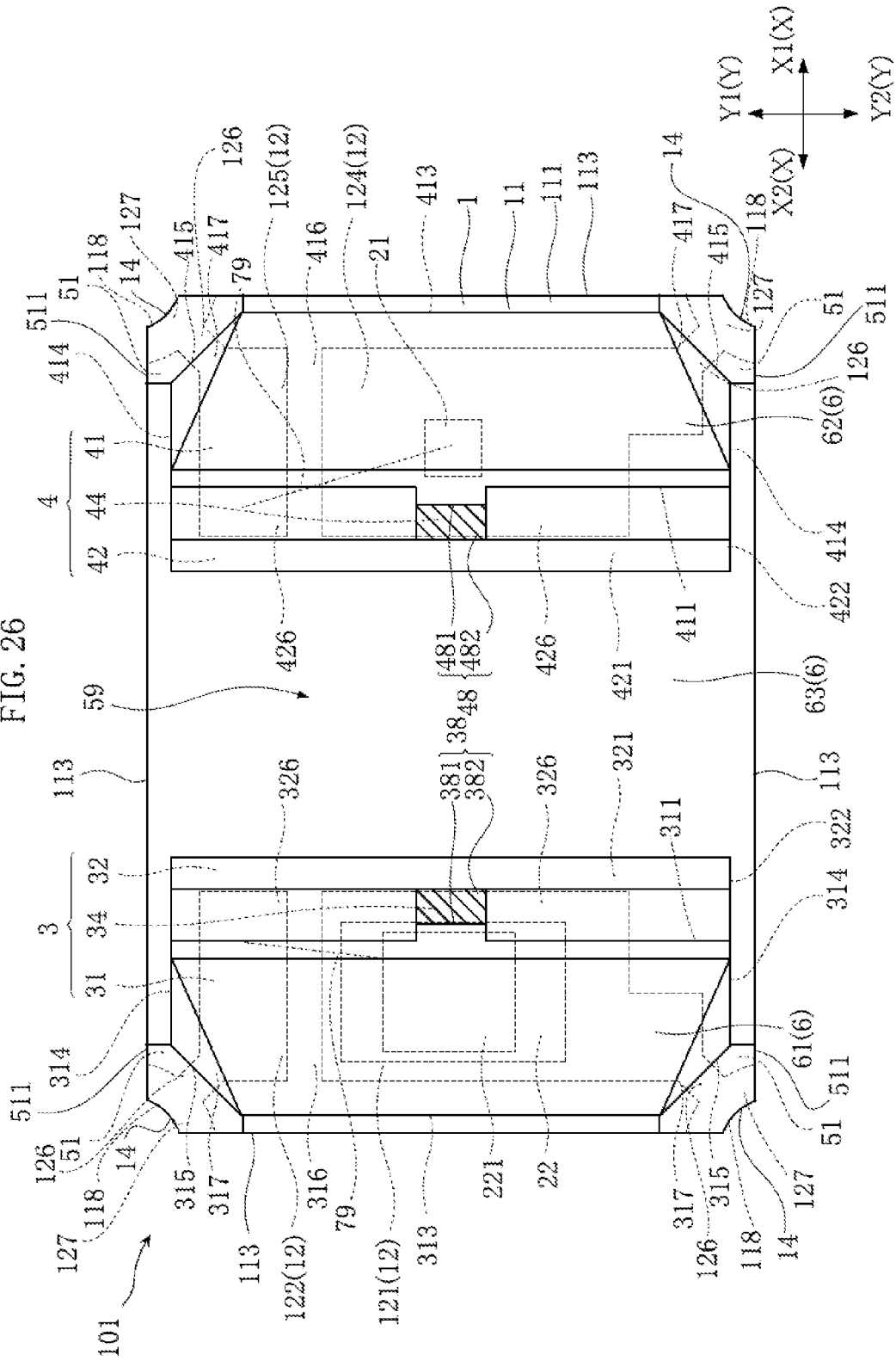
FIG. 26 is a plan view showing a photointerrupter according to a first variation of the first embodiment, with the interior partially visible.
Figure 27:
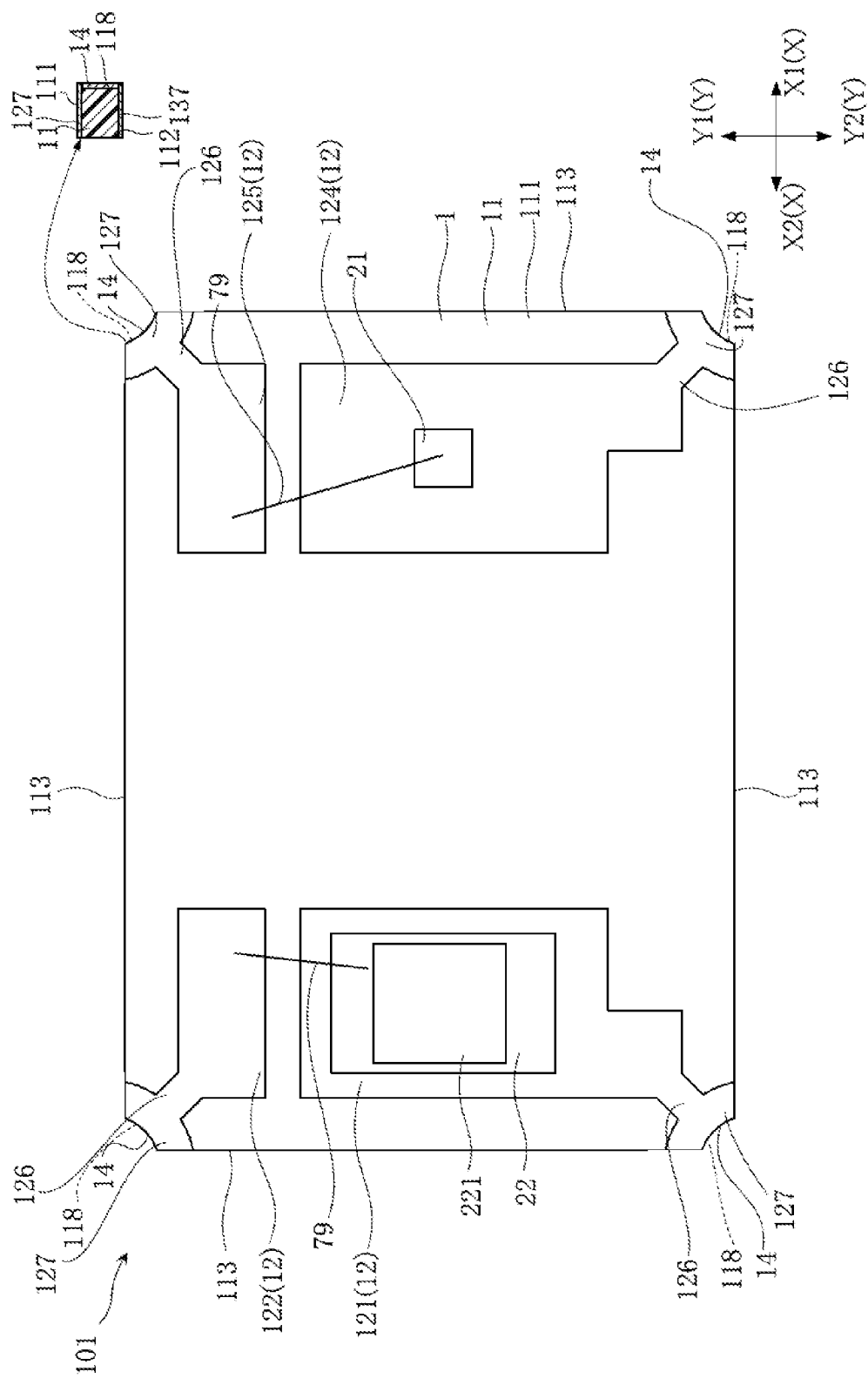
FIG. 27 is a simplified plan view of the photointerrupter shown in FIG. 26.
Figure 28:
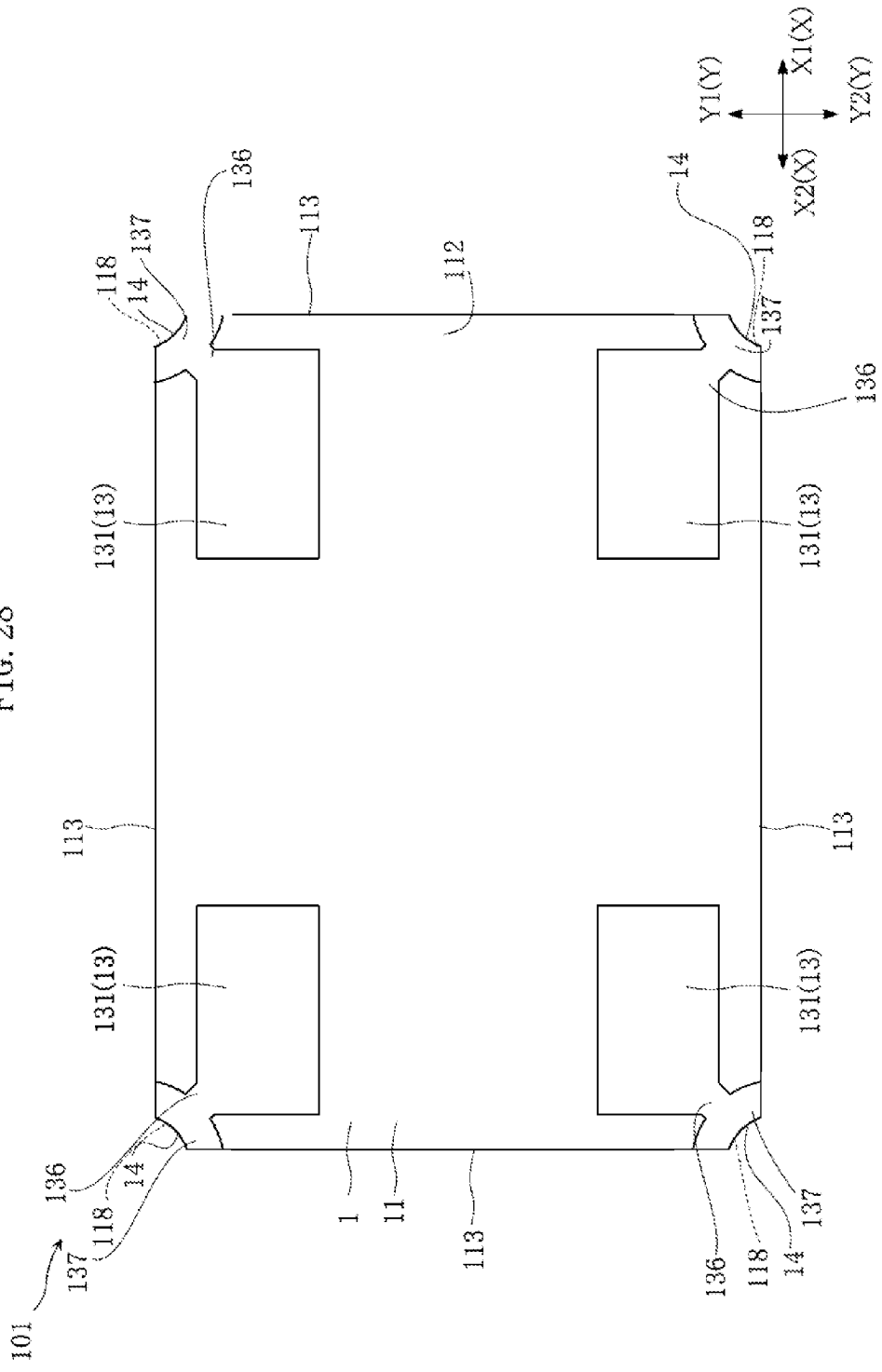
FIG. 28 is a bottom view of the photointerrupter shown in FIG. 26.

Referring now to FIGS. 26 to 28, a first variation of the embodiment will be described.

FIG. 26 is a plan view showing a photointerrupter according to a first variation of the first embodiment, with the interior partially visible. FIG. 27 is a plan view of the photointerrupter shown in FIG. 26, from which the detector resin member, the emitter resin member, the light shield layer, and the transmissive resin member are excluded. FIG. 28 is a bottom view of the photointerrupter shown in FIG. 26.

The photointerrupter 101 shown in those drawings includes the base 1, the light emitting element 21, the light receiving element 22, the detector resin member 3, the emitter resin member 4, the transmissive resin members 51, the light shield layer 6, and the plurality of wires 79. Except for the base 1 and the transmissive resin members 51, the configurations of the light emitting element 21, the light receiving element 22, the detector resin member 3, the emitter resin member 4, the light shield layer 6, and the plurality of wires 79 of the photointerrupter 101 are the same as those of the photointerrupter 100, and therefore the description thereof will not be repeated.

The base 1 includes the substrate 11, the main surface electrode 12, the back surface electrode 13, and the connection electrode 14.

The substrate 11 includes a plurality of corner grooves 118. Each of the corner grooves 118 is located at a corner of the substrate 11 when viewed through an X-Y plane. In other words, each corner groove 118 is located between two adjacent side faces 113.

As shown in FIGS. 25 and 27, the main surface electrode 12 further includes a plurality of connection wirings 126 and a plurality of quarter arc portions 127. Each of the quarter arc portions 127 is provided in the vicinity of a region on the main surface 111 connected to the corner groove 118. The connection wirings 126 are each formed in a strip shape, and each of the quarter arc portions 127 is connected to a corresponding one of the four pads (detector die pad 121, detector wire bonding pad 122, emitter die pad 124, emitter wire bonding pad 125) of the main surface electrode 12. The connection wirings 126 are formed so as to extend from the detector resin member 3 or the emitter resin member 4, when viewed through an X-Y plane.

As shown in FIG. 28, the back surface electrode 13 further includes a plurality of connection wirings 136 and a plurality of quarter arc portions 137. Each of the quarter arc portions 137 is provided in the vicinity of a region on the back surface 112 connected to the corner groove 118. The connection wirings 136 are each formed in a strip shape, and each of the quarter arc portions 137 is connected to a corresponding one of the four mounting pads 131.

In this variation, the connection electrodes 14 are not formed so as to penetrate through the substrate 11. Each of the connection electrodes 14 is formed in one of the corner grooves 118. Each of the connection electrodes 14 is connected to a corresponding one of the quarter arc portions 127 and a corresponding one of the quarter arc portions 137.

Each of the transmissive resin members 51 covers the connection wiring 126 and the quarter arc portion 127. In this variation also, the transmissive resin members 51 are covered with the light shield layer 6.

With the configuration according to this variation, the photointerrupter 101 can be manufactured in a reduced size, for the same reason as stated above regarding the photo interrupter 100.

In this variation, the light shield layer 6 includes the base cover portion 63 that covers the base 1 and facing the clearance 59. Both the light output surface 48 and the light incident surface 38 are spaced from the base cover portion 63 in the thicknesswise direction Z of the base 1. With such a configuration, the size of the photointerrupter 101 in the Z-direction can be reduced, for the same reason as stated above regarding the photointerrupter 100.

In this variation, the detector resin member 3 includes the detector bulging portion 32 formed so as to protrude from the detector base body 31 toward the emitter resin member 4. The detector bulging portion 32 is formed so as to contact the base 1. With such a configuration, the size of the photointerrupter 101 can be reduced, for the same reason as stated above regarding the photointerrupter 100.

In this variation, the detector bulging portion front face 321 is inclined with respect to the thicknesswise direction Z of the base 1, such that a portion thereof farther from the base 1 is spaced farther from the emitter resin member 4. Accordingly, although the base portion of the detector bulging portion 32 bulges toward the emitter bulging portion 42 so as to reduce the distance therebetween, because of adopting the configuration in which the light receiving element 22 is covered with the detector base body 31 or the detector bulging portion 32, a sufficient distance can be secured on the Z1-direction side between the detector bulging portion front face 321 and the emitter resin member 4. Securing a sufficient distance between the detector bulging portion front face 321 and the emitter resin member 4 is advantageous because such a configuration allows the photointerrupter 100 to detect the presence of the shielding object 811 having a relatively large size in the X-direction.

In this variation, a part of the light shield layer 6' and a part of the detector protruding portion 34' are removed in the process of forming the light incident surface 38. Such a process is easier to perform because the object of removal is not limited to the light shield layer 6'. Likewise, a part of the light shield layer 6' and a part of the emitter protruding portion 44' are removed in the process of forming the light output surface 48. Such a process is easier to perform because the object of removal is not limited to the light shield layer 6'.

Second Variation

Figure 29:
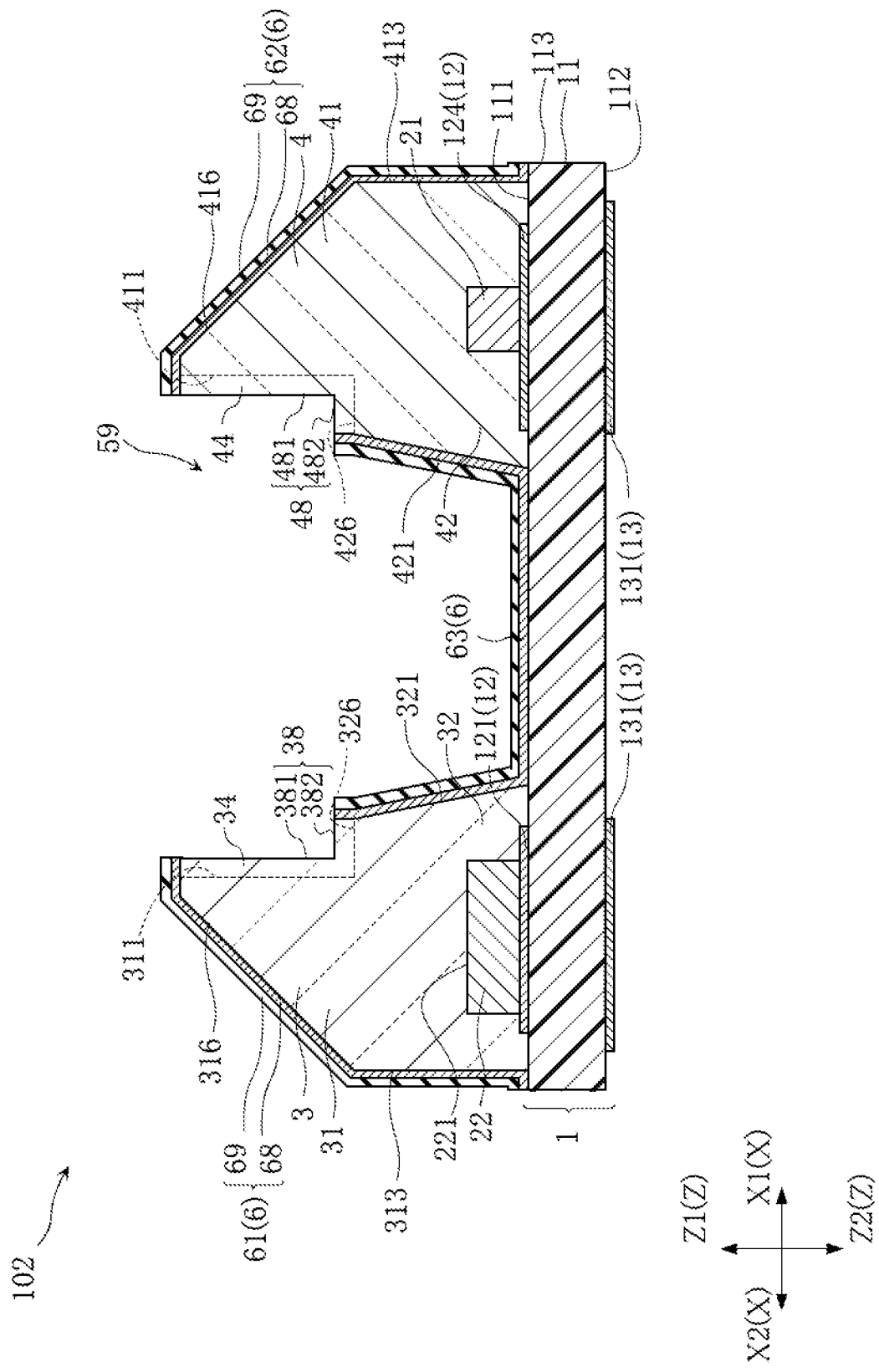
FIG. 29 is a sectional view of a photointerrupter according to a second variation of the first embodiment.

Referring to FIG. 29, a second variation of the embodiment will be described below.

FIG. 29 is a sectional view of a photointerrupter according to the second variation of the embodiment.

The photointerrupter 102 shown in FIG. 29 includes the base 1, the light emitting element 21, the light receiving element 22, the detector resin member 3, the emitter resin member 4, the transmissive resin members 51, the light shield layer 6, and the plurality of wires 79. Except for the light shield layer 6, the configurations of the base 1, the light emitting element 21, the light receiving element 22, the detector resin member 3, the emitter resin member 4, the light shield layer 6, the transmissive resin members 51, and the plurality of wires 79 of the photointerrupter 102 are the same as those of the photointerrupter 100, and therefore the description thereof will not be repeated.

The light shield layer 6 according to this variation has a bilayer structure, unlike in the photointerrupter 100. The light shield layer 6 according to this variation is configured similarly to that of the photointerrupter 100, except for having the bilayer structure.

The light shield layer 6 includes a first layer 68 and a second layer 69. The first layer 68 is formed so as to directly contact the detector resin member 3 and the emitter resin member 4. The first layer 68 is formed of a metal. Examples of the applicable metal include aluminum, silver, gold, copper, chrome, and tin. In the embodiment, the first layer 68 is formed of aluminum. The second layer 69 is formed over the first layer 68. In other words, the first layer 68 is interposed between the second layer 69 and the detector resin member 3 or the emitter resin member 4. The second layer 69 is formed on the oxide of the metal constituting the first layer 68. To form the light shield layer 6 thus configured, a metal layer is formed over the detector resin member 3 and the emitter resin member 4, for example by vapor deposition. Then the surface of the metal layer is oxidized. The light shield layer 6 including the first layer 68 and the second layer 69 can thus be obtained. Here, the second layer 69 may be formed of an insulating resin, instead of the oxide of the metal constituting the first layer 68.

With such a configuration, when the light emitted from the light emitting element 21 reaches the light shield layer 6 after passing through the emitter resin member 4 and then through the emitter base body front face 411 and the emitter base body outer faces 413, 414, 415, 416, 417, the light that has reached the light shield layer 6 is reflected by the first layer 68 which is formed of a metal. Then the light reflected by the first layer 68 again travels through the emitter resin member 4. Accordingly, the light that has reached the light shield layer 6 is barely absorbed by the light shield layer 6, and hence a larger amount of light can be conducted to the light output surface 48 out of the light emitted from the light emitting element 21. Conducting a larger amount of the light from the light emitting element 21 to the light output surface 48 contributes to minimizing malfunction of the photointerrupter 102.

Likewise, when the light incident into the detector resin member 3 through the light incident surface 38 reaches the light shield layer 6 after passing through the detector resin member 3 and then through the detector base body front face 311 and the detector base body outer faces 313, 314, 315, 316, 317, the light that has reached the light shield layer 6 is reflected by the first layer 68 which is formed of a metal. Then the light reflected by the first layer 68 again travels through the detector resin member 3. Accordingly, the light that has reached the light shield layer 6 is barely absorbed by the light shield layer 6, and hence a larger amount of light can be conducted to the light receiving element 22 out of the light incident on the light incident surface 38. Conducting a larger amount of the light incident on the light incident surface 38 to the light receiving element 22 contributes to minimizing malfunction of the photointerrupter 102.

Here, the configuration according to this variation may be applied to the photointerrupter 101 according to the first variation.

Figure 30:
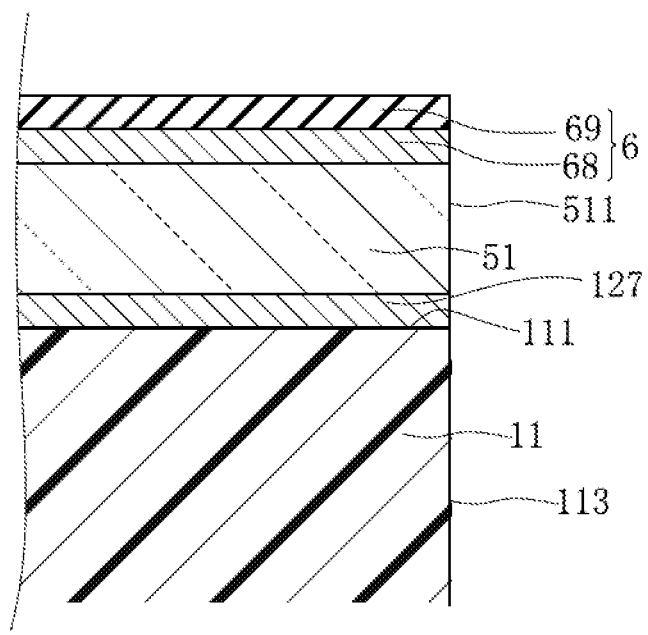
FIG. 30 is an enlarged fragmentary sectional view of the photointerrupter in which a feature of the second variation of the first embodiment and that of the first variation are combined.

FIG. 30 is an enlarged fragmentary sectional view of the photointerrupter 102 in which a feature of the second variation of the embodiment and that of the first variation thereof are combined. As shown in FIG. 30, the transmissive resin member 51 covers the quarter arc portion 127. Then the light shield layer 6 covers the transmissive resin member 51. In other words, the transmissive resin member 51 is interposed between the first layer 68 of the light shield layer 6 and the quarter arc portion 127. Since the transmissive resin member 51, which is insulative, is interposed between the first layer 68 and the quarter arc portion 127, which are both formed of a metal, electrical connection is not provided between the first layer 68 and the quarter arc portion 127. Such a configuration prevents any one of the quarter arc portions 127 and the others from being electrically connected via the first layer 68.

Third Variations

Figure 31:
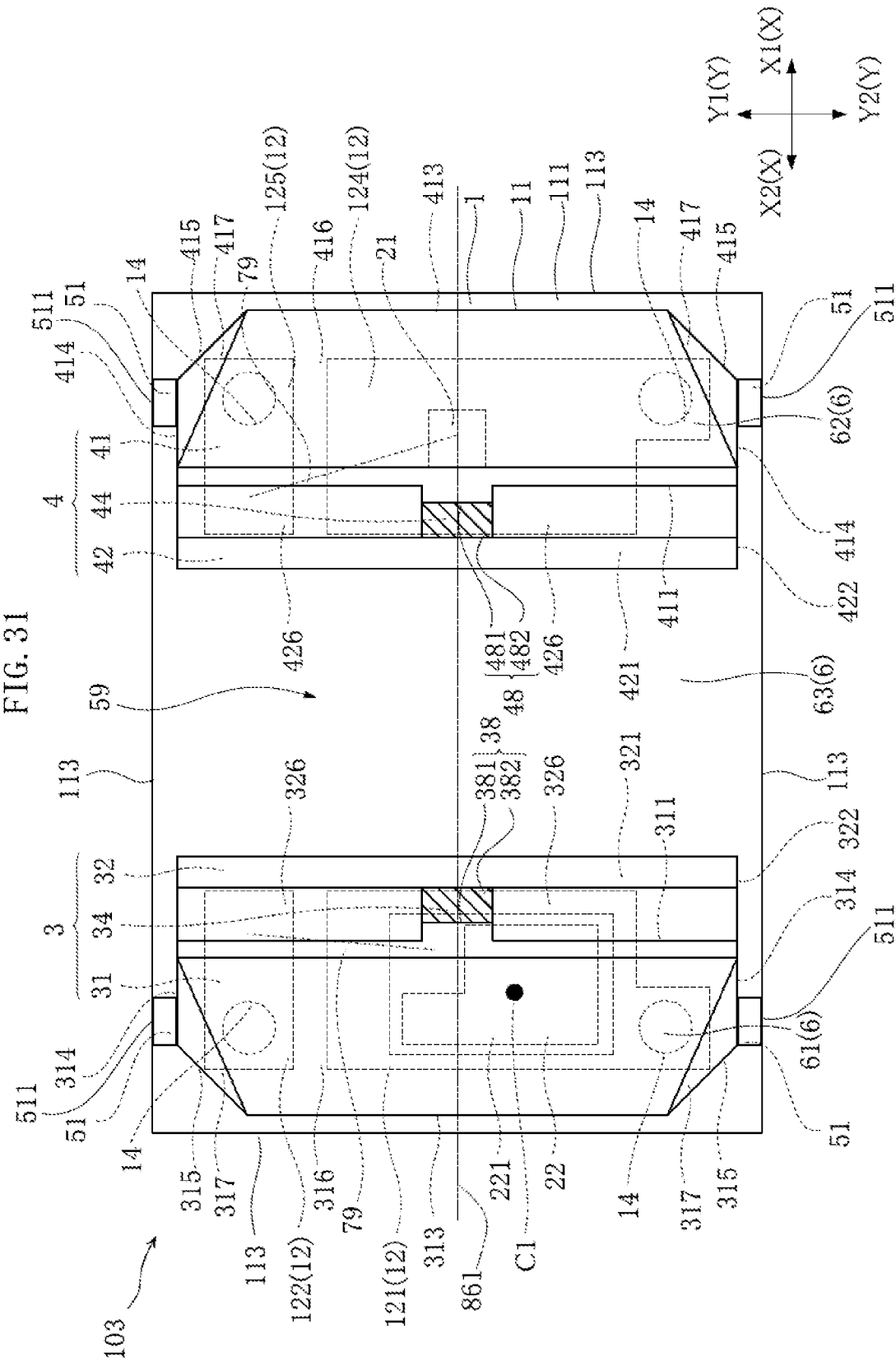
FIG. 31 is a plan view showing a photo interrupter according to a third variation of the first embodiment, with the interior partially visible.

Referring to FIG. 31, a third variation of the embodiment will be described.

FIG. 31 is a plan view showing a photointerrupter according to a third variation of the embodiment, with the interior partially visible.

The photointerrupter 103 shown in FIG. 31 is different from the photointerrupter 100 in that the center C1 of the light receiving surface 221 of the light receiving element 22 is deviated from a line 861 drawn between the light output surface 48 and the light incident surface 38. Such a configuration also provides the advantages noted above.

Here, the configuration according to this variation may be applied to the photointerrupters 101 and 102 explained above.

Fourth Variation

Figure 32:
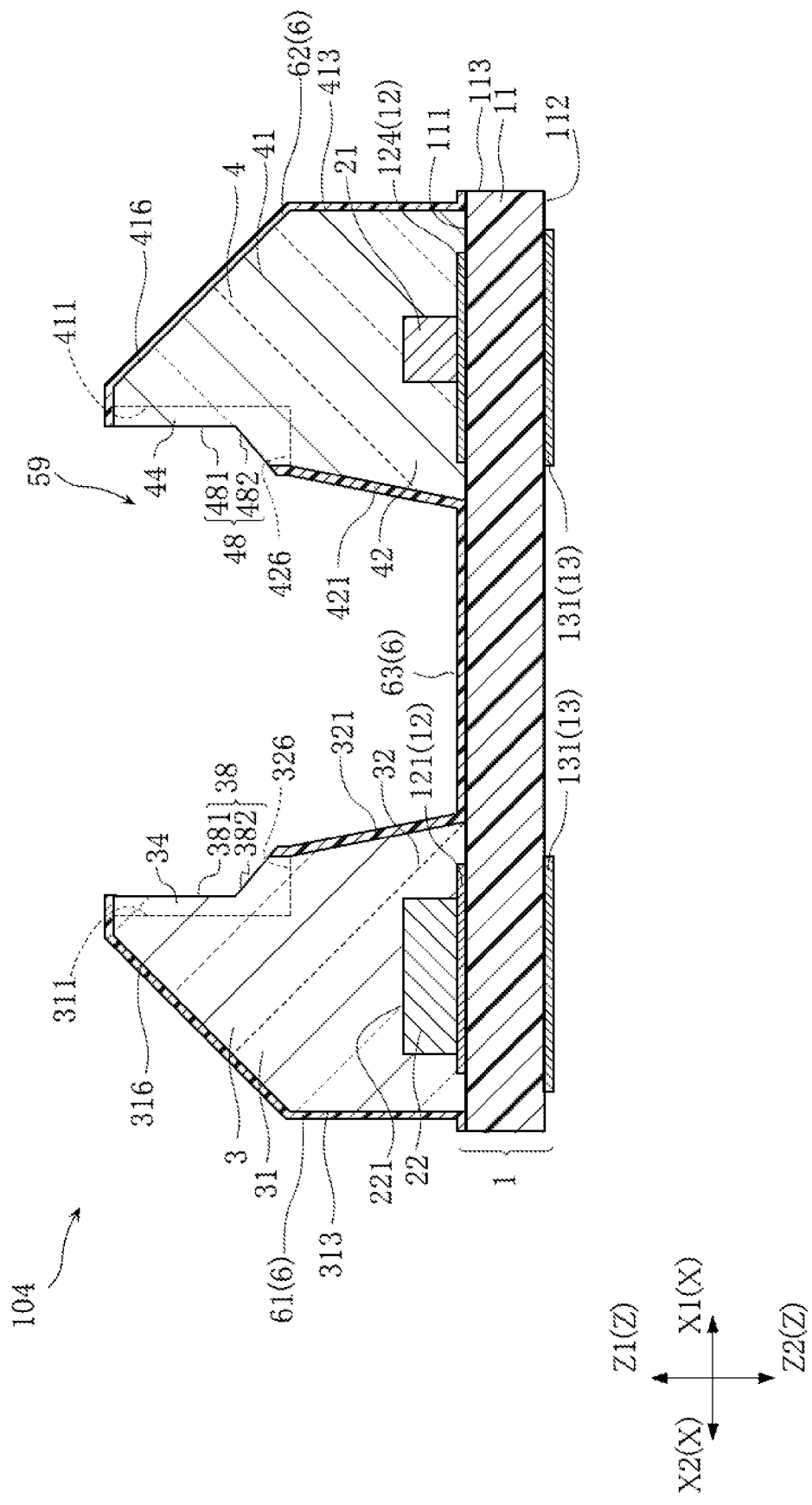
FIG. 32 is a sectional view of a photointerrupter according to a fourth variation of the first embodiment.

Referring to FIG. 32, a fourth variation of the embodiment will be described.

FIG. 32 is a sectional view of a photointerrupter according to a fourth variation of the embodiment.

The photointerrupter 104 shown in FIG. 32 is different from the photointerrupter 100 in the orientation of the second incident portion 382. In this variation, the second incident portion 382 is inclined with respect to the thicknesswise direction Z of the base 1 such that a portion thereof farther from the base 1 is spaced farther from the emitter resin member 4 (X2-direction side). Likewise, the second output portion 482 is inclined with respect to the thicknesswise direction Z of the base 1 such that a portion thereof farther from the base 1 is spaced farther from detector resin member 3 (X1-direction side). Such a configuration also provides the advantages noted above.

Here, the configuration according to this variation may be applied to the photointerrupters 101, 102, and 103.

Fifth Variation

Figure 33:
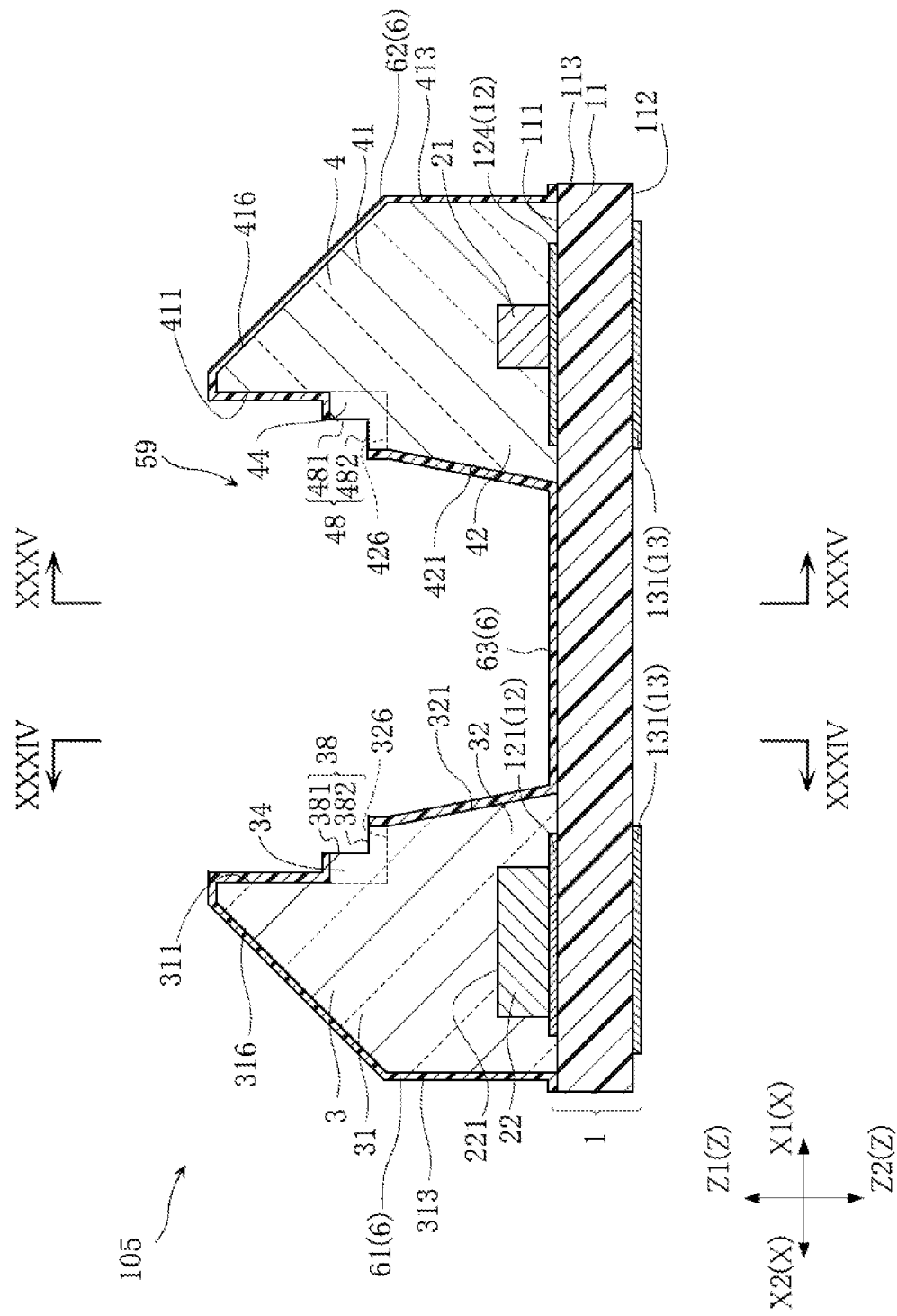
FIG. 33 is a sectional view of a photointerrupter according to a fifth variation of the first embodiment.
Figure 34:
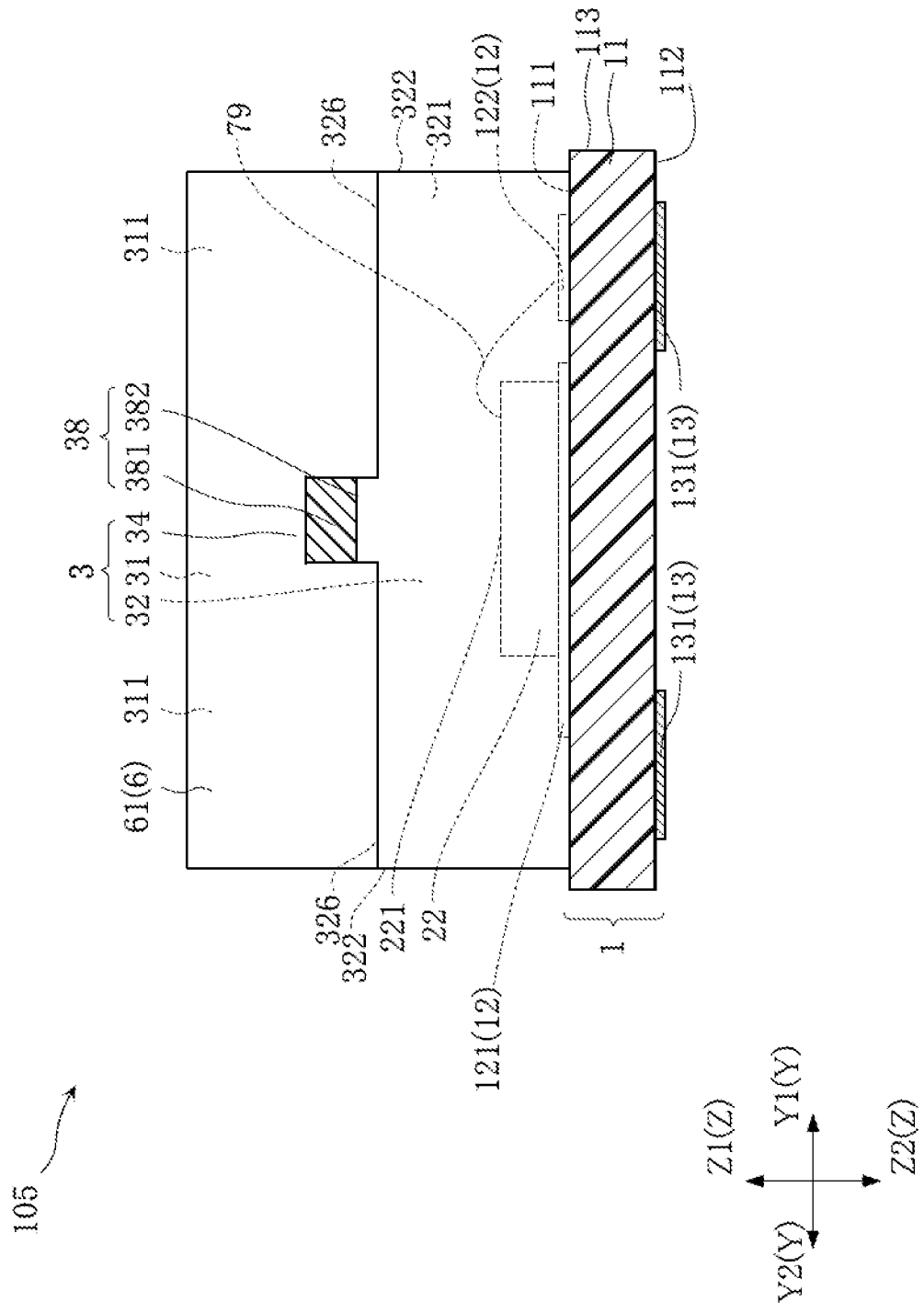
FIG. 34 is a sectional view taken along a line XXXIV-XXXIV in FIG. 33.
Figure 35:
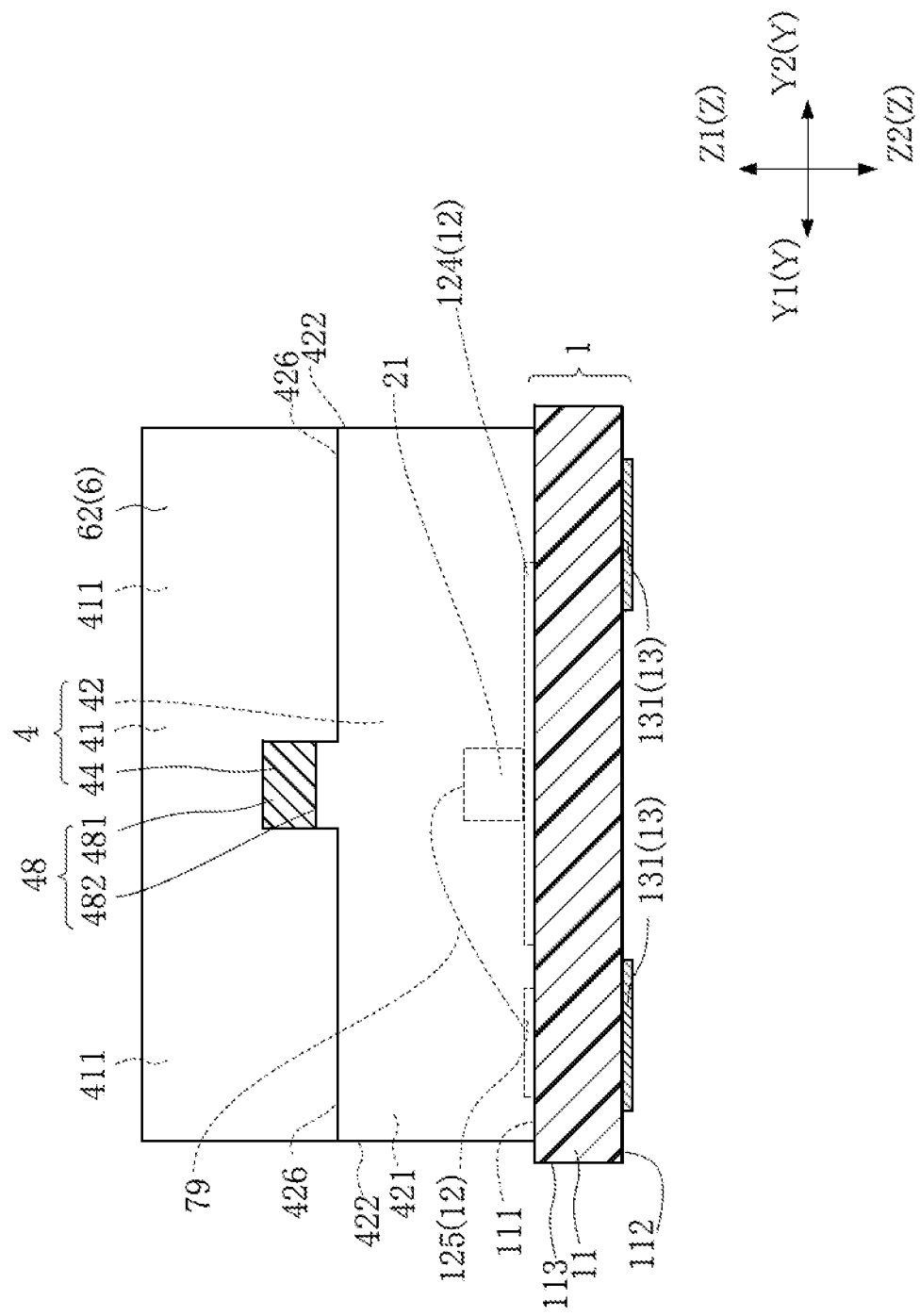
FIG. 35 is a sectional view taken along a line XXXV-XXXV in FIG. 33.

Referring to FIGS. 33 to 35, a fifth variation of the embodiment will be described.

FIG. 33 is a sectional view of a photointerrupter according to a fifth variation of the embodiment. FIG. 34 is a sectional view taken along a line XXXIV-XXXIV in FIG. 33. FIG. 35 is a sectional view taken along a line XXXV-XXXV in FIG. 33.

The photointerrupter 105 shown in those drawings includes the base 1, the light emitting element 21, the light receiving element 22, the detector resin member 3, the emitter resin member 4, the transmissive resin members 51, the light shield layer 6, and the plurality of wires 79. Except for the detector resin member 3 and the emitter resin member 4, the configurations of the base 1, the light emitting element 21, the light receiving element 22, the light shield layer 6, and the plurality of wires 79 of the photointerrupter 105 are the same as those of the photointerrupter 100, and therefore the description thereof will not be repeated.

The detector resin member 3 of the photointerrupter 105 is different from that of the photointerrupter 100 in that at least a part of the detector base body front face 311 includes a portion located farther from the base 1 than is the light incident surface 38. In this case, the portion to be removed from the detector protruding portion 34' can be reduced, when a part of the detector protruding portion 34' and a part of the light shield layer 6' are removed so as to form the light incident surface 38. Therefore, the time necessary for removing a part of the detector protruding portion 34' can be shortened.

Likewise, the emitter resin member 4 of the photointerrupter 105 is different from that of the photointerrupter 100 in that at least a part of the emitter base body front face 411 includes a portion located farther from the base 1 than is the light output surface 48. In this case, the portion to be removed from the emitter protruding portion 44' can be reduced, when a part of the emitter protruding portion 44' and a part of the light shield layer 6' are removed so as to form the light output surface 48. Therefore, the time necessary for removing a part of the emitter protruding portion 44' can be shortened.

Second Embodiment

A second embodiment of the present invention will be described below with reference to FIGS. 36 to 40.

Figure 36:
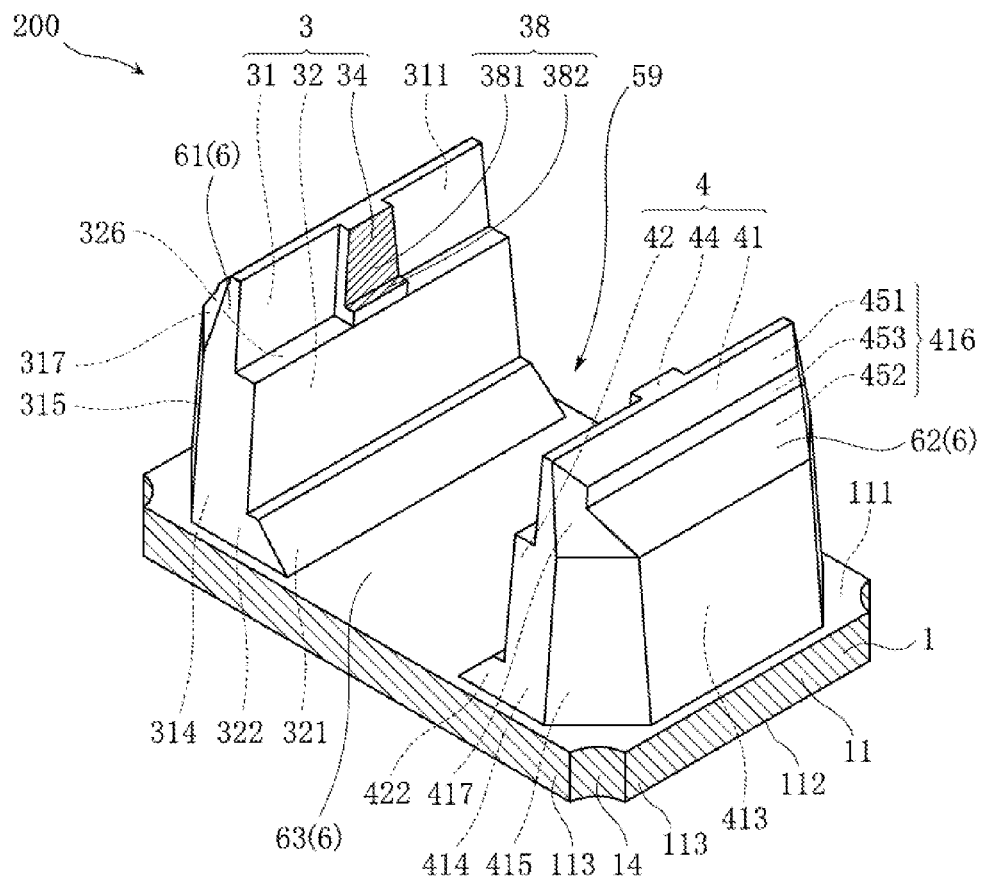
FIG. 36 is a perspective view showing a photointerrupter according to a second embodiment of the present invention.
Figure 37:
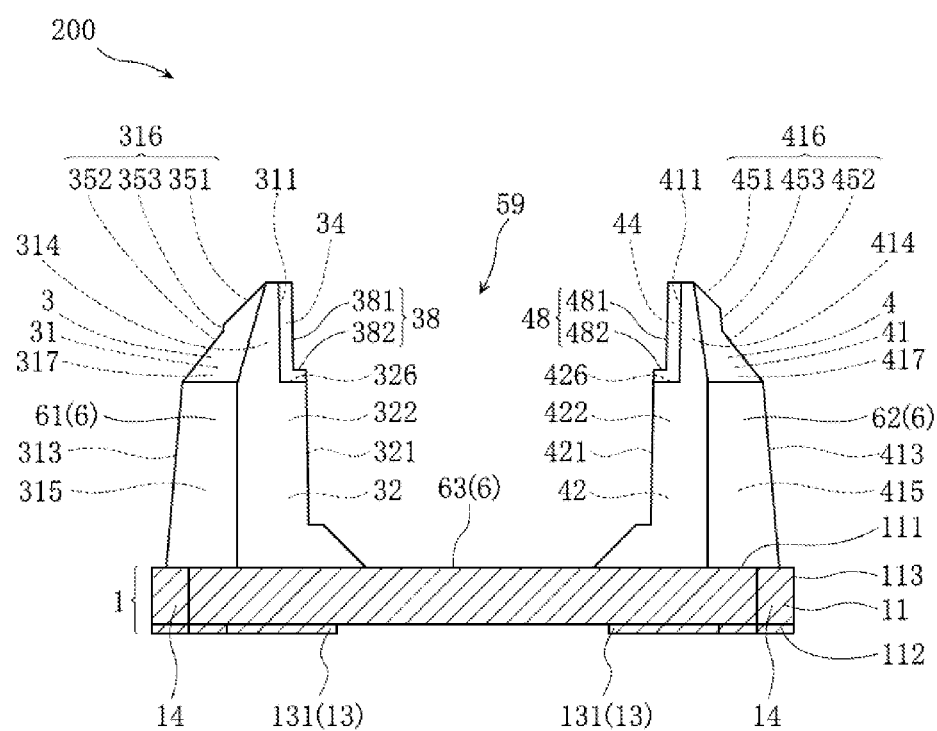
FIG. 37 is a front view showing the photointerrupter according to the second embodiment.
Figure 38:
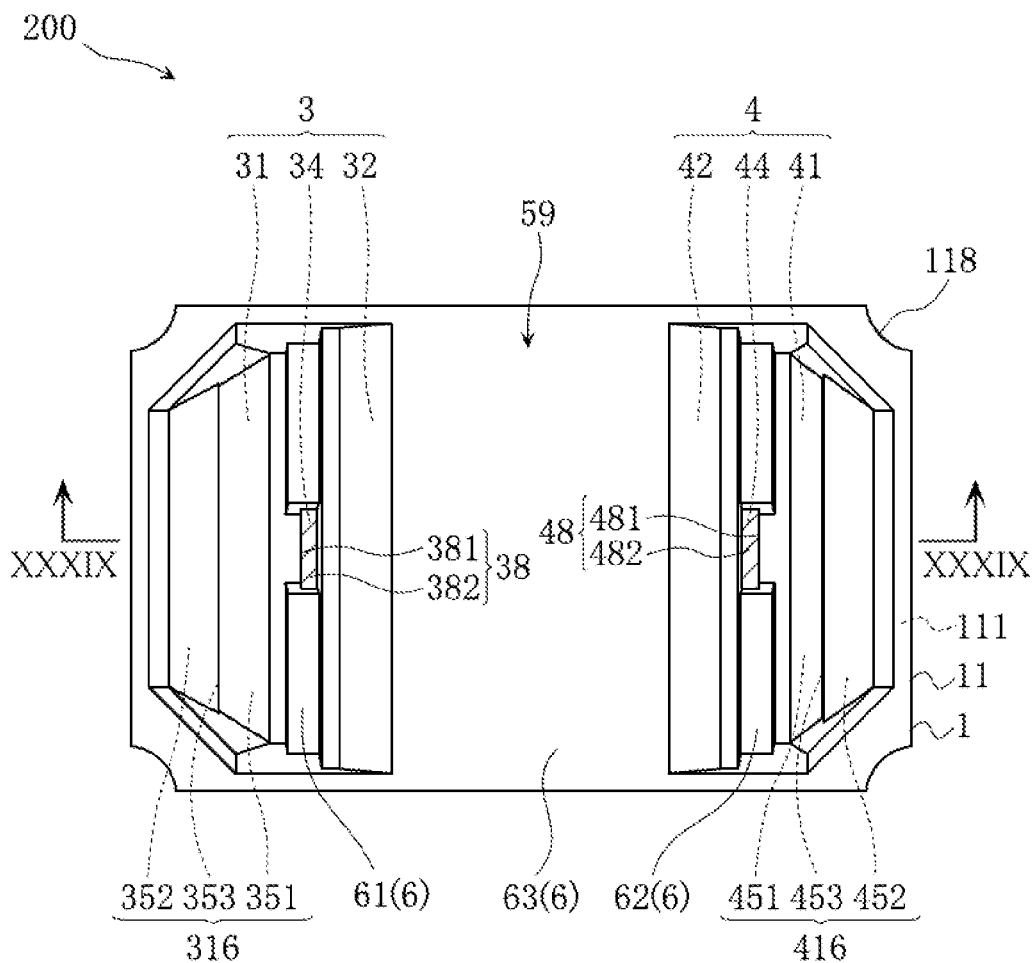
FIG. 38 is a plan view showing the photointerrupter according to the second embodiment.
Figure 39:
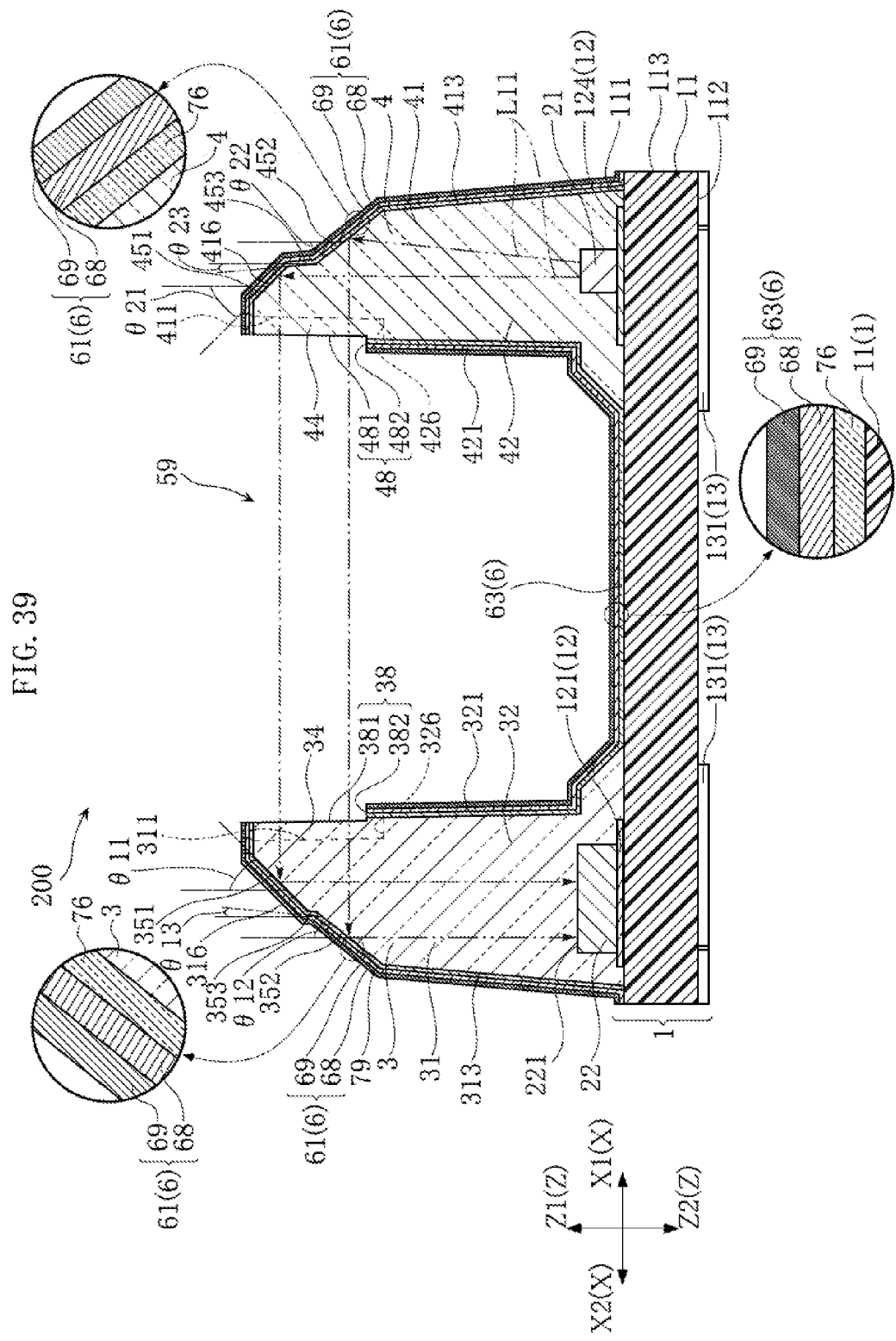
FIG. 39 is a sectional view taken along a line XXXIX-XXXIX in FIG. 38.

FIG. 36 is a perspective view showing a photointerrupter according to a second embodiment of the present invention. FIG. 37 is a front view showing the photointerrupter according to the second embodiment. FIG. 38 is a plan view showing the photointerrupter according to the second embodiment. FIG. 39 is a sectional view taken along a line XXXIX-XXXIX in FIG. 38.

The hatched portions in FIGS. 36 to 38 indicate exposed regions that are uncovered with the light shield layer 6, and the hatched portions in FIG. 39 indicate that the relevant portions are sectional views.

The photointerrupter 200 shown in those drawings includes the base 1, the light emitting element 21, the light receiving element 22, the detector resin member 3, the emitter resin member 4, the transmissive resin members 51 (not shown in the embodiment; see FIG. 26), the light shield layer 6, an undercoat layer 76 and the plurality of wires 79 (not shown in the embodiment; see FIG. 5). The photointerrupter 200 is different from photointerrupter 101 in including the undercoat layer 76. In addition, the photointerrupter 200 is different from photointerrupper 101 in the configuration of the detector base body outer face 316 of the detector resin member 3 and the emitter base body outer face 416 of the emitter resin member 4. Except for the detector resin member 3, emitter resin member 4, and the undercoat layer 76, the configurations of the base 1, the light emitting element 21, the light receiving element 22, the transmissive resin members 51, and the plurality of wires 79 of the photointerrupter 105 are the same as those of the photointerrupter 101, and therefore the description thereof will not be repeated. Further, the light shield layer 6 of the photointerrupter 105 is the same as that of the photointerrupter 102. Accordingly, the light shield layer 6 of the photointerrupter 200 includes the first layer 68 and the second layer 69.

The detector resin member 3 includes the detector base body 31, the detector bulging portion 32, and the detector protruding portion 34. The detector bulging portion 32 and the detector protruding portion 34 have the same configuration as those of the photointerrupter 100, and hence the description thereof will not be repeated.

In the embodiment also, the detector base body 31 includes the detector base body front face 311, and the detector base body outer faces 313, 314, 315, 316, and 317. Except for the detector base body outer face 316, the configurations of the detector base body front face 311 and the detector base body outer faces 313, 314, 315, and 317 of the photointerrupter 200 are the same as those of the photointerrupter 101, hence the photointerrupter 100, and therefore the description thereof will not be repeated.

The detector base body outer face 316 shown in FIGS. 38 and 39 constitutes a first detector base body outer face. As shown in FIG. 39, the light incident surface 38 is located between the detector base body outer face 316 and the light output surface 48. The detector base body outer face 316 includes a first detector sloped portion 351, a second detector sloped portion 352, and a detector intermediate portion 353.

The first detector sloped portion 351 and the second detector sloped portion 352 are respectively inclined with respect to the thicknesswise direction Z of the base 1. The first detector sloped portion 351 is located farther from the base 1 than is the second detector sloped portion 352. In other words, the second detector sloped portion 352 is located between the first detector sloped portion 351 and the base 1 in the thicknesswise direction Z of the base 1. As shown in FIG. 38, the first detector sloped portion 351 is located between the second detector sloped portion 352 and the light incident surface 38, in a plan view from above the base 1. An angle θ11 defined between the first detector sloped portion 351 and the thicknesswise direction Z is larger than an angle θ12 defined between the second detector sloped portion 352 and the thicknesswise direction Z. Preferably, the angle θ11 defined between the first detector sloped portion 351 and the thicknesswise direction Z may be not smaller than 40° and not larger than 50°. Preferably, the angle θ12 defined between the second detector sloped portion 352 and the thicknesswise direction Z may be not smaller than 35° and not larger than 45°. The angles θ11, θ12 may be determined through simulation performed before manufacturing the photointerrupter 200.

The detector intermediate portion 353 is located between the first detector sloped portion 351 and the second detector sloped portion 352. The detector intermediate portion 353 is formed so as to continuously extend from the first detector sloped portion 351 and the second detector sloped portion 352. An angle θ13 defined between the detector intermediate portion 353 and the thicknesswise direction Z of the base 1 is smaller than the angle θ12 defined between the second emitter sloped portion 352 and the thicknesswise direction Z. Preferably, angle θ13 defined between the detector intermediate portion 353 and the thicknesswise direction Z of the base 1 may be not smaller than 0° and not larger than 10°. Thus, the detector intermediate portion 353 is barely inclined with respect to the thicknesswise direction Z of the base 1, though slightly inclined with respect thereto. Such slight inclination of the detector intermediate portion 353 with respect to the thicknesswise direction Z of the base 1 facilitates a die for forming the detector resin member 3' to be removed therefrom.

The emitter resin member 4 includes the emitter base body 41, the emitter bulging portion 42, and the emitter protruding portion 44. The emitter bulging portion 42 and the emitter protruding portion 44 have the same configuration as those of the photointerrupter 101, hence the photointerrupter 100, and therefore the description thereof will not be repeated.

In the embodiment also, the emitter base body 41 includes the emitter base body front face 411 and the emitter base body outer faces 413, 414, 415, 416, and 417. Except for the emitter base body outer face 416, the configurations of the emitter base body front face 411 and the emitter base body outer faces 413, 414, 415, and 417 of the photointerrupter 200 are the same as those of the photointerrupter 101, hence the photointerrupter 100, and therefore the description thereof will not be repeated.

The emitter base body outer face 416 shown in FIGS. 38 and 39 constitutes a first emitter base body outer face. The light output surface 48 is located between the emitter base body outer face 416 and the light incident surface 38. The emitter base body outer face 416 includes a first emitter sloped portion 451, the second emitter sloped portion 452, and the emitter intermediate portion 453.

The first emitter sloped portion 451 and the second emitter sloped portion 452 are respectively inclined with respect to the thicknesswise direction Z of the base 1. The first emitter sloped portion 451 is located farther from the base 1 than is the second emitter sloped portion 452. In other words, the second emitter sloped portion 452 is located between the first emitter sloped portion 451 and the base 1 in the thicknesswise direction Z of the base 1. As shown in FIG. 38, the first emitter sloped portion 451 is located between the second emitter sloped portion 452 and the light output surface 48, in a plan view from above the base 1. An angle θ21 defined between the first emitter sloped portion 451 and the thicknesswise direction Z is larger than an angle θ22 defined between the second emitter sloped portion 452 and the thicknesswise direction Z. Preferably, the angle θ21 defined between the first emitter sloped portion 451 and the thicknesswise direction Z may be not smaller than 40° and not larger than 50°. Preferably, the angle θ22 defined between the second emitter sloped portion 452 and the thicknesswise direction Z may be not smaller than 35° and not larger than 45°. The angles θ21, θ22 may be determined through simulation performed before manufacturing the photointerrupter 200.

The emitter intermediate portion 453 is located between the first emitter sloped portion 451 and the second emitter sloped portion 452. The emitter intermediate portion 453 is formed so as to continuously extend from the first emitter sloped portion 451 and the second emitter sloped portion 452. An angle θ23 defined between the emitter intermediate portion 453 and the thicknesswise direction Z of the base 1 is smaller than the angle θ22 defined between the second emitter sloped portion 452 and the thicknesswise direction Z. Preferably, angle θ23 defined between the emitter intermediate portion 453 and the thicknesswise direction Z of the base 1 may be not smaller than 0° and not larger than 10°. Thus, the emitter intermediate portion 453 is barely inclined with respect to the thicknesswise direction Z of the base 1, though slightly inclined with respect thereto. Such slight inclination of the emitter intermediate portion 453 with respect to the thicknesswise direction Z of the base 1 facilitates a die for forming the emitter resin member 4' to be removed therefrom.

The undercoat layer 76 is interposed between the light shield layer 6 and at least one of the detector resin member 3 and the emitter resin member 4. The undercoat layer 76 may be interposed only between the detector resin member 3 and the light shield layer 6 or only between the emitter resin member 4 and the light shield layer 6. In the embodiment, the undercoat layer 76 is provided both between the detector resin member 3 and the light shield layer 6 and between the emitter resin member 4 and the light shield layer 6. More specifically, the undercoat layer 76 is interposed between the detector base body outer face 316 and the light shield layer 6. In addition, the undercoat layer 76 is formed so as to contact the detector base body outer face 316 and the light shield layer 6. In the embodiment, the undercoat layer 76 covers the detector base body outer face 316. In the embodiment, further, the undercoat layer 76 covers the entirety of the detector resin member 3, except for the light incident surface 38 and the portion disposed in contact with the base 1. Likewise, the undercoat layer 76 is interposed between the emitter base body outer face 416 and the light shield layer 6. In addition, the undercoat layer 76 is formed so as to contact the emitter base body outer face 416 and the light shield layer 6. In the embodiment, the undercoat layer 76 covers the emitter base body outer face 416. In the embodiment, further, the undercoat layer 76 covers the entirety of the emitter resin member 4, except for the light output surface 48 and the portion disposed in contact with the base 1. The undercoat layer 76 also covers the base 1. The undercoat layer 76 has a thickness of, for example, 3 to 30 µm.

The undercoat layer 76 is light-transmissive. In other words, the undercoat layer 76 is formed of a material that transmits light. Preferably, the undercoat layer 76 is formed of a transparent resin. Examples of the applicable transparent resin include a silicon-based resin, polyester, and acrylic urethane. To form the undercoat layer 76, surface processing is performed before forming the light shield layer 6'. Examples of the applicable surface processing technique include dip coating, spin coating, and spraying the material that forms the undercoat layer 76.

The first layer 68 and the second layer 69 of the light shield layer 6 are respectively formed of the material cited with reference to the photointerrupter 102. Accordingly, the undercoat layer 76 is interposed between the first layer 68 and at least one of the detector resin member 3 and the emitter resin member 4. In addition, the undercoat layer 76 is formed so as to directly contact the first layer 68 and at least one of the detector resin member 3 and the emitter resin member 4.

The advantages of the second embodiment will be described below.

Figure 40:
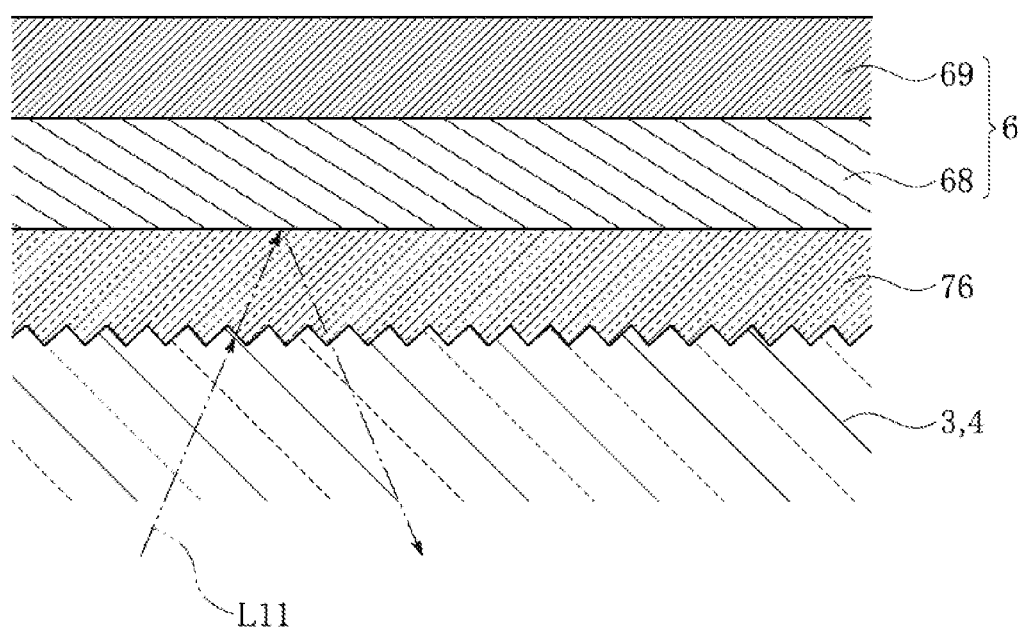
FIG. 40 is an enlarged fragmentary sectional view of the photointerrupter shown in FIG. 39.

FIG. 40 is an enlarged fragmentary sectional view of the photointerrupter shown in FIG. 39. The surface of the emitter resin member 4 (in the embodiment, interface between the emitter resin member 4 and the undercoat layer 76) is often rough. However, the undercoat layer 46 is formed by surface processing. Accordingly, the surface of the undercoat layer 76 (in the embodiment, interface between the undercoat layer 76 and the light shield layer 6) becomes smoother than the surface of the emitter resin member 4.

In the embodiment the undercoat layer 76 of the photointerrupter 200 is light-transmissive. The undercoat layer 76 is interposed between the light shield layer 6 and at least one of the detector resin member 3 and the emitter resin member 4. Here, it will be assumed that the undercoat layer 76 is interposed between the light shield layer 6 and the emitter resin member 4. Since the undercoat layer 76 is light-transmissive, in the case where the undercoat layer 76 is interposed between the light shield layer 6 and the emitter resin member 4 the infrared light L11 passes through the interface between the emitter resin member 4 and the undercoat layer 76, thus to be incident into the undercoat layer 76. Accordingly, in the photointerrupter 200 the infrared light L11 is prevented from being reflected by the surface of the emitter resin member 4 which is rough.

The infrared light L11 thus incident into the undercoat layer 76 is reflected at the interface between the undercoat layer 76 and the light shield layer 6. The infrared light L11 reflected at the interface between the undercoat layer 76 and the light shield layer 6 passes through interface between the undercoat layer 76 and the emitter resin member 4, thus to be again incident into the emitter resin member 4. Accordingly, the photointerrupter 200 allows the infrared light L11 to be reflected by the surface of the undercoat layer 76 which is smoother.

As described above, since the photointerrupter 200 allows the infrared light L11 to be reflected by the smoother surface, diffuse reflection of the infrared light L11 can be suppressed. Therefore, the infrared light L11 can be conducted in a desired direction.

Although the foregoing description refers to the case where the undercoat layer 76 is interposed between the light shield layer 6 and the emitter resin member 4, the same advantage can be enjoyed by interposing the undercoat layer 76 between the light shield layer 6 and the detector resin member 3.

In the embodiment, the emitter resin member 4 includes the emitter base body 41 formed so as to contact the base 1. The emitter base body 41 includes the emitter base body outer face 416. The light output surface 48 is located between the emitter base body outer face 416 and the light incident surface 38. The undercoat layer 76 covers the emitter base body outer face 416. Such a configuration allows the infrared light L11 emitted from the light emitting element 21 to be reflected at the interface between the light shield layer 6 and the undercoat layer 76 covering the emitter base body outer face 416, while suppressing diffuse reflection of the infrared light L11 at the surface of the emitter base body outer face 416. Accordingly, the infrared light L11 emitted from the light emitting element 21 can be more efficiently conducted to the light output surface 48, so that the light receiving element 22 may receive a larger amount of infrared light L11 from the light emitting element 21. Therefore, the presence or absence of the shielding object 811 can be more accurately detected.

In the embodiment, the detector resin member 3 includes a detector base body 31 formed so as to contact the base 1. The detector base body 31 includes the detector base body outer face 316. The light incident surface 38 is located between the detector base body outer face 316 and the light output surface 48. The undercoat layer 76 covers the detector base body outer face 316. Such a configuration allows the infrared light L11 to be reflected at the interface between the light shield layer 6 and the undercoat layer 76 covering the detector base body outer face 316, while suppressing diffuse reflection of the infrared light L11 at the surface of the detector base body outer face 316. Accordingly, the infrared light L11 emitted from the light emitting element 21 and incident into the light incident surface 38 can be more efficiently conducted to the light receiving element 22, so that the light receiving element 22 may receive a larger amount of infrared light L11 from the light emitting element 21. Therefore, the presence or absence of the shielding object 811 can be more accurately detected.

In the embodiment, the emitter base body outer face 416 includes the first emitter sloped portion 451 and the second emitter sloped portion 452, respectively inclined with respect to the thicknesswise direction Z of the base 1. The first emitter sloped portion 451 is located farther from the base 1 than is the second emitter sloped portion 452, and located between the second emitter sloped portion 452 and the light output surface 48 in a plan view from above the base 1. The angle θ21 defined between the first emitter sloped portion 451 and the thicknesswise direction Z is larger than the angle θ22 defined between the second emitter sloped portion 452 and the thicknesswise direction Z. Thus, the inclination of the sloped portions of the emitter base body outer face 416 with respect to the thicknesswise direction Z can be adjusted such that a larger amount of infrared light L11 is made incident into the light incident surface 38, out of the infrared light L11 that has reached the emitter base body outer face 416 from the light emitting element 21. Accordingly, the light receiving element 22 can receive a larger amount of infrared light L11 from the light emitting element 21, and resultantly the presence or absence of the shielding object 811 can be more accurately detected.

In the embodiment, the emitter base body outer face 416 includes the emitter intermediate portion 453 formed so as to continuously extend from the first emitter sloped portion 451 and the second emitter sloped portion 452. The emitter intermediate portion 453 is located between the first emitter sloped portion 451 and the second emitter sloped portion 452. The angle θ23 defined between the emitter intermediate portion 453 and the thicknesswise direction Z is smaller than the angle θ22 defined between the second emitter sloped portion 452 and the thicknesswise direction Z. Such a configuration reduces the size of the emitter base body outer face 416 in the X-direction.

In the embodiment, the detector base body outer face 316 includes the first detector sloped portion 351 and the second detector sloped portion 352, respectively inclined with respect to the thicknesswise direction Z of the base 1. The first detector sloped portion 351 is located farther from the base 1 than is the second detector sloped portion 352, and located between the second detector sloped portion 352 and the light incident surface 38 in a plan view from above the base 1. The angle θ11 defined between the first detector sloped portion 351 and the thicknesswise direction Z is larger than the angle θ12 defined between the second detector sloped portion 352 and the thicknesswise direction Z. Thus, the inclination of the sloped portions of the detector base body outer face 316 with respect to the thicknesswise direction Z can be adjusted such that a larger amount of infrared light L11 is made incident into the light receiving element 22, out of the infrared light L11 that has reached the detector base body outer face 316 after entering the detector resin member 3 through the light incident surface 38. Accordingly, the light receiving element 22 can receive a larger amount of infrared light L11 from the light emitting element 21, and resultantly the presence or absence of the shielding object 811 can be more accurately detected.

In the embodiment, the detector base body outer face 316 includes the detector intermediate portion 353 formed so as to continuously extend from the first detector sloped portion 351 and the second detector sloped portion 352. The detector intermediate portion 353 is located between the first detector sloped portion 351 and the second detector sloped portion 352. The angle θ13 defined between the detector intermediate portion 353 and the thicknesswise direction Z is smaller than the angle θ12 defined between the second detector sloped portion 352 and the thicknesswise direction Z. Such a configuration reduces the size of the detector base body outer face 316 in the X-direction.

The foregoing configuration according to the embodiment provides the same advantages as described with the photointerrupters 100, 101, and 102.

First Variation

Figure 41:
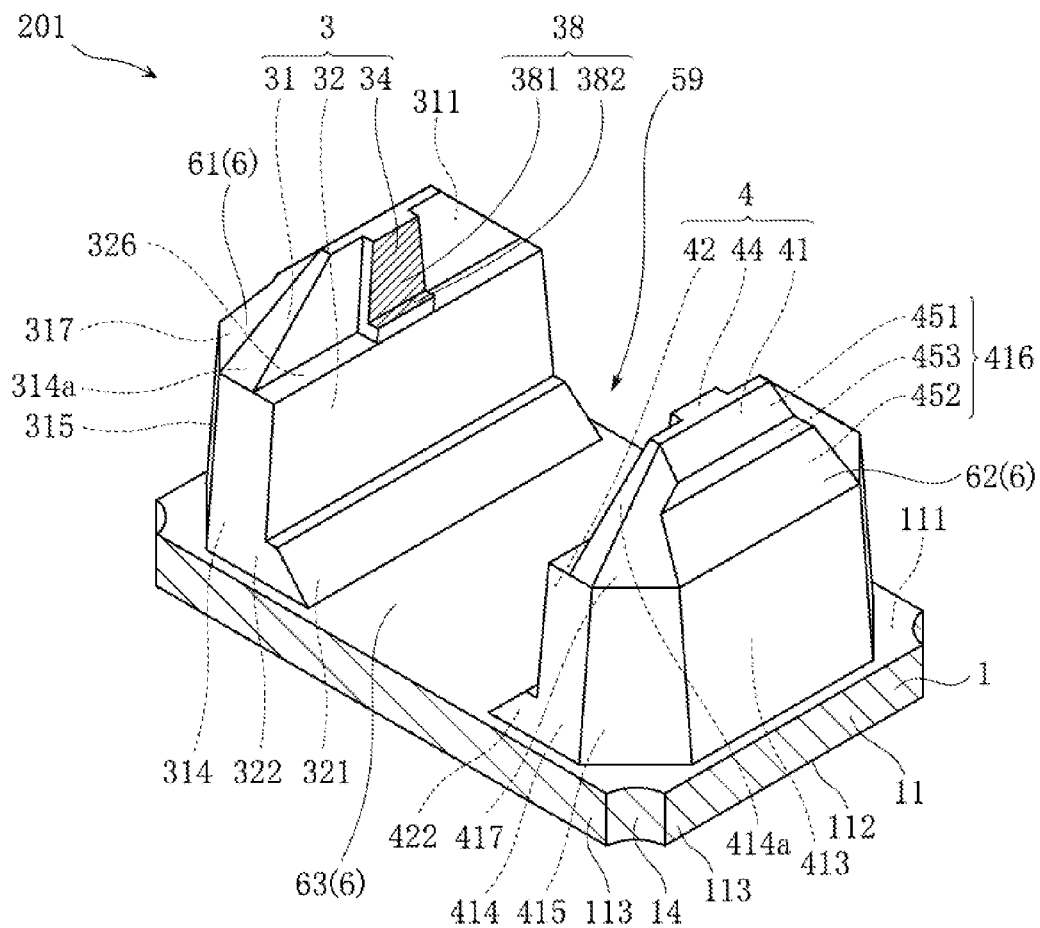
FIG. 41 is a perspective view showing a photointerrupter according to a first variation of the second embodiment.
Figure 43:
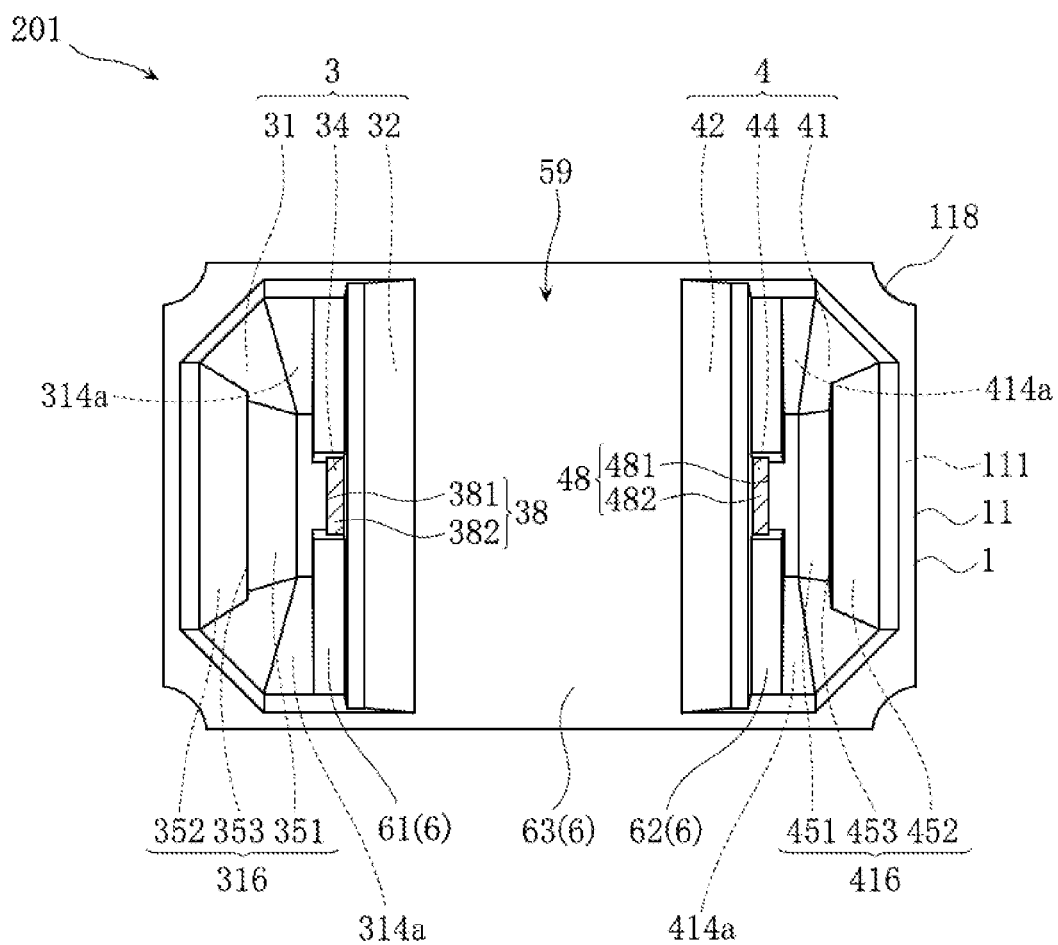
FIG. 43 is a plan view showing the photointerrupter according to the first variation of the second embodiment.

Referring to FIGS. 41 to 43, a first variation of the second embodiment will be described below.

FIG. 41 is a perspective view showing a photointerrupter 201 according to a first variation of the second embodiment. FIG. 42 is a front view showing the photointerrupter 201 according to the first variation of the second embodiment. FIG. 43 is a plan view showing the photointerrupter 201 according to the first variation of the second embodiment.

In this variation, the detector base body outer faces 314 each include a sloped surface 314a. The sloped surfaces 314a are located, in a plan view from above the base 1, on the respective sides of the light receiving element 22 in the Y-direction orthogonal to both the X-direction in which the detector resin member 3 and the emitter resin member 4 are spaced from each other and the thicknesswise direction Z of the base 1. The sloped surfaces 314a are inclined with respect to the thicknesswise direction Z of the base 1. To be more detailed, each of the sloped surfaces 314a is inclined with respect to the thicknesswise direction Z of the base 1 such that a portion thereof farther from the base 1 comes closer to the light incident surface 38 in a plan view from above the base 1.

In this variation, the emitter base body outer faces 414 each include a sloped surface 414a. The sloped surfaces 414a are located, in a plan view from above the base 1, on the respective sides of the light emitting element 21 in the Y-direction orthogonal to both the X-direction in which the detector resin member 3 and the emitter resin member 4 are spaced from each other and the thicknesswise direction Z of the base 1. The sloped surfaces 414a are inclined with respect to the thicknesswise direction Z of the base 1. To be more detailed, each of the sloped surfaces 414a is inclined with respect to the thicknesswise direction Z of the base 1 such that a portion thereof farther from the base 1 comes closer to the light output surface 48 in a plan view from above the base 1.

Except for the aforementioned aspect, the photointerrupter 201 has the same configuration as that of the photointerrupter 200.

In the photointerrupter 201 thus configured, the sloped surface 414a allows a larger amount of infrared light L11 from the emitting element 21 to be directed to the light incident surface 38 through the light output surface 48. In addition, the sloped surface 314a allows a larger amount of infrared light L11 incident on the light incident surface 38 to be directed to the light receiving element 22. Such a configuration further upgrades the detection accuracy of the presence or absence of the shielding object 811.

Third Embodiment

A third embodiment of the present invention will be described below with reference to FIGS. 44 to 49.

Figure 46:
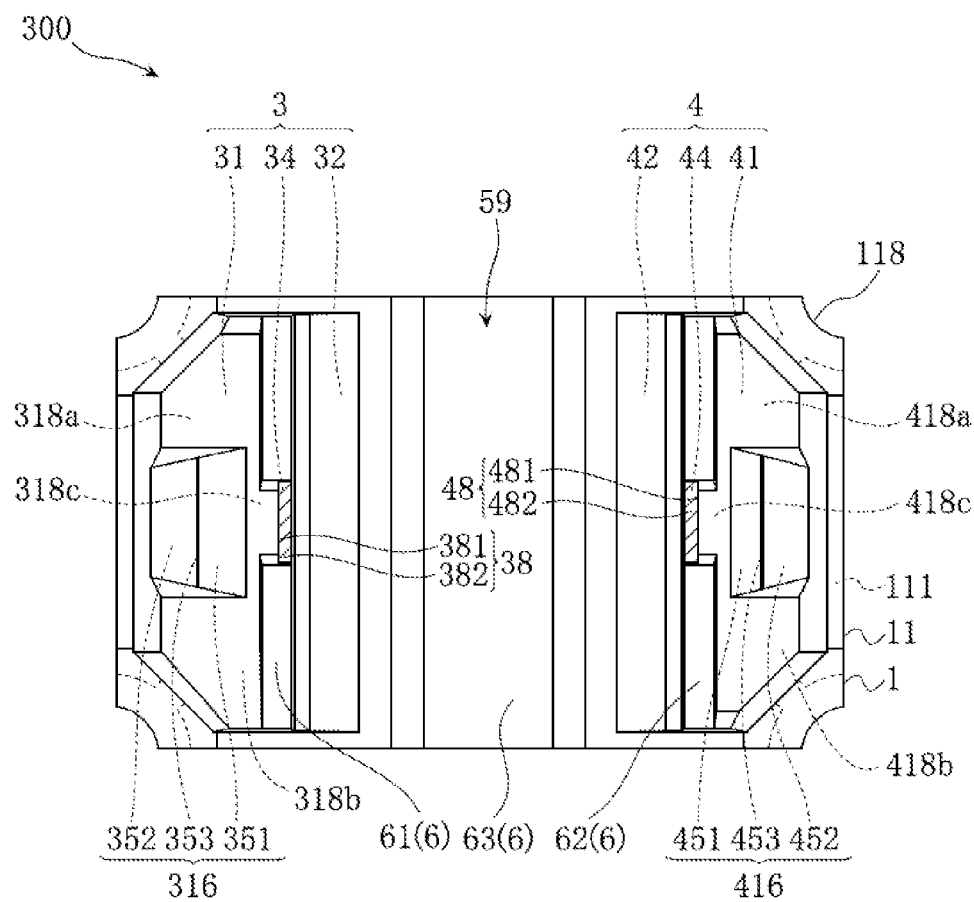
FIG. 46 is a plan view showing the photointerrupter according to the third embodiment.
Figure 47:
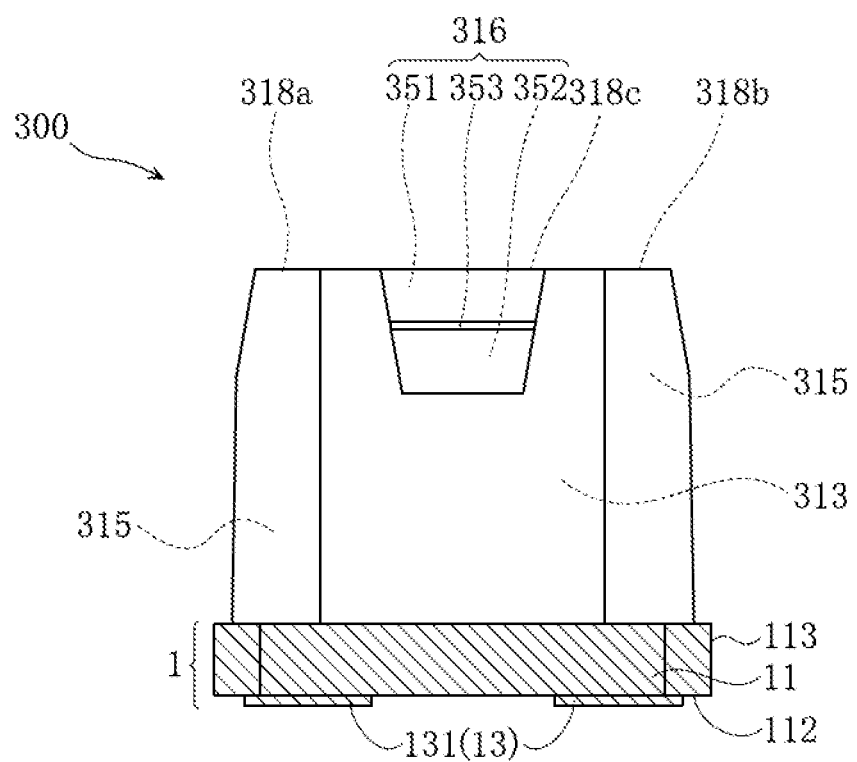
FIG. 47 is a left side view of the photointerrupter shown in FIG. 45.

FIG. 44 is a perspective view showing a photointerrupter according to a third embodiment of the present invention. FIG. 45 is a front view showing the photointerrupter according to the third embodiment. FIG. 46 is a plan view showing the photointerrupter according to the third embodiment. FIG. 47 is a left side view of the photointerrupter shown in FIG. 45. FIG. 48 is a right side view of the photointerrupter shown in FIG. 45. The hatched portions in FIGS. 44 to 48 indicate regions exposed from the light shield layer 6.

The photointerrupter 300 shown in those drawings includes the base 1, the light emitting element 21, the light receiving element 22, the detector resin member 3, the emitter resin member 4, the transmissive resin members 51 (not shown in the embodiment; see FIG. 26), the light shield layer 6, the undercoat layer 76, and the plurality of wires 79 (not shown in the embodiment; see FIG. 5). The photointerrupter 300 is different from photointerrupter 200 in the configuration of the detector resin member 3 and the emitter resin member 4. Except for the detector resin member 3 and the emitter resin member 4, the configurations of the base 1, the light emitting element 21, the light receiving element 22, the transmissive resin members 51, the light shield layer 6, the undercoat layer 76, and the plurality of wires 79 of the photointerrupter 300 are the same as those of the photointerrupter 200, and therefore the description thereof will not be repeated.

The detector resin member 3 includes the detector base body 31, the detector bulging portion 32, and the detector protruding portion 34. The detector bulging portion 32 and the detector protruding portion 34 have the same configuration as those of the photointerrupter 200, and hence the description thereof will not be repeated.

In this embodiment, the detector base body 31 includes the detector base body front face 311, the detector base body outer faces 313, 314, 315, 316, a first detector top face 318a, a second detector top face 318b, and a detector intermediate face 318c. The configurations of the detector base body front face 311 and the detector base body outer faces 313, 314, 315, 316 are the same as those of the photointerrupter 200, and therefore the description thereof will not be repeated.

The first detector top face 318a and the second detector top face 318b are arranged to face away from the base 1 (i.e., in the Z1-direction). In the detector resin member 3, the first detector top face 318a and the second detector top face 318b are disposed at the farthest position from the base 1. The first detector top face 318a and the second detector top face 318b are spaced apart from each other in the Y-direction. As shown in FIG. 46, the detector base body outer face 316 (first detector base body outer face) is disposed between the first detector top face 318a and the second detector top face 318b, as viewed in the thickness direction Z of the base 1 (i.e., in plan of the base 1). Each of the first detector top face 318a and the second detector top face 318b is flat, and these two top faces 318a, 318b are flush with each other (i.e., contained in the same flat plane).

The first detector top face 318a and the second detector top face 318b are connected to the detector base body outer faces 311, 313, 314.

The detector intermediate face 318c connects the first and the second detector top faces 318a, 318b to each other. The detector intermediate face 318c is connected to the detector base body outer face 316. The detector intermediate face 318c is disposed between the detector base body outer face 316 and the light incident surface 38, as viewed in the Z-direction. The detector intermediate face 318c is flat. In the present embodiment, the detector intermediate face 318c is flush with the first and the second detector top faces 318a, 318b.

The minimum size L33 of the detector intermediate face 318c in the X-direction is smaller than both the size L31 of the first detector top face 318a in the X-direction and the size L32 of the second detector top face 318b in the X-direction.

In the present embodiment again, the emitter base body 41 includes the emitter base body front face 411, the emitter base body outer faces 413, 414, 415, 416, the first emitter top face 418a, the second emitter top face 418b, and the emitter intermediate face 418c. The configurations of the emitter base body front face 411 and the emitter base body outer faces 413, 414, 415, 416 of the emitter base body 41 are the same as those of the photointerrupter 200, and therefore the description thereof will not be repeated.

The first emitter top face 418a and the second emitter top face 418b are arranged to face away from the base 1 (i.e., in the Z1-direction). In the emitter resin member 4, the first emitter top face 418a and the second emitter top face 418b are disposed at the farthest position from the base 1. The first emitter top face 418a and the second emitter top face 418b are spaced apart from each other in the Y-direction. As shown in FIG. 46, the emitter base body outer face 416 (first emitter base body outer face) is disposed between the first emitter top face 418a and the second emitter top face 418b, as viewed in the thickness direction Z of the base 1 (i.e., in plan of the base 1). Each of the first emitter top face 418a and the second emitter top face 418b is flat, and these two top faces 418a, 418b are flush with each other (i.e., contained in the same plane). Further, the first and the second emitter top faces 418a, 418b are flush with the first and the second detector top faces 318a, 318b.

The first emitter top face 418a and the second emitter top face 418b are connected to the emitter base body outer faces 411, 413, 414.

The emitter intermediate face 418c connects the first and the second emitter top faces 418a, 418b to each other. The emitter intermediate face 418c is connected to the emitter base body outer face 416. The emitter intermediate face 418c is disposed between the emitter base body outer face 416 and the light output surface 48, as viewed in the Z-direction. The emitter intermediate face 418c is flat. In the present embodiment, the emitter intermediate face 418c is flush with the first and the second emitter top faces 418a, 418b.

The minimum size L43 of the emitter intermediate face 418c in the X-direction is smaller than both the size L41 of the first emitter top face 418a in the X-direction and the size L42 of the second emitter top face 418b in the X-direction.

Figure 49:
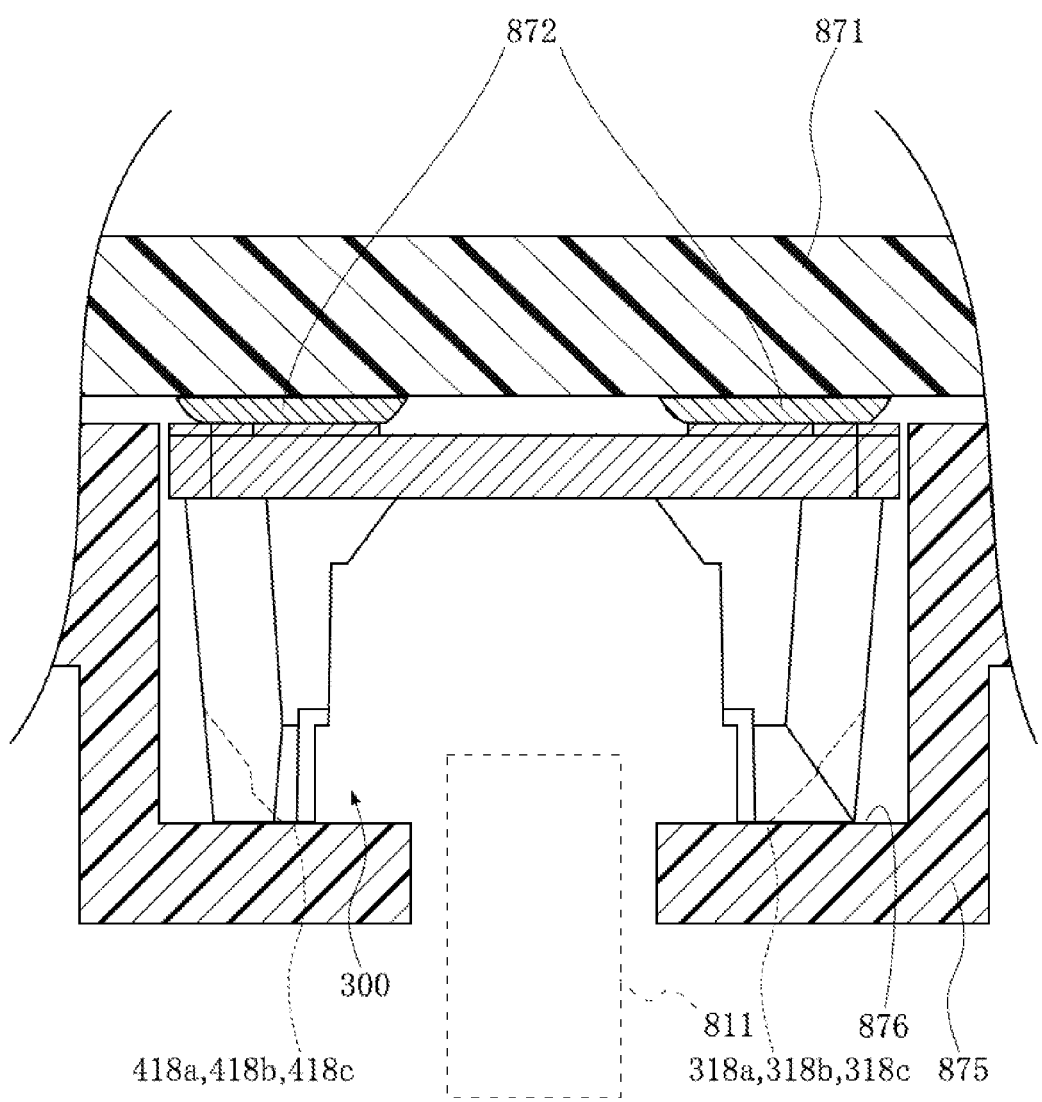
FIG. 49 is a sectional view showing a mounting structure of the photointerrupter according to the third embodiment of the present invention.

As shown in FIG. 49, first the photointerrupter 300 is attached to the mounting board 871, and then set in a recess of a part 875. In the present embodiment, the mounting board 871 is a flexible substrate. When the photointerrupter 300 is set in the recess of the part 875, the first detector top face 318a, the second detector top face 318b, the first emitter top face 418a and the second emitter top face 418ab are pressed onto the surface 876 of the part 875. In this manner, the photointerrupter 300 is fixed to the part 875.

The advantages of the third embodiment will be described below.

According to the third embodiment, the following advantages can be enjoyed in addition to the above-noted advantages by the photointerrupter 200.

The present embodiment has the following features. The first and the second detector top faces 318a, 318b are arranged to face away from the base 1. The detector intermediate face 318c connects the first and the second detector top faces 318a, 318b to each other. The first and the second detector top faces 318a, 318b are spaced apart from each other in the Y-direction. The minimum size L33 of the detector intermediate face 318c in the X-direction is smaller than each of the size L31 of the first detector top face 318a in the X-direction and the size L32 of the second detector top face 318b in the X-direction. Advantageously, these features increase the mechanical strength of upper portions of the detector resin member 3 that are provided on the Z1-direction side. Thus, it is possible to prevent the first detector top face 318a, the second detector top face 318b and nearby portions of the detector resin member 3 from breaking when the top faces 318a, 318b are pressed onto the surface 876 of the part 875.

In the present embodiment, the detector base body outer face 316 is inclined with respect to the thickness direction Z of the base 1 so as to become closer to the emitter resin member 4 as proceeding away from the base 1. As viewed in the thickness direction Z of the base 1, the detector base body outer face 316 is disposed between the first detector top face 318a and the second detector top face 318b. With these arrangements, it is possible to cause a greater amount of infrared light L11 from the light emitting element 21 to reach the light receiving element 22, and also to prevent the breakage of the first detector top face 318a, the second detector top face 318b and nearby portions of the detector resin member 3.

The present embodiment also has the following features. The first and the second emitter top faces 418a, 418b are arranged to face away from the base 1. The emitter intermediate face 418c connects the first and the second emitter top faces 418a, 418b to each other. The first and the second emitter top faces 418a, 418b are spaced apart from each other in the Y-direction. The minimum size L43 of the emitter intermediate face 418c in the X-direction is smaller than each of the size L41 of the first emitter top face 418a in the X-direction and the size L42 of the second emitter top face 418b in the X-direction. Advantageously, these features increase the mechanical strength of upper portions of the emitter resin member 4 that are provided on the Z1-direction side. Thus, it is possible to prevent the first emitter top face 418a, the second emitter top face 418b and nearby portions of the emitter resin member 4 from breaking when the top faces 418a, 418b are pressed onto the surface 876 of the part 875.

In the present embodiment, the emitter base body outer face 416 is inclined with respect to the thickness direction Z of the base 1 so as to become closer to the detector resin member 3 as proceeding away from the base 1. As viewed in the thickness direction Z of the base 1, the emitter base body outer face 416 is disposed between the first emitter top face 418a and the second emitter top face 418b. With these arrangements, it is possible to cause a greater amount of infrared light L11 from the light emitting element 21 to reach the light receiving element 22, and also to prevent the breakage of the first emitter top face 418a, the second emitter top face 418b and nearby portions of the emitter resin member 4.

In the present embodiment, the first and the second detector top faces 318a, 318b and the first and the second emitter top faces 418a, 418b are flush with each other, i.e., contained in the same plane. With this arrangement, the four top faces 318a, 318b, 418a and 418b can easily be brought into contact with the surface 876 of the part 875, assuming that the surface 876 is flat. Accordingly, the photointerrupter 300 can be fixed to the part 875.

The present invention is in no way limited to the foregoing embodiments. Specific configuration of the constituents of the present invention may be modified in various manners. To cite a few examples, the detector protruding portion 34 may be excluded from the detector resin member 3. In this case, the detector base body front face 311 serves as the light incident surface. The emitter protruding portion 44 may be excluded from the emitter resin member 4. In this case, the emitter base body front face 411 serves as the light output surface. Such a configuration in which the detector resin member 3 does not include the detector protruding portion 34 or the emitter resin member 4 does not include the emitter protruding portion 44 may be adopted, for example, in the case where the jig 887 (see FIG. 23) is employed for forming the light output surface 48.

The invention claimed is:

1. A photointerrupter comprising:
a base;
a light emitting element provided on the base;
a light receiving element provided on the base;
a light-transmissive detector resin member covering the light receiving element;
a light-transmissive emitter resin member covering the light emitting element; and
a light shield layer covering the detector resin member and the emitter resin member;
wherein the emitter resin member is spaced apart from the detector resin member in a first direction with a clearance between the emitter resin member and the detector resin member,
wherein the detector resin member includes a light incidence surface exposed from the light shield layer, the emitter resin member includes a light output surface exposed from the light shield layer, and each of the light incidence surface and the light output surface faces the clearance, and
wherein the light shield layer includes a base cover portion that covers the base and faces the clearance, and the base cover portion is smaller than at least one of the light emitting element and the light receiving element in size measured in a thickness direction of the base.

2. The photointerrupter according to claim 1, wherein the light shield layer has a thickness of 0.01-100 μm.

3. The photointerrupter according to claim 1, wherein each of the light output surface and the light incidence surface is spaced apart from the base cover portion in a thickness direction of the base.

4. The photointerrupter according to claim 1, wherein the detector resin member includes a detector base body covering the light receiving element, the detector base body being in contact with the base.

5. The photointerrupter according to claim 4, wherein the detector resin member includes a detector bulging portion protruding from the detector base body toward the emitter resin member, the detector bulging portion being in contact with the base.

6. The photointerrupter according to claim 5, wherein the detector bulging portion is greater in size than the light receiving element in a second direction perpendicular to both the first direction and a thickness direction of the base.

7. The photointerrupter according to claim 5, wherein the detector bulging portion includes a detector bulging portion front face that faces the emitter resin member.

8. The photointerrupter according to claim 7, wherein the detector bulging portion front face is so inclined with respect to a thickness direction of the base as to become farther from the emitter resin member as proceeding away from the base.

9. The photointerrupter according to claim 7, wherein the detector resin member includes a detector protruding portion protruding from the detector base body toward the emitter resin member,
wherein the detector protruding portion provides the light incidence surface,
wherein the detector bulging portion includes a detector connecting face connected to both the detector bulging portion front face and the detector base body,
wherein the detector protruding portion protrudes from the detector connecting face.

10. The photointerrupter according to claim 4, wherein the detector resin member includes a detector protruding portion protruding from the detector base body toward the emitter resin member,
wherein the detector protruding portion provides the light incidence surface.

11. The photointerrupter according to claim 4, wherein the detector base body includes a detector base body front face that faces the emitter resin member,
wherein at least a part of the detector base body front face is offset from the light incidence surface in a direction proceeding away from the base.

12. The photointerrupter according to claim 1, wherein the light incidence surface includes a first incident portion and a second incident portion, the first incident portion facing the emitter resin member, the second incident portion being closer to the emitter resin member than the first incident portion is, and wherein the first incident portion and the second incident portion face in mutually different directions.

13. The photointerrupter according to claim 12, wherein the second incident portion faces in a direction proceeding from the base toward the detector resin member as viewed in a thickness direction of the base.

14. The photointerrupter according to claim 12, wherein the second incident portion is inclined with respect to a thickness direction of the base so as to become further away from the emitter resin member as proceeding way from the base.

15. The photointerrupter according to claim 1, wherein the emitter resin member includes an emitter base body covering the light emitting element, the emitter base body being in contact with the base.

16. The photointerrupter according to claim 15, wherein the emitter resin member includes an emitter bulging portion protruding from the emitter base body toward the detector resin member, the emitter bulging portion being in contact with the base.

17. The photointerrupter according to claim 15, wherein the emitter resin member includes an emitter protruding portion protruding from the emitter base body toward the detector resin member,
wherein the emitter protruding portion provides the light output surface.

18. The photointerrupter according to claim 1, wherein the light output surface includes a first output portion and a second output portion, the first output portion facing the emitter resin member, the second output portion being closer to the detector resin member than the first output portion is, and wherein the first output portion and the second output portion face in mutually different directions.

19. The photointerrupter according to claim 1, wherein the light shield layer is black or gray.

20. The photointerrupter according to claim 1, wherein the light shield layer includes a first layer and a second layer formed on the first layer, and wherein the first layer is in contact with at least one of the detector resin member and the emitter resin member, the first layer being made of a metal, the second layer being made of an oxide of the metal.

21. The photointerrupter according to claim 1, further comprising a light-transmissive undercoat layer interposed between the light shield layer and at least one of the detector resin member and the emitter resin member.

22. The photointerrupter according to claim 21, wherein the emitter resin member includes an emitter base body held in contact with the base, the emitter base body having a first emitter base body outer face.

23. The photointerrupter according to claim 22, wherein the light output surface is disposed between the first emitter base body outer face and the light incident surface, and the undercoat layer covers the first emitter base body outer face.

24. The photointerrupter according to claim 22, wherein the undercoat layer covers an entirety of the emitter resin member except for the light output surface and a region contacting the base.

25. The photointerrupter according to claim 24, wherein the emitter base body includes a second emitter base body outer face,
wherein the second emitter base body outer face is spaced away from the light emitting element in a second direction perpendicular to both the first direction and the thickness direction of the base,
wherein the second emitter base body outer face is inclined with respect to the thickness direction of the base.

26. The photointerrupter according to claim 22, wherein the first emitter base body outer face includes a first emitter sloped portion and a second emitter sloped portion each inclined with respect to a thickness direction of the base,
wherein the first emitter sloped portion is farther from the base than the second emitter sloped portion is, and in plan view of the base, the first emitter sloped portion is disposed between the second emitter sloped portion and the light output surface,
wherein an angle formed between the first emitter sloped portion and the thickness direction of the base is greater than an angle formed between the second emitter sloped portion and the thickness of the base.

27. The photointerrupter according to claim 26, wherein the first emitter base body outer face includes an emitter intermediate portion connected to the first emitter sloped portion and the second emitter sloped portion,
- wherein the emitter intermediate portion is disposed between the first emitter sloped portion and the second emitter sloped portion,
- wherein an angle formed between the emitter intermediate portion and the thickness direction of the base is smaller than an angle formed between the second emitter sloped portion and the thickness direction of the base.

28. The photointerrupter according to claim 22, wherein the emitter base body includes a first emitter top face, a second emitter top face and an emitter intermediate face,
- wherein each of the first emitter top face and the second emitter top face is arranged to face away from the base,
- wherein the emitter intermediate face connects the first emitter top face and the second emitter top face to each other,
- wherein the first emitter top face and the second emitter top face are spaced apart from each other in a second direction perpendicular to both the first direction and the thickness direction of the base,
- wherein the emitter intermediate face has a minimum size in the first direction that is smaller than each of a size of the first emitter top face in the first direction and a size of the second emitter top face in the first direction.

29. The photointerrupter according to claim 28, wherein the first emitter base body outer face is inclined with respect to the thickness direction of the base so as to become closer to the detector resin member as proceeding away from the base,
- wherein the first emitter base body outer face is disposed between the first emitter top face and the second emitter top face as viewed in the thickness direction of the base.

30. The photointerrupter according to claim 28, wherein the detector base body includes a first detector top face, a second detector top face and a detector intermediate face,
- wherein each of the first detector top face and the second detector top face is arranged to face away from the base,
- wherein the detector intermediate face connects the first detector top face and the second detector top face to each other,
- wherein the first detector top face and the second detector top face are spaced apart from each other in the second direction perpendicular to both the first direction and the thickness direction of the base,
- wherein the detector intermediate face has a minimum size in the first direction that is smaller than each of a size of the first detector top face in the first direction and a size of the second detector top face in the first direction.

31. The photointerrupter according to claim 30, wherein the detector resin member includes a detector base body having a first detector base body outer face,
- wherein the first detector base body outer face is inclined with respect to the thickness direction of the base so as to become closer to the emitter resin member as proceeding away from the base,
- wherein the first detector base body outer face is disposed between the first detector top face and the second detector top face as viewed in the thickness direction of the base.

32. The photointerrupter according to claim 30, wherein the first detector top face, the second detector top face, the first emitter top face and the second emitter top face are contained in a same plane.

33. The photointerrupter according to claim 21, wherein the detector resin member includes a detector base body held in contact with the base, and the a detector base body includes a first detector base body outer face.

34. The photointerrupter according to claim 33, wherein the light incident surface is disposed between the first detector base body outer face and the light output surface, and the undercoat layer covers the first detector base body outer face.

35. The photointerrupter according to claim 33, wherein the undercoat layer covers an entirety of the detector resin member except for the light incident surface and a region contacting the base.

36. The photointerrupter according to claim 35, wherein the detector base body includes a second detector base body outer face,
- wherein the second detector base body outer face is spaced apart from the light receiving element in a second direction perpendicular both the first direction and the thickness direction of the base,
- wherein the second detector base body outer face is inclined with respect to the thickness direction of the base.

37. The photointerrupter according to claim 33, wherein the first detector base body outer face includes a first detector sloped portion and a second detector sloped portion each inclined with respect to the thickness direction of the base,
- wherein the first detector sloped portion is farther from the base than the second detector sloped portion is, and in plan view of the base, the first detector sloped portion is disposed between the second detector sloped portion and the light incident surface,
- wherein an angle formed between the first detector sloped portion and the thickness direction of the base is greater than an angle formed between the second detector sloped portion and the thickness of the base.

38. The photointerrupter according to claim 37, wherein the first detector base body outer face includes a detector intermediate portion connected to the first detector sloped portion and the second detector sloped portion,
- wherein the detector intermediate portion is disposed between the first detector sloped portion and the second detector sloped portion,
- wherein an angle formed between the detector intermediate portion and the thickness direction of the base is smaller than an angle formed between the second detector sloped portion and the thickness direction of the base.

39. The photointerrupter according to claim 1, wherein the base includes a substrate provided with a main surface and a back surface, a main surface electrode formed on the main surface, and a back surface electrode formed on the back surface.

40. The photointerrupter according to claim 39, wherein the main surface electrode includes a detector die pad on which the light receiving element is mounted, and the light incident surface is so located as to overlap the detector die pad as viewed in the thickness direction of the base.

41. The photointerrupter according to claim 39, wherein the base includes a connection electrode connected to the main surface electrode and the back surface electrode.

42. The photointerrupter according to claim 41, wherein the connection electrode extends through the substrate.

43. The photointerrupter according to claim 41, wherein the substrate has a rectangular shape with a corner, the substrate is formed with a corner groove at the corner, and the connection electrode is disposed in the corner groove.

44. A photointerrupter mounting structure comprising:
- a photointerrupter according to claim 1;
- a mounting board; and
- a solder layer disposed between the mounting board and the photointerrupter.

45. A method of manufacturing a photointerrupter, the method comprising:

arranging a light emitting element and a light receiving element on a base;

forming a light-transmissive emitter resin member covering the light emitting element and a light-transmissive detector resin member covering the light receiving element, the detector resin member being spaced apart from the emitter resin member by a clearance; and forming a light shield layer covering the emitter resin member and the detector resin member by surface processing;

wherein the emitter resin member is formed with a light output surface exposed from the light shield layer and facing the clearance, and the detector resin member is formed with a light incident surface exposed from the light shield layer and facing the clearance, and wherein the light shield layer includes a base cover portion that covers a region of the base located between the emitter resin member and the detector resin member, and the base cover portion is smaller than at least one of the light emitting element and the light receiving element in size measured in a thickness direction of the base.

46. The method according to claim 45, wherein the surface processing comprises one of painting, printing, vapor deposition, ion plating, sputtering and plating.

47. The method according to claim 45, wherein the detector resin member includes a detector base body covering the light receiving element and a detector protruding portion protruding from the detector base body, wherein the light incident surface is formed by removing both a part of the light shield layer covering the detector resin member and a part of the detector protruding portion.

* * * * *